US008916947B2

(12) United States Patent
Sargent et al.

(10) Patent No.: US 8,916,947 B2
(45) Date of Patent: Dec. 23, 2014

(54) PHOTODETECTOR COMPRISING A PINNED PHOTODIODE THAT IS FORMED BY AN OPTICALLY SENSITIVE LAYER AND A SILICON DIODE

(75) Inventors: Edward Hartley Sargent, Toronto (CA); Rajsapan Jain, Menlo Park, CA (US); Igor Constantin Ivanov, Danville, CA (US); Michael R. Malone, San Jose, CA (US); Michael Charles Brading, Danville, CA (US); Hui Tian, Cupertino, CA (US); Pierre Henri Rene Della Nave, Mountain View, CA (US); Jess Jan Young Lee, Woodside, CA (US)

(73) Assignee: InVisage Technologies, Inc., Menlo Park, CA (US)

( * ) Notice: Subject to any disclaimer, the term of this patent is extended or adjusted under 35 U.S.C. 154(b) by 162 days.

(21) Appl. No.: 13/156,235

(22) Filed: Jun. 8, 2011

(65) Prior Publication Data

US 2011/0309462 A1 Dec. 22, 2011

Related U.S. Application Data

(60) Provisional application No. 61/352,409, filed on Jun. 8, 2010, provisional application No. 61/352,410, filed on Jun. 8, 2010, provisional application No. 61/394,600, filed on Oct. 19, 2010.

(51) Int. Cl.
*H01L 31/00* (2006.01)
*H01L 27/146* (2006.01)

(52) U.S. Cl.
CPC ........ *H01L 27/1461* (2013.01); *H01L 27/1464* (2013.01); *H01L 27/14621* (2013.01)
USPC ........... 257/440; 257/184; 257/186; 257/290; 257/432

(58) Field of Classification Search
CPC ... H01L 27/3227; H01L 31/062; H01L 27/15; H01L 27/14643; H01L 31/113; H01L 27/00
USPC ......... 257/440, 439, 290, 432, 184, 186, 292, 257/291, 443
See application file for complete search history.

(56) References Cited

U.S. PATENT DOCUMENTS 3,586,760 A 6/1971 Dillenburger et al.
4,551,397 A 11/1985 Yaguchi et al.
(Continued)

FOREIGN PATENT DOCUMENTS

CN 102165572 B 12/2013
CN 102017147 B 1/2014
(Continued)

OTHER PUBLICATIONS

US 8,022,391, 9/2011, Sargent et al. (withdrawn).
(Continued)

*Primary Examiner* — Marcos D. Pizarro
*Assistant Examiner* — Cesar Lopez
(74) *Attorney, Agent, or Firm* — Schwegman Lundberg & Woessner, P.A.

(57) ABSTRACT

In various embodiments, a photodetector includes a semiconductor substrate and a plurality of pixel regions. Each of the plurality of pixel regions comprises an optically sensitive layer over the semiconductor substrate. A pixel circuit is formed for each of the plurality of pixel regions. Each pixel circuit includes a pinned photodiode, a charge store, and a read out circuit for each of the plurality pixel regions. The optically sensitive layer is in electrical communication with a portion of a silicon diode to form the pinned photodiode. A potential difference between two electrodes in communication with the optically sensitive layer associated with a pixel region exhibits a time-dependent bias; a biasing during a first film reset period being different from a biasing during a second integration period.

2 Claims, 33 Drawing Sheets

(56) References Cited

U.S. PATENT DOCUMENTS

| | | | |
|---|---|---|---|
| 4,644,406 A | 2/1987 | Nishigaki et al. |
| 4,866,291 A | 9/1989 | Shimada et al. |
| 4,882,295 A | 11/1989 | Czubatyj et al. |
| 5,021,867 A | 6/1991 | Przybysz |
| 5,057,682 A | 10/1991 | Michon et al. |
| 5,202,579 A | 4/1993 | Fujii et al. |
| 5,225,921 A | 7/1993 | Audas et al. |
| 5,399,880 A | 3/1995 | Chand |
| 5,446,286 A | 8/1995 | Bhargava |
| 5,462,898 A | 10/1995 | Chen et al. |
| 5,567,956 A | 10/1996 | Yamanobe et al. |
| 5,608,255 A | 3/1997 | Martin et al. |
| 5,972,178 A | 10/1999 | Narasimhan et al. |
| 5,985,176 A | 11/1999 | Rao |
| 6,163,029 A | 12/2000 | Yamada et al. |
| 6,300,612 B1 | 10/2001 | Yu |
| 6,373,117 B1 | 4/2002 | Theil |
| 6,483,116 B1 | 11/2002 | Kozlowski et al. |
| 6,657,195 B1 | 12/2003 | Martin et al. |
| 6,660,381 B2 | 12/2003 | Halas et al. |
| 6,710,366 B1 | 3/2004 | Lee et al. |
| 6,794,265 B2 | 9/2004 | Lee et al. |
| 6,819,845 B2 | 11/2004 | Lee et al. |
| 6,878,871 B2 | 4/2005 | Scher et al. |
| 6,961,499 B2 | 11/2005 | Lee et al. |
| 7,005,669 B1 | 2/2006 | Lee |
| 7,020,372 B2 | 3/2006 | Lee et al. |
| 7,042,003 B2 | 5/2006 | Jang et al. |
| 7,099,056 B1 | 8/2006 | Kindt |
| 7,358,525 B2 | 4/2008 | Lee |
| 7,402,832 B2 | 7/2008 | Lee |
| 7,442,320 B2 | 10/2008 | Lee |
| 7,488,986 B2 | 2/2009 | Yamazaki et al. |
| 7,521,737 B2 | 4/2009 | Augusto |
| 7,566,899 B2 | 7/2009 | Chabinyc et al. |
| 7,598,482 B1 | 10/2009 | Verhulst et al. |
| 7,641,815 B2 | 1/2010 | Varadarajan et al. |
| 7,816,866 B2 | 10/2010 | Nakajima et al. |
| 7,923,801 B2 | 4/2011 | Tian et al. |
| 8,004,057 B2 | 8/2011 | Tian et al. |
| 8,013,412 B2 | 9/2011 | Tian |
| 8,138,567 B2 | 3/2012 | Ivanov et al. |
| 8,203,195 B2 | 6/2012 | Ivanov et al. |
| 8,269,260 B2 | 9/2012 | Tian et al. |
| 8,269,302 B2 | 9/2012 | Tian et al. |
| 8,415,192 B2 | 4/2013 | Sargent et al. |
| 8,441,090 B2 | 5/2013 | Tian et al. |
| 8,466,533 B2 | 6/2013 | Tian et al. |
| 8,476,616 B2 | 7/2013 | Sargent et al. |
| 8,476,727 B2 | 7/2013 | Tian et al. |
| 8,482,093 B2 | 7/2013 | Tian et al. |
| 8,513,758 B2 | 8/2013 | Tian et al. |
| 8,525,287 B2 | 9/2013 | Tian et al. |
| 8,530,940 B2 | 9/2013 | Tian et al. |
| 8,530,991 B2 | 9/2013 | Tian et al. |
| 8,530,992 B2 | 9/2013 | Tian et al. |
| 8,530,993 B2 | 9/2013 | Tian et al. |
| 8,546,853 B2 | 10/2013 | Tian et al. |
| 8,558,286 B2 | 10/2013 | Tian et al. |
| 8,643,064 B2 | 2/2014 | Tian et al. |
| 8,759,816 B2 | 6/2014 | Sargent et al. |
| 8,785,908 B2 | 7/2014 | Ivanov et al. |
| 8,803,128 B2 | 8/2014 | Sargent et al. |
| 2001/0055008 A1 | 12/2001 | Young et al. |
| 2002/0005844 A1 | 1/2002 | Kosaka et al. |
| 2002/0127574 A1 | 9/2002 | Mirkin et al. |
| 2002/0177670 A1 | 11/2002 | Kusakabe et al. |
| 2002/0179930 A1 | 12/2002 | Irwin et al. |
| 2002/0191828 A1 | 12/2002 | Colbeth et al. |
| 2003/0015234 A1 | 1/2003 | Yasuno |
| 2003/0030099 A1 | 2/2003 | Hsieh et al. |
| 2003/0063706 A1 | 4/2003 | Ikeda et al. |
| 2003/0071196 A1 | 4/2003 | Seitz |
| 2003/0103153 A1 | 6/2003 | Fossum |
| 2003/0146389 A1 | 8/2003 | Busse et al. |
| 2003/0151107 A1 | 8/2003 | Yamada et al. |
| 2004/0046194 A1 | 3/2004 | Kozuka et al. |
| 2004/0108517 A1 | 6/2004 | Moussy et al. |
| 2004/0108564 A1 | 6/2004 | Mitra |
| 2004/0118448 A1 | 6/2004 | Scher et al. |
| 2004/0150729 A1 | 8/2004 | Nishizawa et al. |
| 2004/0250750 A1 | 12/2004 | Reda et al. |
| 2005/0045910 A1 | 3/2005 | Taylor et al. |
| 2005/0079659 A1 | 4/2005 | Duan et al. |
| 2005/0083421 A1* | 4/2005 | Berezin et al. ............... 348/308 |
| 2005/0139966 A1 | 6/2005 | Scarlete |
| 2005/0201149 A1 | 9/2005 | Duan et al. |
| 2005/0205850 A1 | 9/2005 | Whiteford et al. |
| 2005/0205879 A1 | 9/2005 | Fukunaga |
| 2005/0205901 A1 | 9/2005 | Suzuki |
| 2005/0214967 A1 | 9/2005 | Scher et al. |
| 2005/0225655 A1 | 10/2005 | Suzuki |
| 2005/0227071 A1 | 10/2005 | Muraoka et al. |
| 2005/0263839 A1 | 12/2005 | Suzuki |
| 2006/0044438 A1 | 3/2006 | Mauritzson et al. |
| 2006/0044554 A1 | 3/2006 | Mertz et al. |
| 2006/0054987 A1 | 3/2006 | Nii |
| 2006/0119724 A1 | 6/2006 | Inuiya |
| 2006/0128087 A1 | 6/2006 | Bamji et al. |
| 2006/0146159 A1* | 7/2006 | Farrier ........................ 348/308 |
| 2006/0172133 A1 | 8/2006 | Naasani |
| 2006/0181629 A1 | 8/2006 | Miyashita et al. |
| 2006/0196537 A1 | 9/2006 | Narkis et al. |
| 2006/0261331 A1 | 11/2006 | Yukawa |
| 2006/0261996 A1 | 11/2006 | Augusto et al. |
| 2006/0267054 A1 | 11/2006 | Martin et al. |
| 2007/0006914 A1 | 1/2007 | Lee |
| 2007/0045514 A1 | 3/2007 | McKee et al. |
| 2007/0052051 A1 | 3/2007 | Osaka et al. |
| 2007/0052055 A1 | 3/2007 | McKee |
| 2007/0108487 A1 | 5/2007 | Inoue et al. |
| 2007/0120045 A1 | 5/2007 | Yokoyama |
| 2007/0132867 A1 | 6/2007 | Rhee et al. |
| 2007/0153109 A1 | 7/2007 | Lule |
| 2007/0162263 A1 | 7/2007 | Forrest |
| 2007/0174939 A1 | 7/2007 | Sargent et al. |
| 2007/0216777 A1 | 9/2007 | Quan et al. |
| 2007/0221986 A1 | 9/2007 | Kang et al. |
| 2007/0236590 A1 | 10/2007 | Harris |
| 2007/0272995 A1 | 11/2007 | King et al. |
| 2007/0273775 A1 | 11/2007 | Jiang |
| 2007/0285545 A1 | 12/2007 | Hsieh |
| 2007/0298548 A1 | 12/2007 | Nagata et al. |
| 2008/0017845 A1 | 1/2008 | Drndic et al. |
| 2008/0035965 A1 | 2/2008 | Hayashi et al. |
| 2008/0067387 A1 | 3/2008 | Mouttet |
| 2008/0087800 A1 | 4/2008 | Toda |
| 2008/0142856 A1 | 6/2008 | Sato et al. |
| 2008/0156371 A1 | 7/2008 | Locascio et al. |
| 2008/0173964 A1 | 7/2008 | Akram |
| 2008/0206890 A1 | 8/2008 | Burstyn et al. |
| 2008/0296534 A1 | 12/2008 | Lifshitz et al. |
| 2009/0152664 A1 | 6/2009 | Klem et al. |
| 2009/0174022 A1 | 7/2009 | Coe-Sullivan et al. |
| 2009/0217973 A1 | 9/2009 | Alvisatos et al. |
| 2009/0224351 A1 | 9/2009 | Hsieh |
| 2009/0257671 A1 | 10/2009 | Fridrich et al. |
| 2010/0003187 A1 | 1/2010 | Guo et al. |
| 2010/0018578 A1 | 1/2010 | Yu et al. |
| 2010/0019334 A1 | 1/2010 | Ivanov et al. |
| 2010/0019335 A1 | 1/2010 | Ivanov et al. |
| 2010/0026869 A1* | 2/2010 | Han ........................ 348/311 |
| 2010/0044676 A1 | 2/2010 | Sargent et al. |
| 2010/0187404 A1 | 7/2010 | Klem et al. |
| 2010/0187408 A1 | 7/2010 | Klem et al. |
| 2011/0226934 A1 | 9/2011 | Tian et al. |
| 2011/0228144 A1 | 9/2011 | Tian et al. |
| 2011/0267510 A1 | 11/2011 | Malone et al. |
| 2011/0297815 A1 | 12/2011 | Tian et al. |
| 2011/0297915 A1 | 12/2011 | Tian et al. |
| 2011/0303897 A1 | 12/2011 | Tian et al. |
| 2011/0303898 A1 | 12/2011 | Tian et al. |
| 2011/0309236 A1 | 12/2011 | Tian et al. |
| 2011/0309238 A1 | 12/2011 | Tian et al. |

(56) References Cited

U.S. PATENT DOCUMENTS

| | | |
|---|---|---|
| 2012/0037789 A1 | 2/2012 | Tian et al. |
| 2012/0037887 A1 | 2/2012 | Tian et al. |
| 2012/0043455 A1 | 2/2012 | Tian et al. |
| 2012/0049045 A1 | 3/2012 | Tian et al. |
| 2012/0049311 A1 | 3/2012 | Tian et al. |
| 2012/0056074 A1 | 3/2012 | Tian et al. |
| 2012/0056075 A1 | 3/2012 | Tian et al. |
| 2012/0056076 A1 | 3/2012 | Tian et al. |
| 2012/0056160 A1 | 3/2012 | Tian et al. |
| 2012/0056289 A1 | 3/2012 | Tian et al. |
| 2012/0059819 A1 | 3/2012 | Wheeler et al. |
| 2012/0180856 A1 | 7/2012 | Sargent et al. |
| 2012/0189532 A1 | 7/2012 | Sargent et al. |
| 2012/0205624 A1 | 8/2012 | Sargent et al. |
| 2012/0280226 A1 | 11/2012 | Ivanov et al. |
| 2013/0001520 A1 | 1/2013 | Sargent et al. |
| 2014/0175591 A1 | 6/2014 | Tian et al. |

FOREIGN PATENT DOCUMENTS

| | | |
|---|---|---|
| CN | 103839955 A | 6/2014 |
| EP | 2432015 A1 | 3/2012 |
| GB | 2328338 A | 2/1999 |
| JP | 5674970 A | 6/1981 |
| JP | 6377169 A | 4/1988 |
| JP | 63127578 A | 5/1988 |
| JP | 173774 A | 3/1989 |
| JP | 3165068 A | 7/1991 |
| JP | 200750053 A | 3/2007 |
| JP | 2011528865 A | 11/2011 |
| TW | 201017907 A1 | 5/2010 |
| WO | WO-2007102051 A2 | 9/2007 |
| WO | WO-2008131313 A2 | 10/2008 |
| WO | WO-2008131313 A3 | 10/2008 |
| WO | WO-2009129540 A1 | 10/2009 |
| WO | WO-2010082955 A1 | 7/2010 |
| WO | WO-2011156507 A1 | 12/2011 |

OTHER PUBLICATIONS

"International Application Serial No. PCT/US2011/039655 International Search Report mailed Sep. 28, 2011", 2 pgs.

"International Application Serial No. PCT/US2011/039655, International Preliminary Report on Patentability mailed Dec. 20, 2012", 5 pgs.

"International Application Serial No. PCT/US2011/039655, Written Opinion, mailed Sep. 28, 2011", 3 pgs.

Borgefors, et al., "A Semiregular image grid", Journal of Visual Communication and image representation, Vol No. 1 No. 2, (Nov. 1, 1990), 127-136.

Buhro, William, et al., "Semiconductor Nanocrystals: Shape Matters", Nature Materials, vol. 2, (Mar. 2003), 138-139.

Cashman, R. J, "Film-Type Infrared Photoconductors", Proceedings of the IRE, 47(9), (1959), 1471-1475.

Fischbein, M. D, et al., "CdSe nanocrystal quantum-dot memory", Applied Physics Letters, 86, (2005), 193106-1-193106-3.

Takada, Shunji, et al., "CMOS Image Sensor with Organic Photoconductive Layer Having Narrow Absorption Band and Proposal of Stack Type Solid-State Image Sensors", Sensors, Cameras, and Systems for Scientific/Industrial Applications, VII, edited by Morley M. Blouke, Proc. of SPIE-IS&T Electronic Imaging, SPIE vol. 6068, 6068A, (2006), 6068A-1-6068A-8.

Ye, Zhengmao, et al., "InAs quantum dot infrared photodetectors with In0.15Ga0.85As strain-relief cap layers", Journal of Applied Physics, 92(12), (Dec. 15, 2002), 7462-7468.

"U.S. Appl. No. 13/218,761, Notice of Allowance mailed Aug. 28, 13", 8 pgs.

"U.S. Appl. No. 13/228,197, Notice of Allowance mailed Mar. 14, 2014", 6 pgs.

"U.S. Appl. No. 13/228,197, Response filed Feb. 19, 2014 to Final Office Action mailed Aug. 21, 2013", 9 pgs.

"U.S. Appl. No. 13/235,185, Notice of Allowance mailed Feb. 14, 2014", 7 pgs.

"U.S. Appl. No. 13/235,185, Response filed Dec. 30, 2013 to Non Final Office Action mailed Jun. 28, 2013", 7 pgs.

"U.S. Appl. No. 13/473,020 , Response filed Feb. 7, 2014 to Final Office Action mailed Aug. 8, 2013", 8 pgs.

"U.S. Appl. No. 13/473,020, Notice of Allowance mailed Mar. 17, 2014", 6 pgs.

"U.S. Appl. No. 14/047,315, Non Final Office Action mailed Jun. 5, 2014", 7 pgs.

"European Application Serial No. 13004049.6, Extended European Search Report mailed Oct. 25, 2013", 7 pgs.

"European Application Serial No. 13004049.6, Response filed May 27, 2014 to Extended European Search Report mailed Oct. 25, 2013", 7 pgs.

"Japanese Application Serial No. 2011-520124, Office Action mailed Oct. 22, 2013", w/English translation, 5 pgs.

* cited by examiner

Picture taken with conventional biasing under extreme low light, showing dark current noise Picture taken with dynamic biasing "zero-bias frame subtraction" under extreme low light, showing much reduced dark current noise

PHOTODETECTOR COMPRISING A PINNED PHOTODIODE THAT IS FORMED BY AN OPTICALLY SENSITIVE LAYER AND A SILICON DIODE

CROSS-REFERENCE TO RELATED APPLICATIONS

This application claims priority benefit of U.S. Provisional Application No. 61/352,409, entitled, "Stable, Sensitive Photodetectors and Image Sensors Made Therefrom Including Circuits for Enhanced Image Performance," and U.S. Provisional Application No. 61/352,410, entitled, "Stable, Sensitive Photodetectors and Image Sensors Made Therefrom Including Processes and Materials for Enhanced Image Performance," both filed Jun. 8, 2010, and to U.S. Provisional Application No. 61/394,600, entitled, "Stable, Sensitive Photodetectors and Image Sensors Made Therefrom Including Processes and Materials for Enhanced Imaging Performance," filed Oct. 19, 2010, all of which are hereby incorporated by reference in their entireties. Each patent, patent application, and/or publication mentioned in this specification is hereby incorporated by reference in its entirety to the same extent as if each individual patent, patent application, and/or publication was specifically and individually indicated to be incorporated by reference.

TECHNICAL FIELD

The present invention generally relates to optical and electronic devices, systems and methods that include optically sensitive material, such as nanocrystals or other optically sensitive material, and methods of making and using the devices and systems.

BRIEF DESCRIPTION OF FIGURES

The systems and methods described herein may be understood by reference to the following figures.

Figure 1:
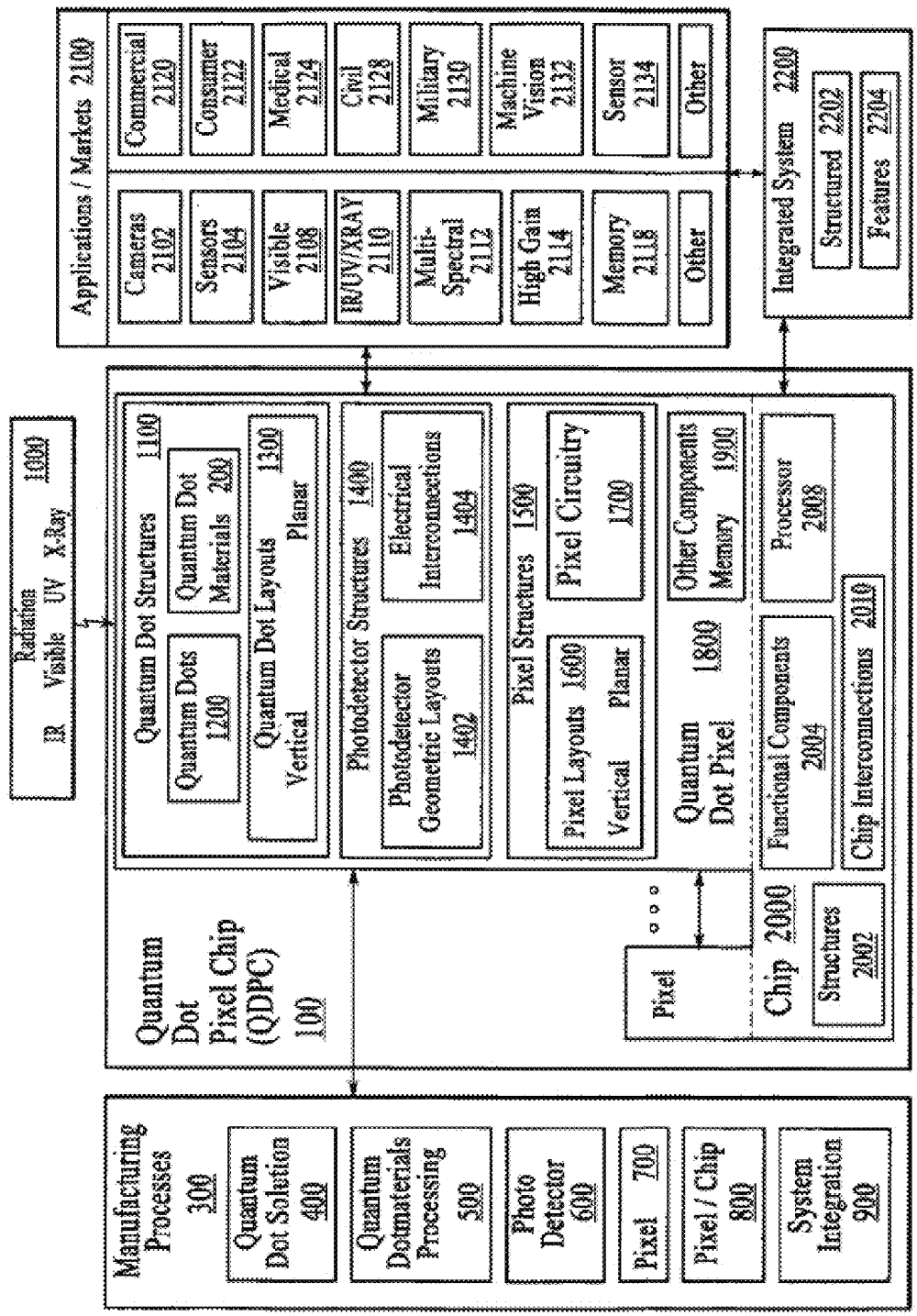
FIG. 1 shows overall structure and areas according to an embodiment.

Embodiments are described, by way of example only, with reference to the accompanying drawings. The drawings are not necessarily to scale. For clarity and conciseness, certain features of the embodiment may be exaggerated and shown in schematic form.

DETAILED DESCRIPTION

Example embodiments provide image sensors that use an array of pixel elements to detect an image. The pixel elements may include photosensitive material. The image sensor may detect a signal from the photosensitive material in each of the pixel regions that varies based on the intensity of light incident on the photosensitive material. In one example embodiment, the photosensitive material is a continuous film of interconnected nanoparticles. Electrodes are used to apply a bias across volumes of light-sensing film that constitute pixels. The volume of light-sensing film from which a given pixel electrode predominantly collects electrical current may be defined by the physical placement of the electrodes, the geometry of the film in relation to these electrodes, the biasing of these electrodes, and the electronic and optical properties of the light-sensing film.

Pixel circuitry is used to integrate a signal in a charge store over a period of time for each pixel region. The circuit stores an electrical signal proportional to the intensity of light incident on the optically sensitive layer during the integration period. The electrical signal can then be read from the pixel circuitry and processed to construct a digital image corresponding to the light incident on the array of pixel elements. In example embodiments, the pixel circuitry may be formed on an integrated circuit device below the photosensitive material. For example, a nanocrystal photosensitive material may be layered over a CMOS integrated circuit device to form an image sensor. Metal contact layers from the CMOS integrated circuit may be electrically connected to the electrodes that provide a bias across the pixel regions. U.S. patent application Ser. No. 12/106,256, now U.S. Pat. No. 7,923,801, entitled "Materials, Systems and Methods for Optoelectronic Devices," filed Apr. 18, 2008; Ser. No. 13/051,983, entitled "Dark Current Reduction in Image Sensors," filed Mar. 18, 2011; Ser. No. 13/051,320, entitled "Image Sensors Employing Sensitized Semiconductor Diodes," filed Mar. 18, 2011; and Ser. No. 13/099,903, entitled "Devices and Methods for High Resolution Image and Video Capture," filed May 3, 2011 include additional descriptions of optoelectronic devices, systems, and materials that may be used in connection with example embodiments and are hereby incorporated herein by reference in their entirety. This is an example embodiment only and other embodiments may use different photodetectors and photosensitive materials. For example, embodiments may use silicon or Gallium Arsenide (GaAs) photodetectors.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode, a charge store, and a read out circuit for each pixel region, wherein the optically sensitive layer is in direct electrical communication with a portion of the silicon diode to form a pinned diode, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include an image sensor comprising a substrate; an array of transistors, diodes, and interconnect collectively known as the read-out integrated circuit; a corresponding array of top metal; a continuously-connected semiconductor layer covering the imaging array; where the top metal and its electrical potential profile define the regions of the continuously-connected semiconductor from which photocurrent is collected where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include a photodetector comprising an integrated circuit at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, where the image sensor, following experiencing annealing at 150° C. or greater for 1 minute or greater, achieves light detection with signal-to-noise ratio greater than 1 upon illumination by less than or equal to 0.05 lux of visible-wavelength light.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, wherein, following illumination of at least one pixel with an intensity greater than 100 lux, the dark signal in the ensuing frame returns within 10% to the value of dark signal it exhibited prior to the greater-than-100-lux illumination.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, wherein, following illumination of at least one pixel with an intensity greater than 100 lux, the dark signal in the ensuing frame returns within 10% to the value of dark signal it exhibited prior to the greater-than-100-lux illumination.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, wherein, following illumination of at least one pixel with an intensity greater than 100 lux, the dark signal in the ensuing frame returns within 10% to the value of dark signal it exhibited prior to the greater-than-100-lux illumination.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, wherein, following illumination of at least one pixel with an intensity greater than 100 lux, the dark signal in the ensuing frame returns within 10% to the value of dark signal it exhibited prior to the greater-than-100-lux illumination.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, where the optically sensitive layer includes at least one nanocrystal, at least one molecule of a first class bound to the surface of at least one quantum dot, at least one molecule of a second class that is bound to a molecule of a third class.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, where the optically sensitive layer includes at least one nanocrystal, at least one molecule of a first class bound to the surface of at least one quantum dot, at least one molecule of a second class that is bound to a molecule of a third class.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, where the optically sensitive layer includes at least one nanocrystal, at least one molecule of a first class bound to the surface of at least one quantum dot, at least one molecule of a second class that is bound to a molecule of a third class.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, where the optically sensitive layer includes at least one nanocrystal, at least one molecule of a first class bound to the surface of at least one quantum dot, at least one molecule of a second class that is bound to a molecule of a third class.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, where the optically sensitive layer includes at least one nanocrystal, at least one molecule of a first class bound to the surface of at least one quantum dot, at least one molecule of a second class that is bound to a molecule of a third class.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, where the optically sensitive layer includes at least one nanocrystal, at least one molecule of a first class bound to the surface of at least one quantum dot, at least one molecule of a second class that is bound to a molecule of a third class.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, where the optically sensitive layer includes at least one nanocrystal, at least one molecule of a first class bound to the surface of at least one quantum dot, at least one molecule of a second class that is bound to a molecule of a third class.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, where the optically sensitive layer includes at least one nanocrystal, at least one molecule of a first class bound to the surface of at least one quantum dot, at least one molecule of a second class that is bound to a molecule of a third class.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, where the optically sensitive layer includes at least one nanocrystal, at least one molecule of a first class bound to the surface of at least one quantum dot, at least one molecule of a second class that is bound to a molecule of a third class.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, where the optically sensitive layer includes at least one nanocrystal, at least one molecule of a first class bound to the surface of at least one quantum dot, at least one molecule of a second class that is bound to a molecule of a third class.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, where less than 10% by mass of the optically sensitive layer consists of alkanethiols.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, where less than 10% by mass of the optically sensitive layer consists of alkanethiols.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, where less than 10% by mass of the optically sensitive layer consists of alkanethiols.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, where less than 10% by mass of the optically sensitive layer consists of alkanethiols.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, where less than 10% by mass of the optically sensitive layer consists of alkanethiols.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, where less than 10% by mass of the optically sensitive layer consists of alkanethiols.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, where less than 10% by mass of the optically sensitive layer consists of alkanethiols.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, where less than 10% by mass of the optically sensitive layer consists of alkanethiols.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, where less than 10% by mass of the optically sensitive layer consists of alkanethiols.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, where less than 10% by mass of the optically sensitive layer consists of alkanethiols.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, where greater than 90% by mass of the organic component in the optically sensitive layer consists of aromatic molecules.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, where greater than 90% by mass of the organic component in the optically sensitive layer consists of aromatic molecules.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, where greater than 90% by mass of the organic component in the optically sensitive layer consists of aromatic molecules.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, where greater than 90% by mass of the organic component in the optically sensitive layer consists of aromatic molecules.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, where greater than 90% by mass of the organic component in the optically sensitive layer consists of aromatic molecules.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, where greater than 90% by mass of the organic component in the optically sensitive layer consists of aromatic molecules.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, where greater than 90% by mass of the organic component in the optically sensitive layer consists of aromatic molecules.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, where greater than 90% by mass of the organic component in the optically sensitive layer consists of aromatic molecules.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, where greater than 90% by mass of the organic component in the optically sensitive layer consists of aromatic molecules.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, where greater than 90% by mass of the organic component in the optically sensitive layer consists of aromatic molecules.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, where a matrix material included in the optically sensitive layer substantially prevents the ionization of nanocrystals also included in the optically sensitive layer.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, where a matrix material included in the optically sensitive layer substantially prevents the ionization of nanocrystals also included in the optically sensitive layer.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, where a matrix material included in the optically sensitive layer substantially prevents the ionization of nanocrystals also included in the optically sensitive layer.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, where a matrix material included in the optically sensitive layer substantially prevents the ionization of nanocrystals also included in the optically sensitive layer.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, where a matrix material included in the optically sensitive layer substantially prevents the ionization of nanocrystals also included in the optically sensitive layer.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, where a matrix material included in the optically sensitive layer substantially prevents the ionization of nanocrystals also included in the optically sensitive layer.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, where a matrix material included in the optically sensitive layer substantially prevents the ionization of nanocrystals also included in the optically sensitive layer.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, where a matrix material included in the optically sensitive layer substantially prevents the ionization of nanocrystals also included in the optically sensitive layer.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, where a matrix material included in the optically sensitive layer substantially prevents the ionization of nanocrystals also included in the optically sensitive layer.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, where a matrix material included in the optically sensitive layer substantially prevents the ionization of nanocrystals also included in the optically sensitive layer.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, wherein the potential difference between two electrodes in communication with the optically sensitive layer associated with a pixel region exhibit a time-dependent bias, where the biasing during a first film reset period is different from the biasing during a second integration period.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, wherein the potential difference between two electrodes in communication with the optically sensitive layer associated with a pixel region exhibit a time-dependent bias, where the biasing during a first film reset period is different from the biasing during a second integration period.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, wherein the potential difference between two electrodes in communication with the optically sensitive layer associated with a pixel region exhibit a time-dependent bias, where the biasing during a first film reset period is different from the biasing during a second integration period.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, wherein the potential difference between two electrodes in communication with the optically sensitive layer associated with a pixel region exhibit a time-dependent bias, where the biasing during a first film reset period is different from the biasing during a second integration period.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, wherein the potential difference between two electrodes in communication with the optically sensitive layer associated with a pixel region exhibit a time-dependent bias, where the biasing during a first film reset period is different from the biasing during a second integration period.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, wherein the potential difference between two electrodes in communication with the optically sensitive layer associated with a pixel region exhibit a time-dependent bias, where the biasing during a first film reset period is different from the biasing during a second integration period.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, wherein the potential difference between two electrodes in communication with the optically sensitive layer associated with a pixel region exhibit a time-dependent bias, where the biasing during a first film reset period is different from the biasing during a second integration period.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, wherein the potential difference between two electrodes in communication with the optically sensitive layer associated with a pixel region exhibit a time-dependent bias, where the biasing during a first film reset period is different from the biasing during a second integration period.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, wherein the potential difference between two electrodes in communication with the optically sensitive layer associated with a pixel region exhibit a time-dependent bias, where the biasing during a first film reset period is different from the biasing during a second integration period.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, wherein the potential difference between two electrodes in communication with the optically sensitive layer associated with a pixel region exhibit a time-dependent bias, where the biasing during a first film reset period is different from the biasing during a second integration period.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, wherein, following illumination of at least one pixel with an intensity greater than 100 lux, the dark signal in the ensuing frame returns within 10% to the value of dark signal it exhibited prior to the greater-than-100-lux illumination.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, wherein, following illumination of at least one pixel with an intensity greater than 100 lux, the dark signal in the ensuing frame returns within 10% to the value of dark signal it exhibited prior to the greater-than-100-lux illumination.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, wherein, following illumination of at least one pixel with an intensity greater than 100 lux, the dark signal in the ensuing frame returns within 10% to the value of dark signal it exhibited prior to the greater-than-100-lux illumination.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, wherein, following illumination of at least one pixel with an intensity greater than 100 lux, the dark signal in the ensuing frame returns within 10% to the value of dark signal it exhibited prior to the greater-than-100-lux illumination.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, wherein, following illumination of at least one pixel with an intensity greater than 100 lux, the dark signal in the ensuing frame returns within 10% to the value of dark signal it exhibited prior to the greater-than-100-lux illumination.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, wherein the potential difference between two electrodes in communication with the optically sensitive layer associated with a pixel region exhibit a time-dependent bias, where the biasing during a first film reset period is different from the biasing during a second integration period, and where the duration of the film reset period and of the integration period is determined based on the measured or estimated intensity of light incident on at least a portion of the light-sensing integrated circuit.

Embodiments include a photodetector comprising a semiconductor substrate; a plurality of pixel regions, each pixel region comprising an optically sensitive layer over the substrate; a pixel circuit for each pixel region, each pixel circuit comprising a pinned photodiode; a charge store; and a read out circuit for each pixel region, wherein the optically sensitive layer is in direct electrical communication with a portion of the silicon diode to form a pinned diode, where the optically sensitive material forms a portion of a 4T read-out circuit.

Embodiments include a photodetector comprising a semiconductor substrate residing at a first electrical potential; a plurality of pixel regions, each pixel region comprising an optically sensitive layer over the substrate; a first electrode (pixel electrode) in electrical communication with the optically sensitive layer and biased to a second electrical potential; a second electrode (common electrode) in electrical communication with the optically sensitive layer biased to a third electrical potential, wherein the second potential and third potential may be varied in time relative to the first electrical potential, where the optically sensitive material forms a portion of a 4T read-out circuit.

Embodiments include a photodetector comprising a semiconductor substrate; a plurality of pixel regions, each pixel region comprising an optically sensitive layer over the substrate; a first electrode (pixel electrode) in electrical communication with the optically sensitive layer; a second electrode (common electrode) in electrical communication with the optically sensitive layer; a first interval in time known as the reset period; a second interval in time known as the integration period; a third interval in time known as the readout period, wherein the common electrode is set to a low voltage during the integration period, and a high voltage during the readout period, where the optically sensitive material forms a portion of a 4T read-out circuit.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile determine the direction of photocurrent flow within, and collection from, the continuously-connected semiconductor layer, where the optically sensitive material forms a portion of a 4T read-out circuit.

Embodiments include an image sensor comprising a substrate; an array of transistors, diodes, and interconnect collectively known as the read-out integrated circuit; a corresponding array of top metal; a continuously-connected semiconductor layer covering the imaging array, where the top metal and its electrical potential profile define the regions of the continuously-connected semiconductor from which photocurrent is collected, where the optically sensitive material forms a portion of a 4T read-out circuit.

Embodiments include a photodetector comprising an integrated circuit; at least two optically sensitive layers, a first optically sensitive layer and a second optically sensitive layer, the first optically sensitive layer over at least a portion of the integrated circuit and the second optically sensitive layer over the first optically sensitive layer; a plurality of electrodes including at least two electrodes between which the two optically sensitive layers are interposed, the electrodes including a respective first electrode and a respective second electrode; and circuitry coupled to the integrated circuit, the circuitry outputting signals from the optically sensitive layers, the signals corresponding to light absorbed by the optically sensitive layers, where the optically sensitive material forms a portion of a 4T read-out circuit.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region; and conductive material positioned between the charge store of the respective pixel region and the optically sensitive layer of the corresponding pixel region such that the respective charge store is substantially shielded from the light incident on the optically sensitive layer, wherein the light is in a wavelength band, wherein at least a portion of the conductive material is a metal layer in electrical communication with the optically sensitive layer, where the optically sensitive material forms a portion of a 4T read-out circuit.

Embodiments include an image sensor comprising a semiconductor substrate; a plurality of pixel regions, each pixel region comprising an optically sensitive layer over the substrate, the optically sensitive layer positioned to receive light; a pixel circuit for each pixel region, each pixel circuit comprising a charge store and a read out circuit, the charge store and the read out circuit in electrical communication with the optically sensitive layer of the respective pixel region, where the optically sensitive material forms a portion of a 4T read-out circuit.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where the first electrode forms a Schottky contact with the optically sensitive layer where the barrier has an energetic height of at least 0.4 eV, where the optically sensitive material forms a portion of a 4T read-out circuit.

Embodiments include an image sensor comprising a semiconductor substrate; a plurality of pixel regions, each pixel region comprising an optically sensitive layer over the substrate, the optically sensitive layer positioned to receive light; a first electrode in electrical communication with the semiconductor substrate and the optically sensitive layer; a second electrode in communication with the semiconductor substrate and the optically sensitive layer, where a depletion region is established within the optically sensitive layer in the regions of optically sensitive layer that are proximate to the first electrode, where the optically sensitive material forms a portion of a 4T read-out circuit.

In example embodiments, an image sensor may be provided with a large number of pixel elements to provide high resolution. For example, an array of 4, 6, 8, 12, or more megapixels may be provided.

Achieving excellent sensitivity to low light generally entails maximizing the signal, and minimizing the noise, in each pixel making up an image sensor. It is also of high importance to minimize the leakage of light, and of photocurrent, between adjacent pixels, a phenomenon that appears as crosstalk, and/or as color crosstalk in color images.

Existing approaches to sensing wherein light absorption occurs predominantly, or exclusively, in silicon suffer limitations in their quantum efficiency, thereby limiting the signal available for a given level of illumination of a given pixel. These limitations become particularly acute as large numbers of pixel elements are employed, especially when this is combined with the desirability of producing image sensor integrated circuits having small areas such as diagonal dimensions of order ⅓ inch (approximately 8.5 mm) or ¼ (approximately 6.35 mm), entails the use of small individual pixels. Desirable pixel geometries include 1.75 μm linear side dimensions, 1.4 μm linear side dimensions, 1.1 μm linear side dimensions, 0.9 μm linear side dimensions, 0.8 μm linear side dimensions, and 0.7 μm linear side dimensions.

In front-side illuminated image sensors, the incident light to be detected may generally be transmitted through an optical aperture in the layers of routing metal within the interlayer dielectric that reside above the plane of the silicon. This limits chief ray acceptance angle, necessitates the use of microlenses, and reduces fill factor, the latter resulting in a loss of sensitivity. Additionally, the need for transistors for pixel read-out in the silicon associated with each pixel reduces fill factor, also curtailing sensitivity.

Backside illuminated image sensors address some of the preceding limitations by exposing the silicon substrate side to incident light. The back-side illumination allows light to occur in principle over the entire area of each pixel, addressing in principle the fill factor problem. The elevation of the sensing function above the metal and interlayer dielectric levels allows in principle a high chief ray angle, though this is curtailed by silicon's high refractive index which leads to the onset of significant reflection at even moderate off-normal incidence angles, and raises challenges in the realization of angularly- and spectrally-broadband antireflection. The back-side illuminated concept, while it addresses some of the challenges in small-pixel image sensors, does not address one of their fundamental limitations: silicon has relatively weak absorption in the red (approximately 630 nm), corresponding to an absorption length greater than 1 um, which in turn necessitates the use of well over 1 μm worth of silicon light-absorbing material to achieve substantially complete absorption. In pixels with the small (e.g., approximately less than 2 μm) lateral dimensions outlined above, this leads to significant optical crosstalk among adjacent pixels. When a color filter array is employed to achieve color imaging, this translates into optical crosstalk.

The preceding limitations can be remedied in whole or in part through the use of a much more rapidly light-absorbing material. The problems associated with fill factor in certain CMOS image sensors can be overcome if such a rapidly-absorbing material may be integrated on the top surface of the silicon wafer. This same top-surface architecture also helps overcome the limited chief ray acceptance angle of conventional architectures.

The top-surface detector material should achieve a shorter absorption length than silicon's across the spectra range of interest. Absorption lengths of 1 μm and below are desired. Materials processing and integration that can be achieved at low additional cost to manufacture, and can be achieved within a conventional CMOS silicon fabrication foundry.

Examples of materials that can potentially achieve the above objectives simultaneously include:

(1) Dense thin films made of colloidal quantum dots. Constituent materials include PbS, PbSe, PbTe; CdS, CdSe, CdTe; Bi2S3, In2S3, In2Se3; SnS, SnSe, SnTe; ZnS, ZnSe, and ZnTe. The nanoparticles may be in the range 1 nm to 10 nm in diameter, and may be substantially monodispersed, that is, it may possess substantially the same size and shape. The materials may include organic ligands and/or crosslinkers to aid in surface passivation and of a length and conductivity that, combined, facilitate inter-quantum-dot charge transfer.

(2) Thin films made of organic materials that are strongly absorptive of light in some or all wavelength ranges of interest. Constituent materials include P3HT, PCBM, PPV, MEH-PPV, and copper phthalocyanine and related metal phthalocyanines.

(3) Thin films made of inorganic materials such as CdTe, copper indium gallium (di)selenide (CIGS), and Cu2ZnSnS4 (CZTS).

The sensitizing material may be integrated with a 4T circuit. 4T circuits employ a pinned photodiode that reduces dark currents. The use of a heavily doped layer near the surface of a pinned diode suppressed dark currents caused by interface traps located on the surface of the photodiode. These structures also achieve complete charge transfer from photodiode into a floating sense node, hence enabling true correlated double sample operation.

The integration of the sensitizing material may be considered along at least two axes: (1) It may be integrated with, and serve to augment the sensitivity and reduce the crosstalk of, either a front-side-illuminated or a back-side-illuminated CMOS image sensor. In the case of a back-side illuminated sensor there is presented, following the application and thinning of the second wafer atop the first, plus any further implants and surface treatments, a substantially planar silicon surface with which the sensitizing material may be integrated. In the case of a front-side illuminated sensor, it is necessary to forge electrical connections from the sensitizing material to the pinned photodiode. (2) The electrical biasing of the sensitizing material may be achieved substantially in the lateral or in the vertical direction.

In the vertical case, a substantially transparent electrode is applied on the opposite face of the sensitizing material relative to its interface with the silicon CMOS integrated circuit. Examples of materials that can be used include ITO, AZO, organic materials such as BPhen, and very thin layers of metals such as aluminum, silver, copper, nickel, etc.

In the lateral case, both electrical connections to the sensitizing material may be presented by the silicon integrated circuit. In this case the electrical connections to the sensitizing material are substantially coplanar.

In embodiments, certain properties of the 4T photodiode—including its low dark current—are desired to be retained following the integration with the sensitizing material.

In an example embodiment, the photocurrent generated due to illumination of the sensitizing material may be transferred, with high efficiency, from the sensitizing material to the pinned diode. Since most incident photons will be absorbed by the sensitizing material, the pinned diode no longer needs serve the photo-detector role. Instead it just serves as a pinned diode to enable full charge transfer and minimize dark current.

Figure 24:
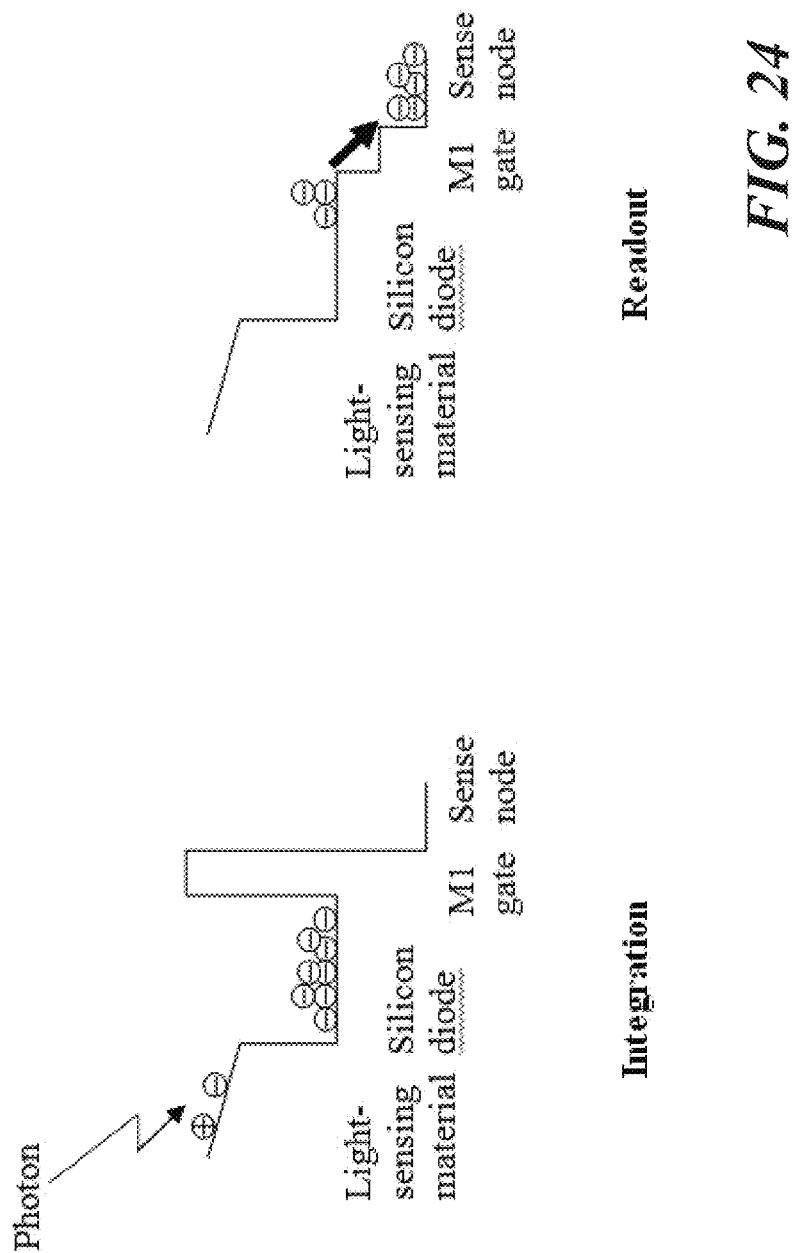
FIG. 24 is a spatial band diagram showing a 4T pixel that has been augmented with an additional light-sensing material, in an example embodiment.

FIG. 24 illustrates an example means of achieving this objective. In a first example case in which the pinned diode is pinned using sensitizing material at its surface. The thickness of the sensitizing material is typically around 500 nm, and could range from 100 nm to 5 um. In this case, a p-type sensitizing material may be employed for the light conversion operation and for depleting the n-type silicon diode. In the absence of an electrical bias, the n-type silicon and p-type sensitizing reach an equilibrium, that is, their Fermi levels come into alignment. In an example embodiment, the resultant band-bending produce a built-in potential in the p-type sensitizing material such that a depletion region is formed therein. Upon the application of an appropriate bias within the silicon circuitry, the amplitude of this potential is augmented by an applied potential, resulting in a deepening of the depletion region that reaches into the p-type sensitizing material. The resultant electrical field results in the extraction of photoelectrons from the sensitizing material into the n+ silicon layer. Biasing and doping in the silicon achieve the collection of the photoelectrons from the sensitizing layer, and can achieve fully depletion of the n-type silicon under normal bias (such as 3V, with a normal range of 1V to 5V). Holes are extracted through a second contact to the sensitizing layer. In the case of the vertical device, this is formed atop the sensitizing material. In the case of the lateral device, a common grid electrode atop the silicon, but beneath the sensitizing material, may be employed, and it may be formed from p-doped silicon or a metal or related material such as TiN.

Currently the pixels' cross-talk is reduced by using microlenses or metal pattern printed on top of passivation layer above photosenstitive layer, or by combination of both. However, microlens materials for 1 micron or smaller pixels must have a certain refractive index and well-controlled shape to focus light without scattering but there is no manufacturing technology currently available. A conventional metal pattern isolation is limited to the minimum critical dimension of process technology, for example 65 nm, which is a) expensive to manufacture and b) reduced fill factor and as a result external quantum efficiency of said pixel.

Optical crosstalk between pixels is reduced by deposition of a thin layer (e.g., 10-20 nm depending on material) of the reflective material on a sidewall of the recess of the passivation layer between photosensitive layer and color filter array. Since the layer is deposited on the sidewall, its minimum thickness is defined only by optical properties of the material, not by minimum critical dimension of the lithography process used.

Example Embodiment A

First a thin (e.g., 5-10 nm) dielectric transparent etch stop layer is deposited as a blanket film over photosensitive material (silicon in case of BSI pixel). Second, a thicker (e.g., 50-200 nm) also transparent dielectric passivation layer (SiO2) is deposited over an etch stop layer. Third, the checkerboard pattern the size of the pixel per unit is etched, the 10 nm aluminum metal layer is deposited over the topography using a conformal process (e.g., CVD, PECVD, ALD) and metal is removed from the bottom of the recessed parts of the pattern using directional (anisotropic) reactive ion plasma etch process. Fourth, the recessed areas are filled with the same transparent passivation dielectric (SiO2) and overfilled to provide sufficiently thick film to allow a planarization process, for example, either using Chemical Mechanical Polishing or Back Etch. Said processes remove excess SiO2 and also residual metal film over horizontal surfaces. Similar processes can be applied for isolation of CFA or microlens layers.

A vertical metal layer around each pixel provides improved optical isolation between small pixels without photoresponse loss typical for the large planar metal patterns.

Example Embodiment B

For an optical isolation of pixels thru the active photosensitive layer formed by one or more uniform layers of materials such as Si, GaAs, or CdTe, the following structure and process may be employed: first, a hard mask protective pattern is formed on the surface of photosensitive layer using conventional high-resolution lithography techniques such as double-exposure or imprint technology. The mask forms a grid of exposed photosensitive material with the minimum dimensions (for example, currently at a 22 nm or a 16 nm width). Second, the exposed photosensitive material is etched using anisotropic reactive ion plasma etch process thru all or a major part of the photosensitive layer. Third, the formed recess is filled with, for example, a) one or more dielectric materials with the required refractive index to provide complete internal reflection of photons back into the pixel or b) exposed photosensitive material is oxidized to form an electrical isolation layer about 1-5 nm thick on sidewalls of the recess and the remaining free space is filled with the reflective metal material such as aluminum using, for example, conventional vacuum metallization processes. The residual metal on the surface of photosensitive material is removed either by wet or dry etching or by mechanical polishing.

Image sensors incorporate arrays of photodetectors. These photodetectors sense light, converting it from an optical to an electronic signal. FIG. 1 shows structure of and areas relating to quantum dot pixel chip structures (QDPCs) 100, according to example embodiments. As illustrated in FIG. 1, the QDPC 100 may be adapted as a radiation 1000 receiver where quantum dot structures 1100 are presented to receive the radiation 1000, such as light. The QDPC 100 includes quantum dot pixels 1800 and a chip 2000 where the chip is adapted to process electrical signals received from the quantum dot pixel 1800. The quantum dot pixel 1800 includes the quantum dot structures 1100 include several components and sub components such as quantum dots 1200, quantum dot materials 200 and particular configurations or quantum dot layouts 300 related to the dots 1200 and materials 200. The quantum dot structures 1100 may be used to create photodetector structures 1400 where the quantum dot structures are associated with electrical interconnections 1404. The electrical connections 1404 are provided to receive electric signals from the quantum dot structures and communicate the electric signals on to pixel circuitry 1700 associated with pixel structures 1500. Just as the quantum dot structures 1100 may be laid out in various patterns, both planar and vertical, the photodetector structures 1400 may have particular photodetector geometric layouts 1402. The photodetector structures 1400 may be associated with pixel structures 1500 where the electrical interconnections 1404 of the photodetector structures are electrically associated with pixel circuitry 1700. The pixel structures 1500 may also be laid out in pixel layouts 1600 including vertical and planar layouts on a chip 2000 and the pixel circuitry 1700 may be associated with other components 1900, including memory for example. The pixel circuitry 1700 may include passive and active components for processing of signals at the pixel 1800 level. The pixel 1800 is associated both mechanically and electrically with the chip 2000. From an electrical viewpoint, the pixel circuitry 1700 may be in communication with other electronics (e.g., chip processor 2008). The other electronics may be adapted to process digital signals, analog signals, mixed signals and the like and it may be adapted to process and manipulate the signals received from the pixel circuitry 1700. In other embodiments, a chip processor 2008 or other electronics may be included on the same semiconductor substrate as the QDPCs and may be structured using a system-on-chip architecture. The chip 2000 also includes physical structures 2002 and other functional components 2004, which will also be described in more detail below.

The QDPC 100 detects electromagnetic radiation 1000, which in embodiments may be any frequency of radiation from the electromagnetic spectrum. Although the electromagnetic spectrum is continuous, it is common to refer to ranges of frequencies as bands within the entire electromagnetic spectrum, such as the radio band, microwave band, infrared band (IR), visible band (VIS), ultraviolet band (UV), X-rays, gamma rays, and the like. The QDPC 100 may be capable of sensing any frequency within the entire electromagnetic spectrum; however, embodiments herein may reference certain bands or combinations of bands within the electromagnetic spectrum. It should be understood that the use of these bands in discussion is not meant to limit the range of frequencies that the QDPC 100 may sense, and are only used as examples. Additionally, some bands have common usage sub-bands, such as near infrared (NIR) and far infrared (FIR), and the use of the broader band term, such as IR, is not meant to limit the QDPCs 100 sensitivity to any band or sub-band. Additionally, in the following description, terms such as "electromagnetic radiation," "radiation," "electromagnetic spectrum," "spectrum," "radiation spectrum," and the like are used interchangeably, and the term color is used to depict a select band of radiation 1000 that could be within any portion of the radiation 1000 spectrum, and is not meant to be limited to any specific range of radiation 1000 such as in visible 'color'.

In the example embodiment of FIG. 1, the nanocrystal materials and photodetector structures described above may be used to provide quantum dot pixels 1800 for a photosensor array, image sensor or other optoelectronic device. In example embodiments, the pixels 1800 include quantum dot structures 1100 capable of receiving radiation 1000, photodetectors structures adapted to receive energy from the quantum dot structures 1100 and pixel structures. The quantum dot pixels described herein can be used to provide the following in some embodiments: high fill factor, potential to bin, potential to stack, potential to go to small pixel sizes, high performance from larger pixel sizes, simplify color filter array, elimination of de-mosaicing, self-gain setting/automatic gain control, high dynamic range, global shutter capability, auto-exposure, local contrast, speed of readout, low noise readout at pixel level, ability to use larger process geometries (lower cost), ability to use generic fabrication processes, use digital fabrication processes to build analog circuits, adding other functions below the pixel such as memory, A to D, true correlated double sampling, binning, etc. Example embodiments may provide some or all of these features. However, some embodiments may not use these features.

A quantum dot 1200 may be a nanostructure, typically a semiconductor nanostructure that confines a conduction band electrons, valence band holes, or excitons (bound pairs of conduction band electrons and valence band holes) in all three spatial directions. A quantum dot exhibits in its absorption spectrum the effects of the discrete quantized energy spectrum of an idealized zero-dimensional system. The wave functions that correspond to this discrete energy spectrum are typically substantially spatially localized within the quantum dot, but extend over many periods of the crystal lattice of the material.

Figure 2:
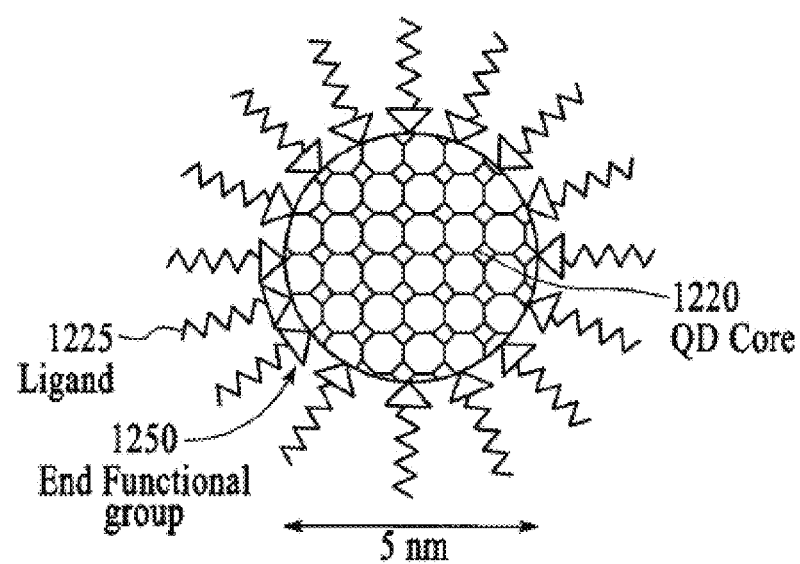
FIG. 2 shows an example of a quantum dot.

FIG. 2 shows an example of a quantum dot 1200. In one example embodiment, the QD 1200 has a core 1220 of a semiconductor or compound semiconductor material, such as PbS. Ligands 1225 may be attached to some or all of the outer surface or may be removed in some embodiments as described further below. In some embodiments, the cores 1220 of adjacent QDs may be fused together to form a continuous film of nanocrystal material with nanoscale features. In other embodiments, cores may be connected to one another by linker molecules.

Embodiments of the QD optical devices are single image sensor chips that have a plurality of pixels, each of which includes a QD layer that is radiation 1000 sensitive, e.g., optically active, and at least two electrodes in electrical communication with the QD layer. The current and/or voltage between the electrodes is related to the amount of radiation 1000 received by the QD layer. Specifically, photons absorbed by the QD layer generate electron-hole pairs, such that, if an electrical bias is applied, a current flows. By determining the current and/or voltage for each pixel, the image across the chip can be reconstructed. The image sensor chips have a high sensitivity, which can be beneficial in low-radiation-detecting 1000 applications; a wide dynamic range allowing for excellent image detail; and a small pixel size. The responsivity of the sensor chips to different optical wavelengths is also tunable by changing the size of the QDs in the device, by taking advantage of the quantum size effects in QDs. The pixels can be made as small as 1 square micron or less, or as large as 30 by 30 microns or more or any range subsumed therein.

The photodetector structure 1400 is a device configured so that it can be used to detect radiation 1000 in example embodiments. The detector may be 'tuned' to detect prescribed wavelengths of radiation 1000 through the types of quantum dot structures 1100 that are used in the photodetector structure 1400. The photodetector structure can be described as a quantum dot structure 1100 with an I/O for some input/output ability imposed to access the quantum dot structures' 1100 state. Once the state can be read, the state can be communicated to pixel circuitry 1700 through an electrical interconnection 1404, wherein the pixel circuitry may include electronics (e.g., passive and/or active) to read the state. In an embodiment, the photodetector structure 1400 may be a quantum dot structure 1100 (e.g., film) plus electrical contact pads so the pads can be associated with electronics to read the state of the associated quantum dot structure.

In embodiments, processing my include binning of pixels in order to reduce random noise associated with inherent properties of the quantum dot structure 1100 or with readout processes. Binning may involve the combining of pixels 1800, such as creating 2×2, 3×3, 5×5, or the like superpixels. There may be a reduction of noise associated with combining pixels 1800, or binning, because the random noise increases by the square root as area increases linearly, thus decreasing the noise or increasing the effective sensitivity. With the QDPC's 100 potential for very small pixels, binning may be utilized without the need to sacrifice spatial resolution, that is, the pixels may be so small to begin with that combining pixels doesn't decrease the required spatial resolution of the system. Binning may also be effective in increasing the speed with which the detector can be run, thus improving some feature of the system, such as focus or exposure.

In embodiments the chip may have functional components that enable high-speed readout capabilities, which may facilitate the readout of large arrays, such as 5 Mpixels, 6 Mpixels, 8 Mpixels, 12 Mpixels, or the like. Faster readout capabilities may require more complex, larger transistor-count circuitry under the pixel 1800 array, increased number of layers, increased number of electrical interconnects, wider interconnection traces, and the like.

In embodiments, it may be desirable to scale down the image sensor size in order to lower total chip cost, which may be proportional to chip area. However, shrinking chip size may mean, for a given number of pixels, smaller pixels. In existing approaches, since radiation 1000 must propagate through the interconnect layer onto the monolithically integrated silicon photodiode lying beneath, there is a fill-factor compromise, whereby part of the underlying silicon area is obscured by interconnect; and, similarly, part of the silicon area is consumed by transistors used in read-out. One workaround is micro-lenses, which add cost and lead to a dependence in photodiode illumination on position within the chip (center vs. edges); another workaround is to go to smaller process geometries, which is costly and particularly challenging within the image sensor process with its custom implants.

In embodiments, the technology discussed herein may provide a way around these compromises. Pixel size, and thus chip size, may be scaled down without decreasing fill factor. Larger process geometries may be used because transistor size, and interconnect line-width, may not obscure pixels since the photodetectors are on the top surface, residing above the interconnect. In the technology proposed herein, large geometries such as 0.13 µm and 0.18 µm may be employed without obscuring pixels. Similarly, small geometries such as 90 nm and below may also be employed, and these may be standard, rather than image-sensor-customized, processes, leading to lower cost. The use of small geometries may be more compatible with high-speed digital signal processing on the same chip. This may lead to faster, cheaper, and/or higher-quality image sensor processing on chip. Also, the use of more advanced geometries for digital signal processing may contribute to lower power consumption for a given degree of image sensor processing functionality.

Figure 6:
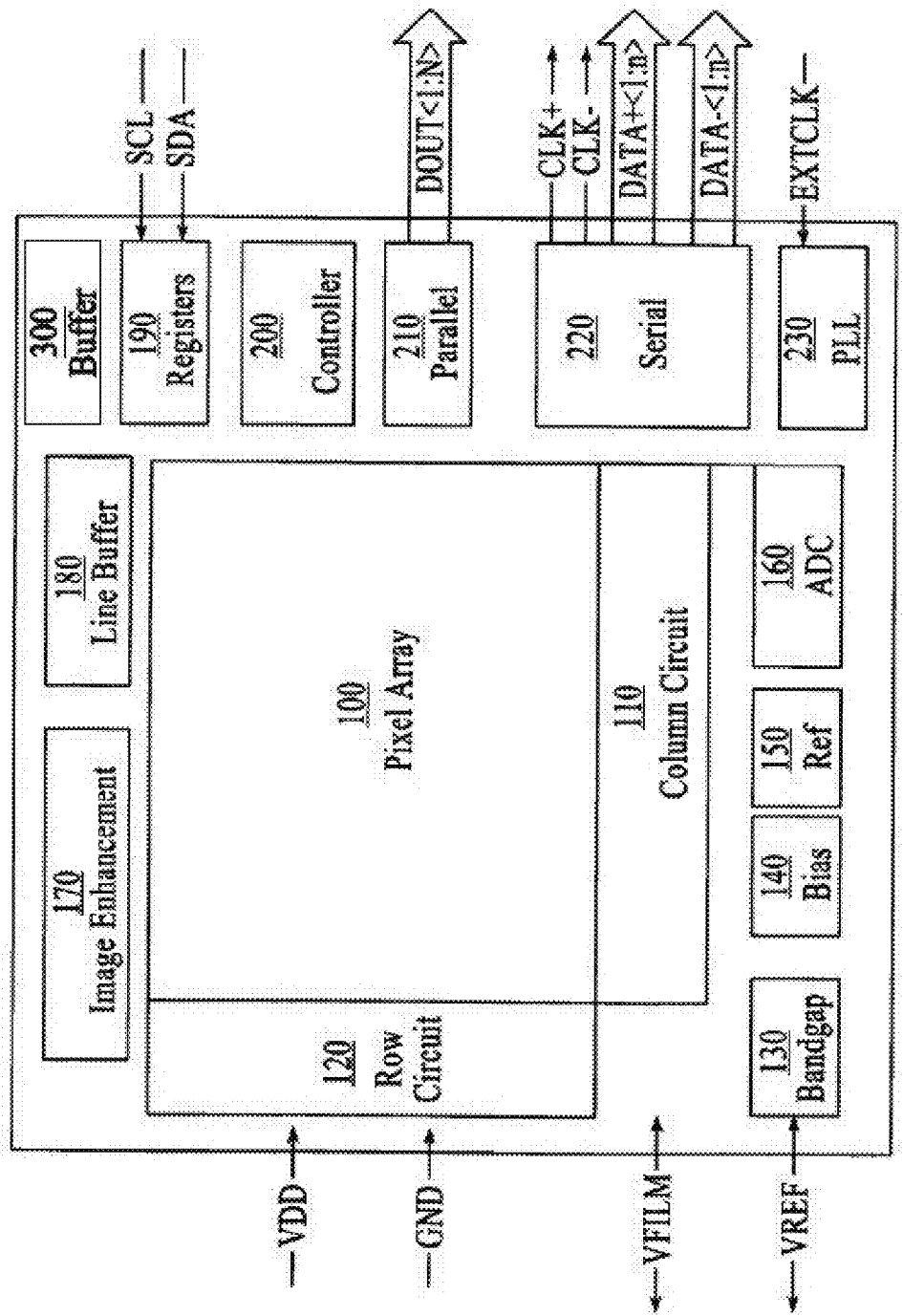
FIG. 6 is a block diagram of an example system configuration that may be used in combination with embodiments described herein.
Figure 7:
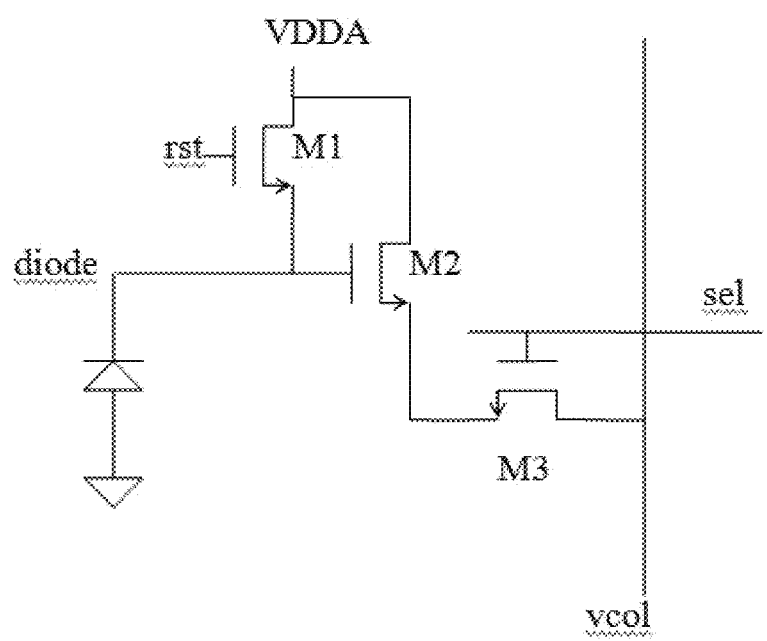
FIG. 7 is a circuit diagram for a conventional 3T readout scheme.
Figure 8:
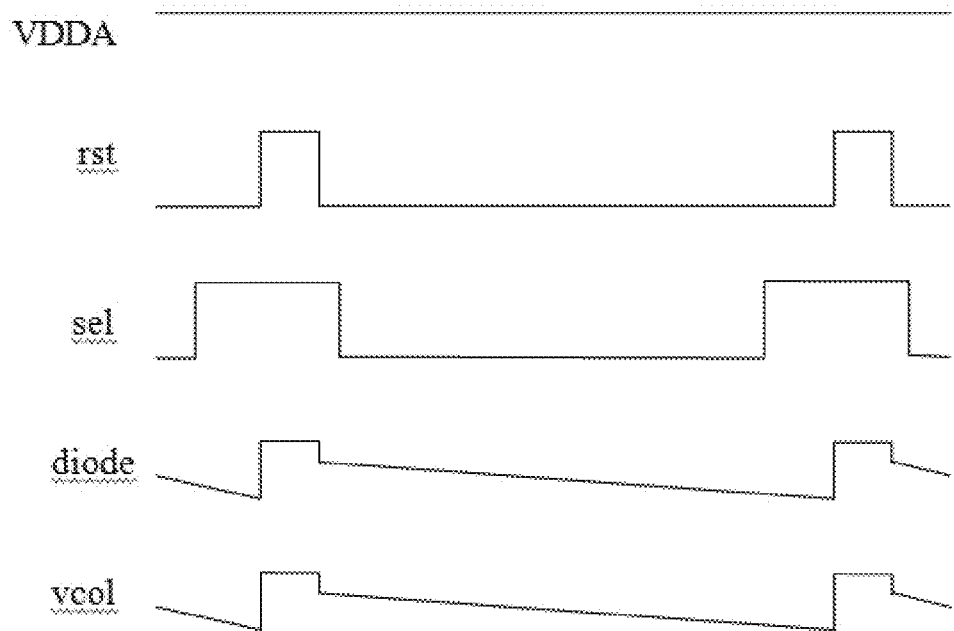
FIG. 8 is a timing diagram of a conventional biasing scheme.
Figure 9:
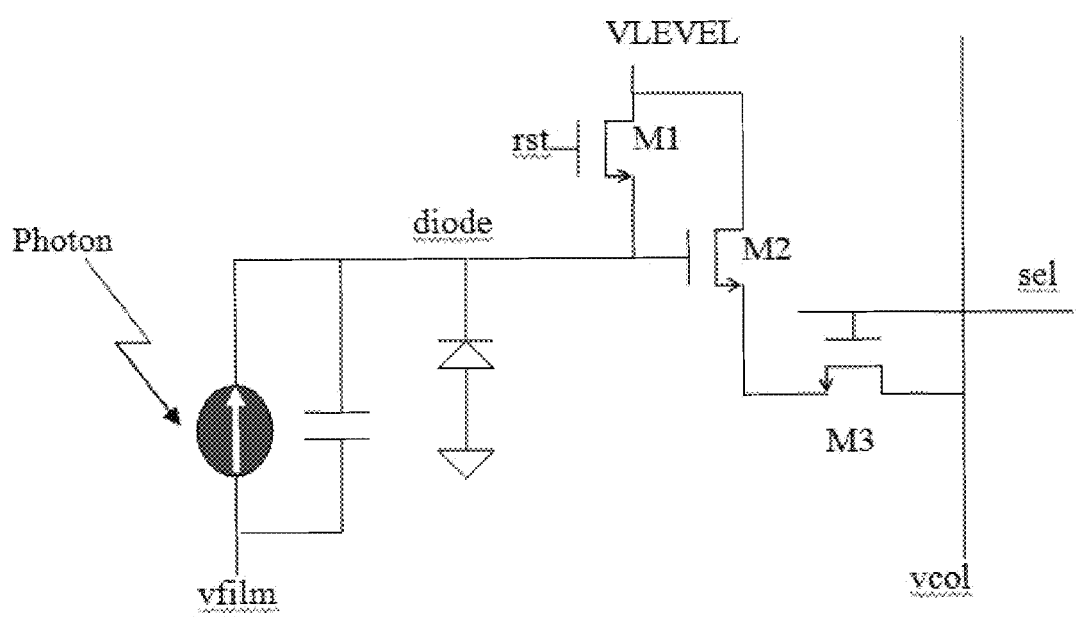
FIG. 9 is a circuit diagram of a specific embodiment of the floating-photodetector-enabled dynamic-biasing scheme disclosed herein.
Figure 10:
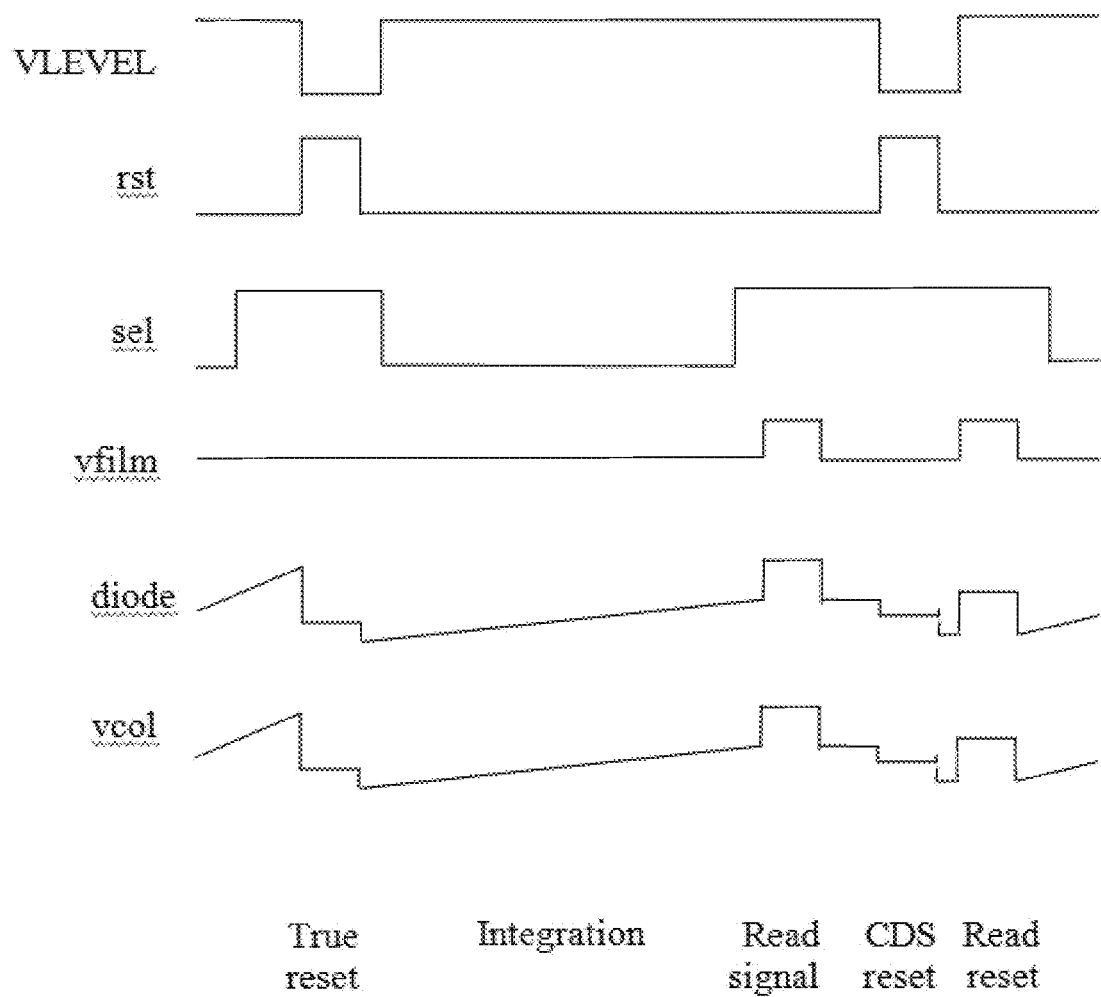
FIG. 10 is a timing diagram of a specific embodiment of the floating-photodetector-enabled dynamic biasing scheme disclosed herein.

An example integrated circuit system that can be used in combination with the above photodetectors, pixel regions and pixel circuits will now be described in connection with FIG. 6. FIG. 6 is a block diagram of an image sensor integrated circuit (also referred to as an image sensor chip). The chip includes: a pixel array (100) in which incident light is converted into electronic signals, and in which electronic signals are integrated into charge stores whose contents and voltage levels are related to the integrated light incident over the frame period; row and column circuits (110 and 120) which are used to reset each pixel, and read the signal related to the contents of each charge store, in order to convey the information related to the integrated light over each pixel over the frame period to the outer periphery of the chip; analog circuits (130, 140, 150, 160, 230). The pixel electrical signal from the column circuits is fed into the analog-to-digital converter (160) where it is converted into a digital number representing the light level at each pixel. The pixel array and ADC are supported by analog circuits that provide bias and reference levels (130, 140, and 150); digital circuits (170, 180, 190, 200). The Image Enhancement circuitry (170) provides image enhancement functions to the data output from ADC to improve the signal to noise ratio. Line buffer (180) temporarily stores several lines of the pixel values to facilitate digital image processing and IO functionality. (190) is a bank of registers that prescribe the global operation of the system and/or the frame format. Block 200 controls the operation of the chip; IO circuits (210 and 220) support both parallel input/output and serial input/output. (210) is a parallel IO interface that outputs every bit of a pixel value simultaneously. (220) is a serial IO interface where every bit of a pixel value is output sequentially; a phase-locked loop (230) provides a clock to the whole chip.

In a particular example embodiment, when 0.11 µm CMOS technology node is employed, the periodic repeat distance of pixels along the row-axis and along the column-axis may be 900 nm, 1.1 µm, 1.2 µm, 1.4 µm, 1.75 µm, 2.2 µm, or larger. The implementation of the smallest of these pixels sizes, especially 900 nm, 1.1 µm, and 1.2 µm, may require transistor sharing among pairs or larger group of adjacent pixels.

Very small pixels can be implemented in part because all of the silicon circuit area associated with each pixel can be used for read-out electronics since the optical sensing function is achieved separately, in another vertical level, by the optically-sensitive layer that resides above the interconnect layer.

Because the optically sensitive layer and the read-out circuit that reads a particular region of optically sensitive material exist on separate planes in the integrated circuit, the shape (viewed from the top) of (1) the pixel read-out circuit and (2) the optically sensitive region that is read by (1); can be generally different. For example it may be desired to define an optically sensitive region corresponding to a pixel as a square; whereas the corresponding read-out circuit may be most efficiently configured as a rectangle.

In an imaging array based on a top optically sensitive layer connected through vias to the read-out circuit beneath, there exists no imperative for the various layers of metal, vias, and interconnect dielectric to be substantially or even partially optically transparent, although they may be transparent in some embodiments. This contrasts with the case of front-side-illuminated CMOS image sensors in which a substantially transparent optical path must exist traversing the interconnect stack. In the case of conventional CMOS image sensors, this presents an additional constraint in the routing of interconnect. This often reduces the extent to which a transistor, or transistors, can practically be shared. For example, 4:1 sharing is often employed, but higher sharing ratios are not. In contrast, a read-out circuit designed for use with a top-surface optically-sensitive layer can employ 8:1 and 16:1 sharing.

Embodiments of QD devices include a QD layer and a custom-designed or pre-fabricated electronic read-out integrated circuit. The QD layer is then formed directly onto the custom-designed or pre-fabricated electronic read-out integrated circuit. In some embodiments, wherever the QD layer overlies the circuit, it continuously overlaps and contacts at least some of the features of the circuit. In some embodiments, if the QD layer overlies three-dimensional features of the circuit, the QD layer may conform to these features. In other words, there exists a substantially contiguous interface between the QD layer and the underlying electronic read-out integrated circuit. One or more electrodes in the circuit contact the QD layer and are capable of relaying information about the QD layer, e.g., an electronic signal related to the amount of radiation 1000 on the QD layer, to a readout circuit. The QD layer can be provided in a continuous manner to cover the entire underlying circuit, such as a readout circuit, or patterned. If the QD layer is provided in a continuous manner, the fill factor can approach about 100%, with patterning, the fill factor is reduced, but can still be much greater than a typical 35% for some example CMOS sensors that use silicon photodiodes.

In embodiments, the QD optical devices are readily fabricated using techniques available in a facility normally used to make conventional CMOS devices. For example, a layer of QDs can be solution-coated onto a pre-fabricated electronic read-out circuit using, e.g., spin-coating, which is a standard CMOS process, and optionally further processed with other CMOS-compatible techniques to provide the final QD layer for use in the device. Because the QD layer need not require exotic or difficult techniques to fabricate, but can instead be made using standard CMOS processes, the QD optical devices can be made in high volumes, and with no significant increase in capital cost (other than materials) over current CMOS process steps.

Figure 3A:
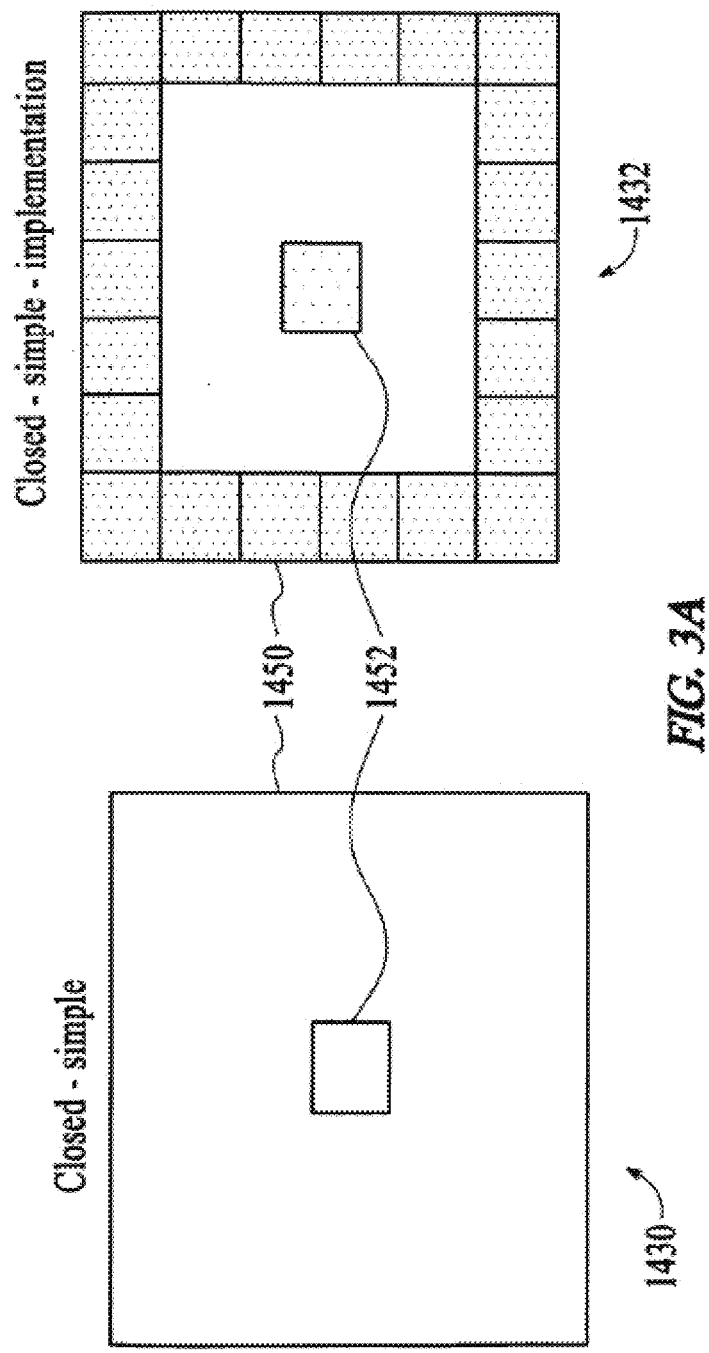
FIG. 3A shows an aspect of a closed simple geometrical arrangement of pixels, according to an embodiment.
Figure 3B:
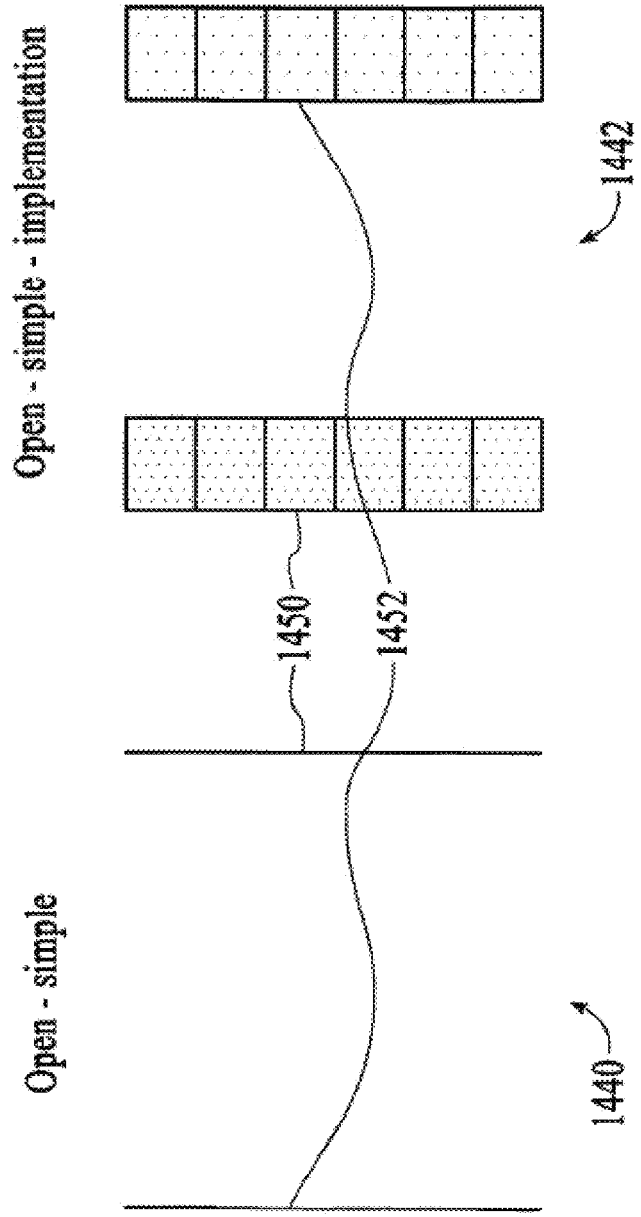
FIG. 3B shows an aspect of a open simple geometrical arrangement of pixels, according to an embodiment.
Figure 3C:
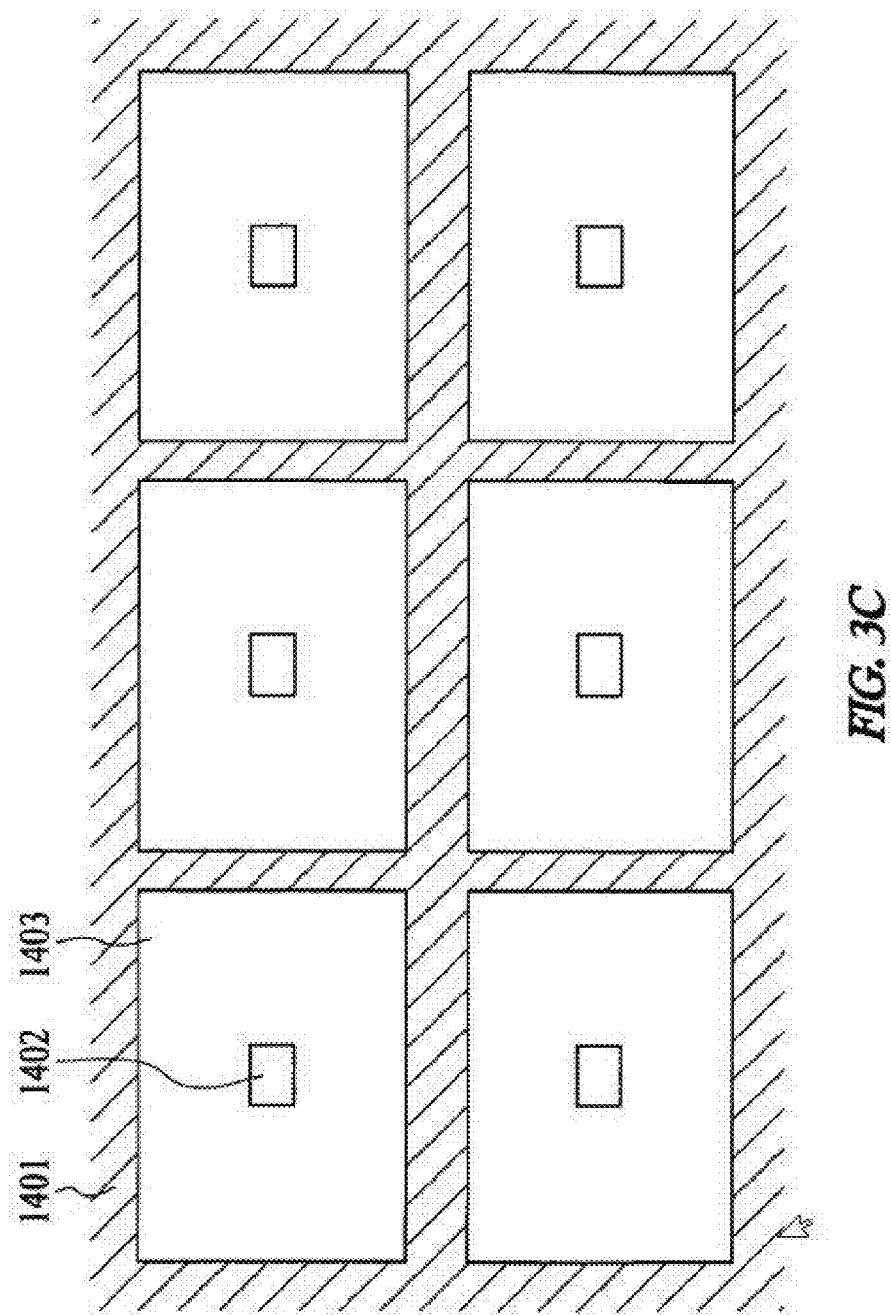
FIG. 3C shows a two-row by three-column sub-region within a generally larger array of top-surface electrodes, according to an embodiment.

FIG. 3C shows a two-row by three-column sub-region within a generally larger array of top-surface electrodes. The array of electrical contacts provides electrical communication to an overlying layer of optically sensitive material. 1401 represents a common grid of electrodes used to provide one shared contact to the optically sensitive layer. 1402 represents the pixel-electrodes which provide the other contact for electrical communication with the optically sensitive layer. In embodiments, a voltage bias of −2 V may be applied to the common grid 1401, and a voltage of +2.5 V may be applied at the beginning of each integration period to each pixel electrode 1402. Whereas the common contact 1401 is at a single electrical potential across the array at a given time, the pixel electrodes 1402 may vary in time and space across the array. For example if a circuit is configured such that the bias at 1402 varies in relation to current flowing into or out of 1402, then different electrodes 1402 may be at different biases throughout the progress of the integration period. Region 1403 represents the non-contacting region that lies between 1401 and 1402 within the lateral plane. 1403 is generally an insulating material in order to minimize dark current flowing between 1401 and 1402. 1401 and 1402 may generally consist of different materials. Each may for example be chosen for example from the list: TiN; TiN/Al/TiN; Cu; TaN; Ni; Pt; and from the preceding list there may reside superimposed on one or both contacts a further layer or set of layers chosen from: Pt, alkanethiols, Pd, Ru, Au, ITO, or other conductive or partially conductive materials.

In example embodiments using the above structures, interconnect 1452 may form an electrode in electrical communication with a capacitance, impurity region on the semiconductor substrate or other charge store. In some embodiments, a voltage is applied to the charge store and discharges due to the flow of current across the optically sensitive film over an integration period of time. At the end of the integration period of time, the remaining voltage is sampled to generate a signal corresponding to the intensity of light absorbed by the optically sensitive layer during the integration period. In other embodiments, the pixel region may be biased to cause a voltage to accumulate in a charge store over an integration period of time. At the end of the integration period of time, the voltage may be sampled to generate a signal corresponding to the intensity of light absorbed by the optically sensitive layer during the integration period. In some example embodiments, the bias across the optically sensitive layer may vary over the integration period of time due to the discharge or accumulation of voltage at the charge store. This, in turn, may cause the rate of current flow across the optically sensitive material to also vary over the integration period of time. In addition, the optically sensitive material may be a nanocrystal material with photoconductive gain and the rate of current flow may have a non-linear relationship with the intensity of light absorbed by the optically sensitive layer. As a result, in some embodiments, circuitry may be used to convert the signals from the pixel regions into digital pixel data that has a linear relationship with the intensity of light absorbed by the pixel region over the integration period of time. The non-linear properties of the optically sensitive material can be used to provide a high dynamic range, while circuitry can be used to linearize the signals after they are read in order to provide digital pixel data. Example pixel circuits for read out of signals from pixel regions are described further below.

FIG. 3A represents closed—simple patterns 1430 (e.g., conceptual illustration) and 1432 (e.g., vias used to create photodetector structures). In the closed-simple illustrations 1430-1432 the positively biased electrical interconnect 1452 is provided in the center area of a grounded contained square electrical interconnect 1450. Square electrical interconnect 1450 may be grounded or may be at another reference potential to provide a bias across the optically sensitive material in the pixel region. For example, interconnect 1452 may be biased with a positive voltage and interconnect may be biased with a negative voltage to provide a desired voltage drop across a nanocrystal material in the pixel region between the electrodes. In this configuration, when radiation 1000 to which the layer is responsive falls within the square area a charge is developed and the charge is attracted to and move towards the center positively biased electrical interconnect 1452. If these closed-simple patterns are replicated over an area of the layer, each closed simple pattern forms a portion or a whole pixel where they capture charge associated with incident radiation 1000 that falls on the internal square area. In example embodiments, the electrical interconnect 1450 may be part of a grid that forms a common electrode for an array of pixel regions. Each side of the interconnect 1450 may be shared with the adjacent pixel region to form part of the electrical interconnect around the adjacent pixel. In this embodiment, the voltage on this electrode may be the same for all of the pixel regions (or for sets of adjacent pixel regions) whereas the voltage on the interconnect 1452 varies over an integration period of time based on the light intensity absorbed by the optically sensitive material in the pixel region and can be read out to generate a pixel signal for each pixel region. In example embodiments, interconnect 1450 may form a boundary around the electrical interconnect 1452 for each pixel region. The common electrode may be formed on the same layer as interconnect 1452 and be positioned laterally around the interconnect 1450. In some embodiments, the grid may be formed above or below the layer of optically sensitive material in the pixel region, but the bias on the electrode may still provide a boundary condition around the pixel region to reduce cross over with adjacent pixel regions.

FIG. 3B illustrates open simple patterns of electrical interconnects. The open simple patterns do not, generally, form a closed pattern. The open simple pattern does not enclose a charge that is produced as the result of incident radiation 1000 with the area between the positively biased electrical interconnect 1452 and the ground 1450; however, charge developed within the area between the two electrical interconnects will be attracted and move to the positively biased electrical interconnect 1452. An array including separated open simple structures may provide a charge isolation system that may be used to identify a position of incident radiation 1000 and therefore corresponding pixel assignment. As above, electrical interconnect 1450 may be grounded or be at some other reference potential. In some embodiments, electrical interconnect 1450 may be electrically connected with the corresponding electrode of other pixels (for example, through underlying layers of interconnect) so the voltage may be applied across the pixel array. In other embodiments, the interconnect 1450 may extend linearly across multiple pixel regions to form a common electrode across a row or column.

Pixel circuitry that may be used to read out signals from the pixel regions will now be described. As described above, in embodiments, pixel structures 1500 within the QDPC 100 of FIG. 1 may have pixel layouts 1600, where pixel layouts 1600 may have a plurality of layout configurations such as vertical, planar, diagonal, or the like. Pixel structures 1500 may also have embedded pixel circuitry 1700. Pixel structures may also be associated with the electrical interconnections 1404 between the photodetector structures 1400 and pixel circuitry 1700.

In embodiments, quantum dot pixels 1800 within the QDPC 100 of FIG. 1 may have pixel circuitry 1700 that may be embedded or specific to an individual quantum dot pixel 1800, a group of quantum dot pixels 1800, all quantum dot pixels 1800 in an array of pixels, or the like. Different quantum dot pixels 1800 within the array of quantum dot pixels 1800 may have different pixel circuitry 1700, or may have no individual pixel circuitry 1700 at all. In embodiments, the pixel circuitry 1700 may provide a plurality of circuitry, such as for biasing, voltage biasing, current biasing, charge transfer, amplifier, reset, sample and hold, address logic, decoder logic, memory, TRAM cells, flash memory cells, gain, analog summing, analog-to-digital conversion, resistance bridges, or the like. In embodiments, the pixel circuitry 1700 may have a plurality of functions, such as for readout, sampling, correlated double sampling, sub-frame sampling, timing, integration, summing, gain control, automatic gain control, off-set adjustment, calibration, offset adjustment, memory storage, frame buffering, dark current subtraction, binning, or the like. In embodiments, the pixel circuitry 1700 may have electrical connections to other circuitry within the QDPC 100, such as wherein other circuitry located in at least one of a second quantum dot pixel 1800, column circuitry, row circuitry, circuitry within the functional components 2004 of the QDPC 100, or other features 2204 within the integrated system 2200 of the QDPC 100, or the like. The design flexibility associated with pixel circuitry 1700 may provide for a wide range of product improvements and technological innovations.

Pixel circuitry 1700 within the quantum dot pixel 1800 may take a plurality of forms, ranging from no circuitry at all, just interconnecting electrodes, to circuitry that provides functions such as biasing, resetting, buffering, sampling, conversion, addressing, memory, and the like. In embodiments, electronics to condition or process the electrical signal may be located and configured in a plurality of ways. For instance, amplification of the signal may be performed at each pixel, group of pixels, at the end of each column or row, after the signal has been transferred off the array, just prior to when the signal is to be transferred off the chip 2000, or the like. In another instance, analog-to-digital conversion may be provided at each pixel, group of pixels, at the end of each column or row, within the chip's 2000 functional components 2004, after the signal has been transferred off the chip 2000, or the like. In addition, processing at any level may be performed in steps, where a portion of the processing is performed in one location and a second portion of the processing is performed in another location. An example may be the performing analog-to-digital conversion in two steps, say with an analog combining at the pixel 1800 and a higher-rate analog-to-digital conversion as a part of the chip's 2000 functional components 2004.

In embodiments, different electronic configurations may require different levels of post-processing, such as to compensate for the fact that every pixel has its own calibration level associated with each pixel's readout circuit. The QDPC 100 may be able to provide the readout circuitry at each pixel with calibration, gain-control, memory functions, and the like. Because of the QDPC's 100 highly integrated structure, circuitry at the quantum dot pixel 1800 and chip 2000 level may be available, which may enable the QDPC 100 to be an entire image sensor system on a chip. In some embodiments, the QDPC 100 may also be comprised of a quantum dot material 200 in combination with conventional semiconductor technologies, such as CCD and CMOS.

Figure 5A:
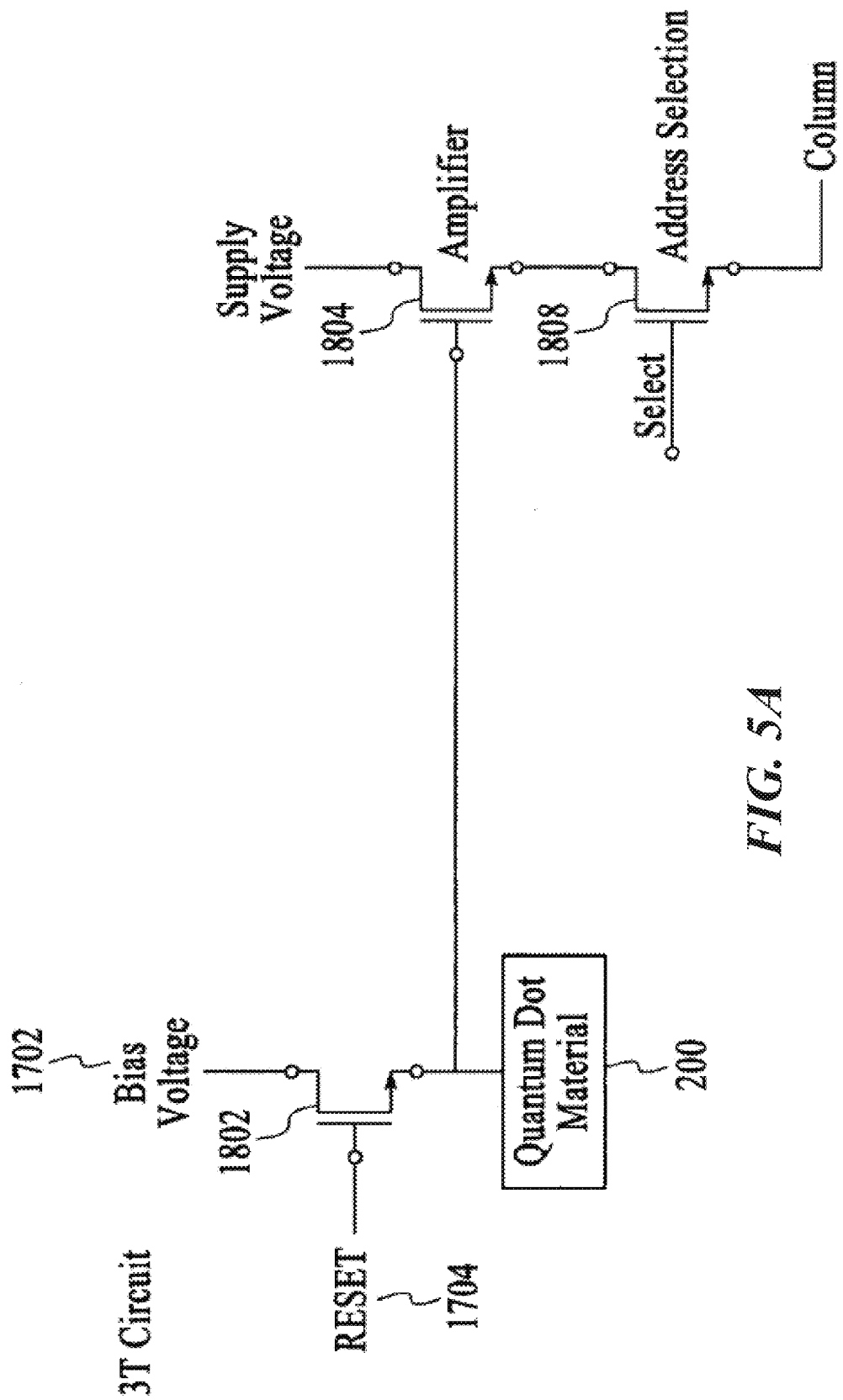
FIG. 5A illustrates an example 3T transistor configuration for interfacing with the quantum dot material of FIG. 2.

Pixel circuitry may be defined to include components beginning at the electrodes in contact with the quantum dot material 200 and ending when signals or information is transferred from the pixel to other processing facilities, such as the functional components 2004 of the underlying chip 200 or another quantum dot pixel 1800. Beginning at the electrodes on the quantum dot material 200, the signal is translated or read. In embodiments, the quantum dot material 200 may provide a change in current flow in response to radiation 1000. The quantum dot pixel 1800 may require bias circuitry 1700 in order to produce a readable signal. This signal in turn may then be amplified and selected for readout. One embodiment of a pixel circuit shown in FIG. 5A uses a reset-bias transistor 1802, amplifier transistor 1804, and column address transistor 1808. This three-transistor circuit configuration may also be referred to as a 3T circuit. Here, the reset-bias transistor 1802 connects the bias voltage 1702 to the quantum dot material 200 when reset 1704 is asserted, thus resetting the electrical state of the quantum dot material 200. After reset 1704, the quantum dot material 200 may be exposed to radiation 1000, resulting in a change in the electrical state of the quantum dot material 200, in this instance a change in voltage leading into the gate of the amplifier 1804. This voltage is then boosted by the amplifier transistor 1804 and presented to the address selection transistor 1808, which then appears at the column output of the address selection transistor 1808 when selected. In some embodiments, additional circuitry may be added to the pixel circuit to help subtract out dark signal contributions. In other embodiments, adjustments for dark signal can be made after the signal is read out of the pixel circuit.

Figure 5B:
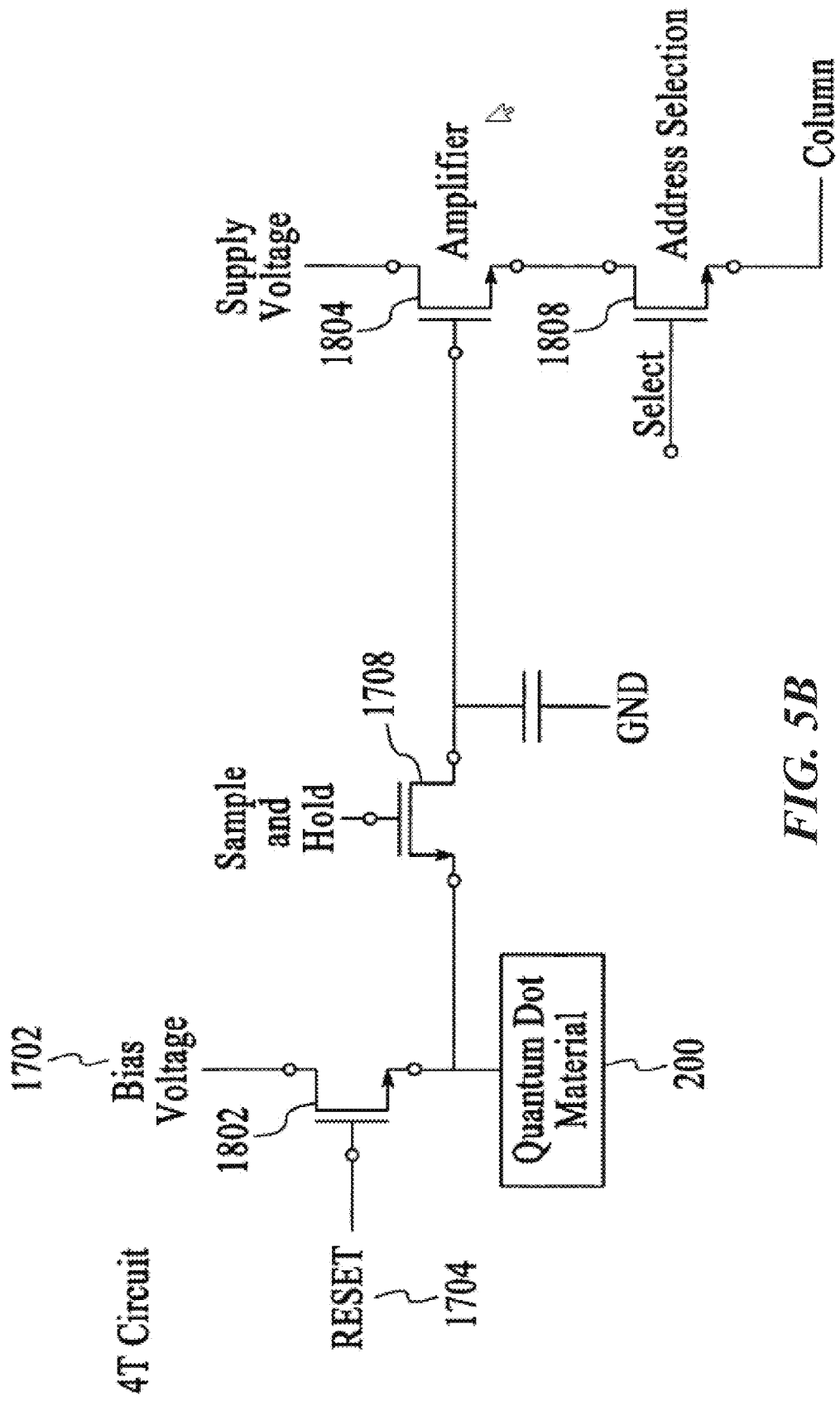
FIG. 5B illustrates an example of a 4T transistor configuration for interfacing with the quantum dot material of FIG. 2.

Although additional circuitry may not be required for the low noise operation of the QDPC 100 in some embodiments, a fourth transistor circuit group may be added to increase sensitivity. FIG. 5B shows a QDPC 100 4T circuit, with the fourth transistor 1708 configured as a sample and hold. This configuration may also be referred to as a global shutter, where the entire pixel 1800 array may be sampled at the same time, but not necessarily at a fixed time, where the time of sampling may be a function of radiation 1000 conditions. The sample and hold may implement a correlated double sampling, where the signal value of each pixel is transferred to the output, and the output is reset to a reference value. The final value assigned to this pixel may be the difference between the reference value and the transferred signal. Correlated double sampling may yield the best representation of the true value associated with each pixel. From an electronics standpoint, there may be different methods for accomplishing this, such as digital, analog sample and hold, integration, dual slope, and the like. Differences in effectiveness may become evident with ultra low noise systems of less than 4 or 5 electrons, depending on the overall design of the system. In an embodiment, two sample and holds may be used, holding two values in order to utilize the difference between them. In addition, the QDPC 4T circuit may also have a separate pixel reset, which may be distinct from the circuit reset. The two resets may be used simultaneously, or at different times. In embodiments, the QDPC 100 circuits may have varied voltages, time profiles, lengths of reset times, sampling schemes, and the like, that my enable innovative product solutions not capable with conventional designs.

In embodiments, the biasing of the photodetector may be time invariant or time varying. Varying space and time may reduce cross-talk, and enable a shrinking the quantum dot pixel 1800 to a smaller dimension, and require connections between quantum dot pixels 1800. Biasing could be implemented by grounding at the corner of a pixel 1800 and dots in the middle. Biasing may occur only when performing a read, enabling either no field on adjacent pixels 1800, forcing the same bias on adjacent pixels 1800, reading odd columns first then the even columns, and the like. Electrodes and/or biasing may also be shared between pixels 1800. Biasing may be implemented as a voltage source or as a current source. Voltage may be applied across a number of pixels, but then sensed individually, or applied as a single large bias across a string of pixels 1800 on a diagonal. The current source may drive a current down a row, then read it off across the column. This may increase the level of current involved, which may decrease read noise levels.

In embodiments, configuration of the field, by using a biasing scheme or configuration of voltage bias, may produce isolation between pixels. Currently may flow in each pixel so that only electron-hole pairs generated in that volume of pixel flow within that pixel. This may allow electrostatically implemented inter-pixel isolation and cross-talk reduction, without physical separation. This could break the linkage between physical isolation and cross-talk reduction.

In embodiments, the pixel circuitry 1700 may include circuitry for pixel readout. Pixel readout may involve circuitry that reads the signal from the quantum dot material 200 and transfers the signal to other components 1900, chip functional components 2004, to the other features 2204 of the integrated system 2200, or to other off-chip components. Pixel readout circuitry may include quantum dot material 200 interface circuitry, such as the 3T and 4T circuits shown in FIGS. 5A and 5B, for example. Pixel readout may involve different ways to readout the pixel signal, ways to transform the pixel signal, voltages applied, and the like. Pixel readout may require a number of metal contacts with the quantum dot material 200, such as 2, 3, 4, 20, or the like. These electrical contacts may be custom configured for size, degree of barrier, capacitance, and the like, and may involve other electrical components such a Schottky contact. Pixel readout time may be related to how long the radiation 1000-induced electron-hole pair lasts, such as for milliseconds or microseconds. In embodiments, this time may be associated with quantum dot material 200 process steps, such as changing the persistence, gain, dynamic range, noise efficiency, and the like.

Figure 4A:
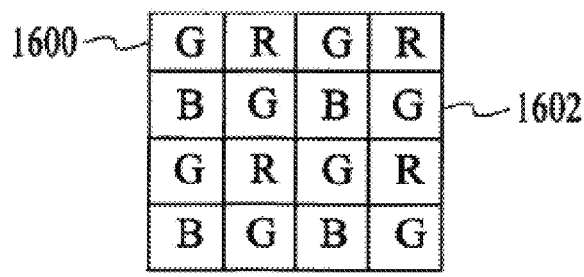
FIG. 4A shows a Bayer filter pattern.
Figure 4B:
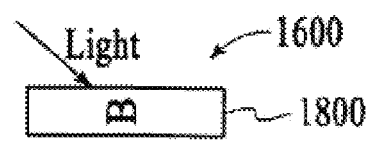
FIG. 4B-4F show examples of some alternative pixel layouts, according to an embodiment.
Figure 4C:
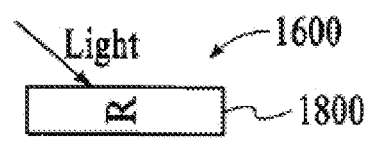
Figure 4D:
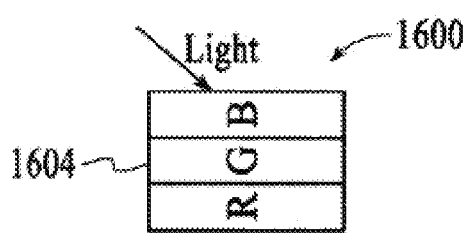
Figure 4E:
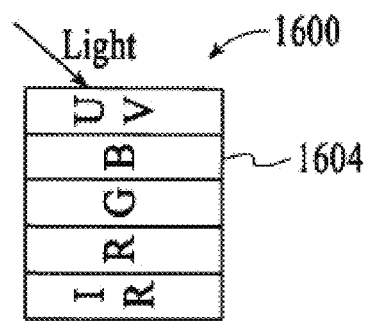
Figure 4F:
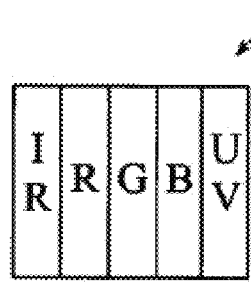
Figure 4G:
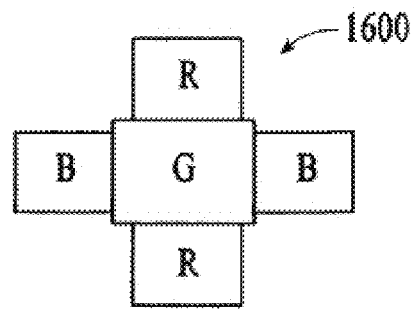
FIG. 4G-4L show pixels of different sizes, layouts and types used in pixel layouts, according to an embodiment.
Figure 4H:
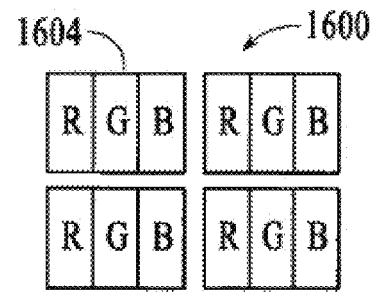
Figure 4I:
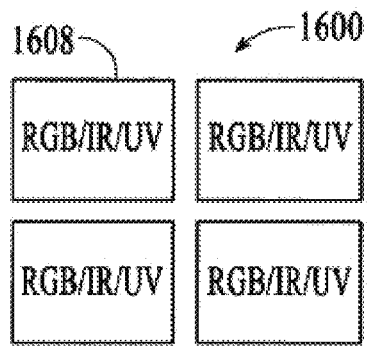
Figure 4J:
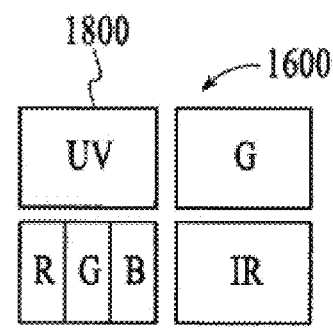
Figure 4K:
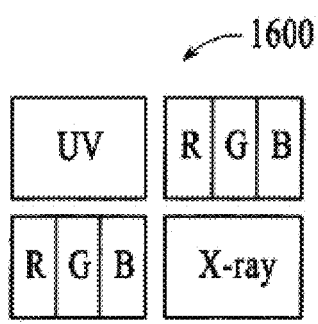
Figure 4L:
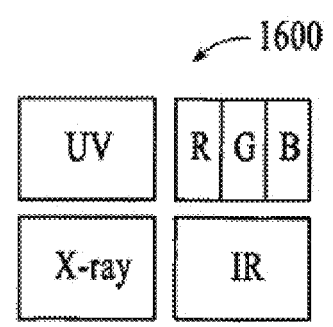
Figure 4M:
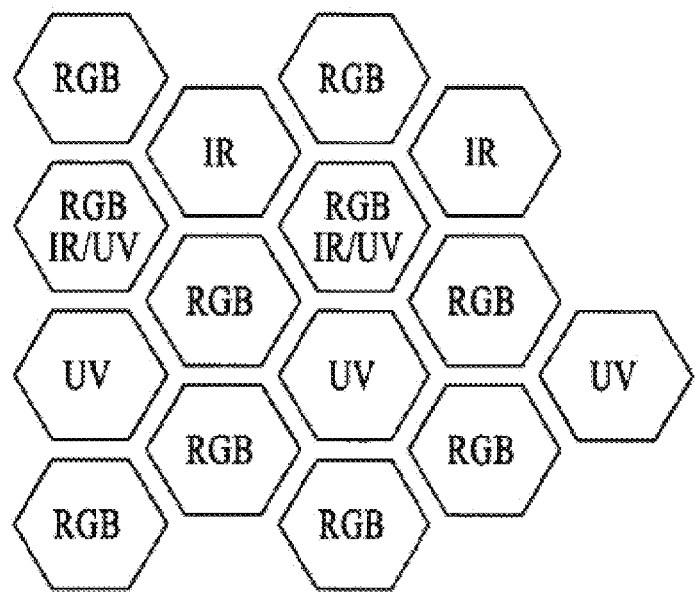
FIG. 4M shows pixel layouts with different shapes, such as hexagons, according to an embodiment.
Figure 4N:
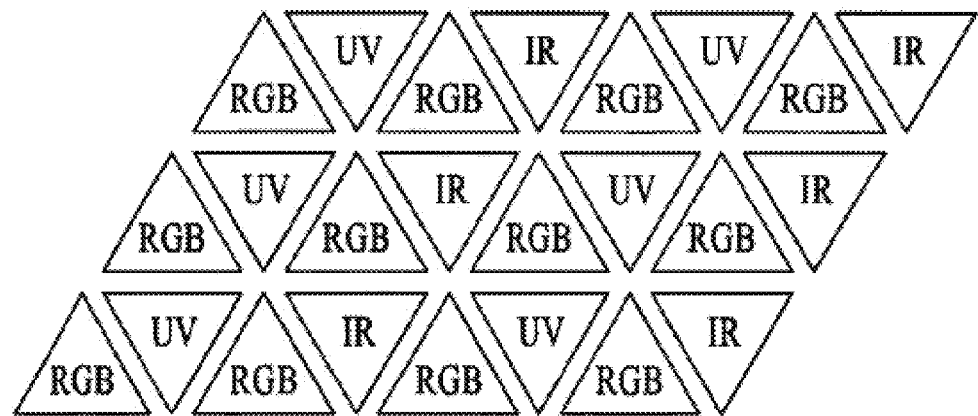
FIG. 4N shows pixel layouts with different shapes, such as triangles, according to an embodiment.
Figure 4O:
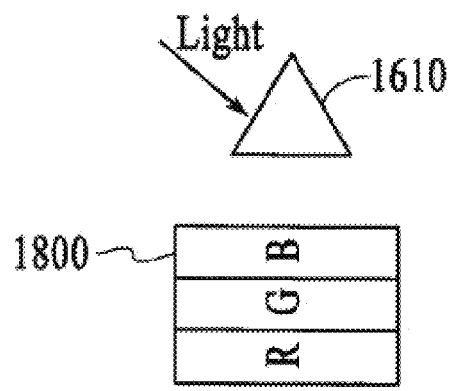
FIG. 4O shows a quantum dot pixel, such as a multi-spectral quantum dot pixel or other pixel, provided in association with an optical element, according to an embodiment.
Figure 4P:
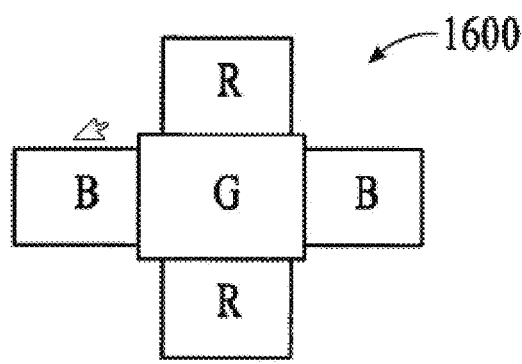
FIG. 4P shows an example of a pixel layout, according to an embodiment.

The quantum dot pixels 1800 described herein can be arranged in a wide variety of pixel layouts 1600. Referring to FIGS. 4A through 4P, for example, a conventional pixel layout 1600, such as the Bayer filter layout 1602, includes groupings of pixels disposed in a plane, which different pixels are sensitive to radiation 1000 of different colors. In conventional image sensors, such as those used in most consumer digital cameras, pixels are rendered sensitive to different colors of radiation 1000 by the use of color filters that are disposed on top of an underlying photodetector, so that the photodetector generates a signal in response to radiation 1000 of a particular range of frequencies, or color. In this configuration, mosaic of different color pixels is referred to often as a color filter array, or color filter mosaic. Although different patterns can be used, the most typical pattern is the Bayer filter pattern 1602 shown in FIG. 4A, where two green pixels, one red pixel and one blue pixel are used, with the green pixels (often referred to as the luminance-sensitive elements) positioned on one diagonal of a square and the red and blue pixels (often referred to as the chrominance-sensitive elements) are positioned on the other diagonal. The use of a second green pixel is used to mimic the human eye's sensitivity to green light. Since the raw output of a sensor array in the Bayer pattern consists of a pattern of signals, each of which corresponds to only one color of light, demosaicing algorithms are used to interpolate red, green and blue values for each point. Different algorithms result in varying quality of the end images. Algorithms may be applied by computing elements on a camera or by separate image processing systems located outside the camera. Quantum dot pixels may be laid out in a traditional color filter system pattern such as the Bayer RGB pattern; however, other patterns may also be used that are better suited to transmitting a greater amount of light, such as Cyan, Magenta, Yellow (CMY). Red, Green, Blue (RGB) color filter systems are generally known to absorb more light than a CMY system. More advanced systems such as RGB Cyan or RGB Clear can also be used in conjunction with Quantum dot pixels.

In one embodiment, the quantum dot pixels 1800 described herein are configured in a mosaic that imitates the Bayer pattern 1602; however, rather than using a color filter, the quantum dot pixels 1800 can be configured to respond to radiation 1000 of a selected color or group of colors, without the use of color filters. Thus, a Bayer pattern 1602 under an embodiment includes a set of green-sensitive, red-sensitive and blue-sensitive quantum dot pixels 1800. Because, in embodiments, no filter is used to filter out different colors of radiation 1000, the amount of radiation 1000 seen by each pixel is much higher.

The photodetectors of an embodiment can provide for the discrimination among different spectral bands of electromagnetic radiation. Of particular interest are the x-ray, ultraviolet, visible (including blue, green, and red), near-infrared, and short-wavelength infrared bands.

A description follows of methods and processes for creating, integrating (with circuits), and exploiting in a variety of applications top-surface photodetectors or arrays of photodetectors.

The photodetectors, and arrays of photodetectors, described herein can readily be integrated with other portions of the image sensor circuit and system by methods such as spin-coating, spray-coating, drop-coating, sputtering, physical vapor deposition, chemical vapor deposition, and self-assembly. Embodiments include exchanging ligands passivating nanoparticle surfaces for shorter ligands that will provide for appropriate charge carrier mobilities once films are formed. Embodiments include solution-phase exchanges which enable the realization of smooth-morphology films necessary to the realization of image sensors having acceptable consistent dark currents and photoresponses across an array.

The photodetectors described herein provide relatively maximum sensitivity. In embodiments, the photodetectors described herein minimize noise by fusing nanocrystal cores such as to ensure substantially non-noise-degrading electrical communication among the particles making up the optically sensitive layer through which current flows. In embodiments, the photodetectors described herein minimize dark current by providing an electrode-to-nanocrystalline-layer electrical connection that substantially blocks for example one type of carrier, including potentially the majority carrier at equilibrium. In embodiments, cross-linking molecules are employed that utilize chemical functionalities that remove oxides, sulfates, and/or hydroxides responsible for p-type doping. Thus, in embodiments, a more intrinsic or even n-type optically sensitive layer may be provided, leading to lowered dark currents. In embodiments, many steps in quantum dot synthesis and/or processing and/or device packaging may be performed in a controlled environment such as a Schlenk line or Glove Box or under N2 purging; and optically sensitive layers may be encapsulated using substantially impermeable layers such as oxides, oxynitrides, or polymers such as polyxylylene, or epoxies, in order to prevent reactive gases such as oxygen or water from significantly permeating the optically sensitive layer. In this manner, combinations of properties such as gain, dark current, and lag may be preserved over the useful lifetime of an image sensor.

In embodiments, photodiodes are instead provided based on colloidal quantum dot layers, wherein two electrical contacts having appreciably different work functions are employed to contact the active layer. In embodiments, dark currents may be minimized through operation of such devices without the application of an appreciable external voltage bias. In embodiments, cross-linking moieties such as benzenedithiol, a bidentate linker, may be employed to remove and/or passivate certain trap states that may be present, or may develop, in such materials.

The photodetectors described herein provide enhanced dynamic range by producing a sublinear dependence of electrical signal (such as photocurrent). At low to middling intensities, photocurrent may depend approximately linearly on intensity, but at higher intensities, photocurrent may exhibit sublinear dependence on intensity. In embodiments, photodetectors are provided wherein photoconductive gain depends on the bias applied to a device. This arises because gain is proportional to carrier lifetime divided by carrier transit time, and transit time varies in inverse proportionality with applied field. In embodiments, circuits are developed that exploit this dependence of gain on bias to increase dynamic range.

In embodiments, photodetectors described herein may readily be altered, or "tuned," to provide sensitivity to different spectral bands. Tuning is provided herein through the quantum size effect, whereby nanoparticle diameter is decreased, in cases through synthetic control, to increase the effective bandgap of the resulting quantum dots. Another method of tuning is provided through the choice of materials composition, wherein the use of a material having a larger bulk bandgap generally facilitates the realization of a photodetector with responsivity onset at a relatively higher photon energy. In embodiments, photodetectors having different absorption onsets may be superimposed to form vertical pixels, wherein pixel(s) closer to the source of optical signal absorb and sense higher-energy bands of electromagnetic radiation, whereas pixel(s) further from the source of optical signal absorb and sense lower-energy bands.

In conventional CMOS image sensors, the challenge of leakage current, leading to high dark current, has been substantially overcome through the employment of pinned photodiodes for light sensing. These are typically integrated into what is known as a 4T circuit.

In the case of top-surface photodetectors achieved using a highly absorbing light-sensing material, the pinning of the photodiode may add additional process steps such as an implant; and also presents challenges in the integration of the top-surface material with the pinned silicon photodiode beneath.

In the absence of a pinned photodiode solution, the dark current; its noise; and the amplitude of the variation in dark current; may all be higher than desired. This degrades the capture of high-quality images.

Embodiments include a means of reducing the time-averaged leakage current, and therefore the time-averaged dark current, using dynamic biasing of the read-out circuit. Embodiments enable the achievement of improved signal-to-noise ratios in image sensors.

A feature of the photodetectors used of the inventive subject matter is the fact that the two biasing electrodes may be controlled independently. Put another way—neither of the electrodes providing a bias across the light-sensing medium is tied to some voltage associated with the silicon, such as a substrate or body voltage. Instead, each of the electrodes, and the photodetection device itself, may be described as 'floating' relative to arbitrary fixed potentials elsewhere in the circuit.

In an embodiment, each pixel includes a photodetecting material; two biasing electrodes that are independently electrically controllable; and three transistors for reading the electrical signal collected from the photodetector. One of the two electrodes in electrical communication with the photodetecting material—this electrode to be referred to as the pixel electrode—is connected to a transistor source for signal readout. The other electrode in electrical communication with the photodetecting material—referred to as the common electrode—goes to a voltage source.

Three different example embodiments for controlling the floating photodetector to reduce silicon diode dark current are discussed, below.

In an embodiment, during the reset phase, the common electrode is set to a medium voltage, for example 3V (normal range from −5V to 5V). The pixel electrode is driven to be a low voltage, for example 0V (normal range from 0V to 5V).

During the integration phase, the common electrode remains at the same voltage, for example 3V. Light induced photocurrent in the floating photodetector will drive the diode node voltage higher. The photocurrent serves as a current source in this configuration. The use of a low voltage on the pixel electrode significantly suppresses the dark current of the pixel circuitry under dark condition.

During the read-out phase, the common electrode is brought to a higher level, such as 5V (normal range −5V to 5V). This will boost up the pixel voltage to make sure the low voltage at diode node can be read out through the readout circuit, and thus maintain dynamic range for the readout path. Alternatively a low VT readout transistor (for example, threshold of 0V, with range of −1V to 1V) can be used to read out the low voltage, in which case the pulsing on common electrode is not necessary.

Figure 11:
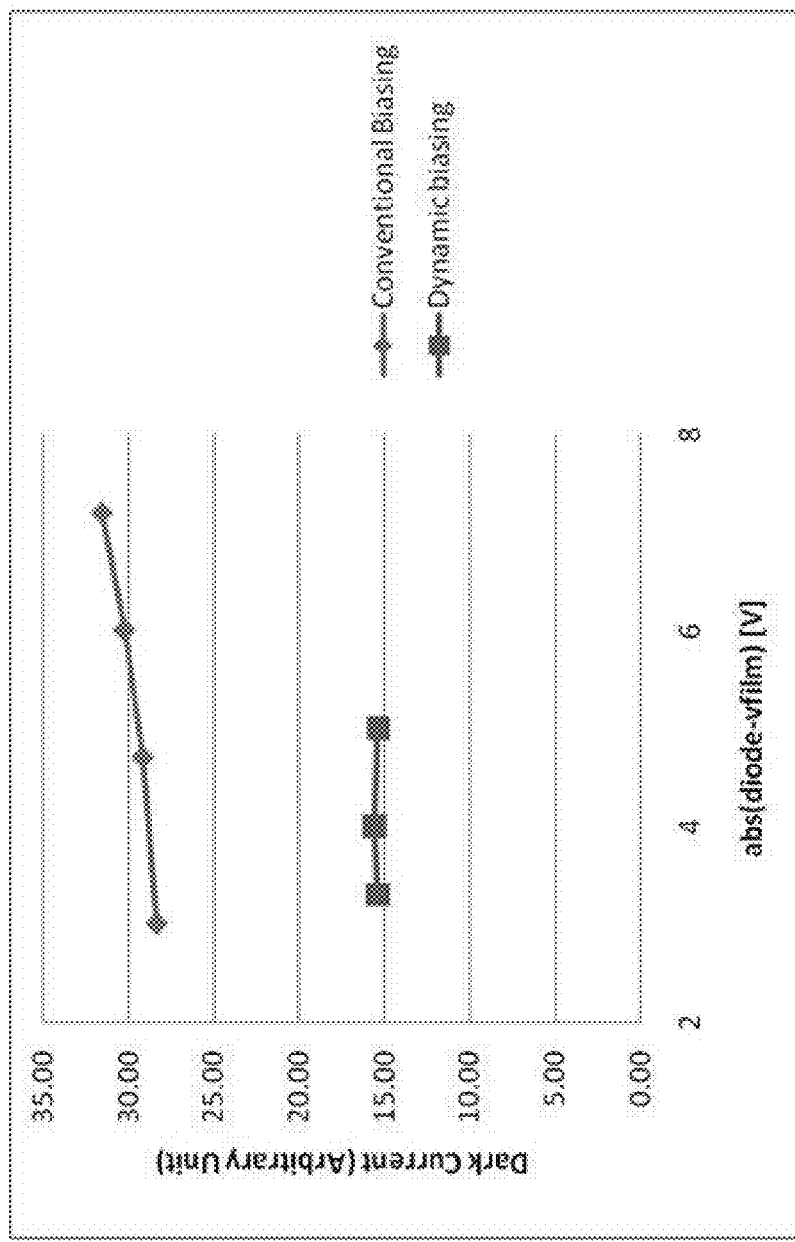
FIG. 11 is a graph comparing the dark current in the conventional versus the dynamic biasing scheme, in an example embodiment.
Figure 12:
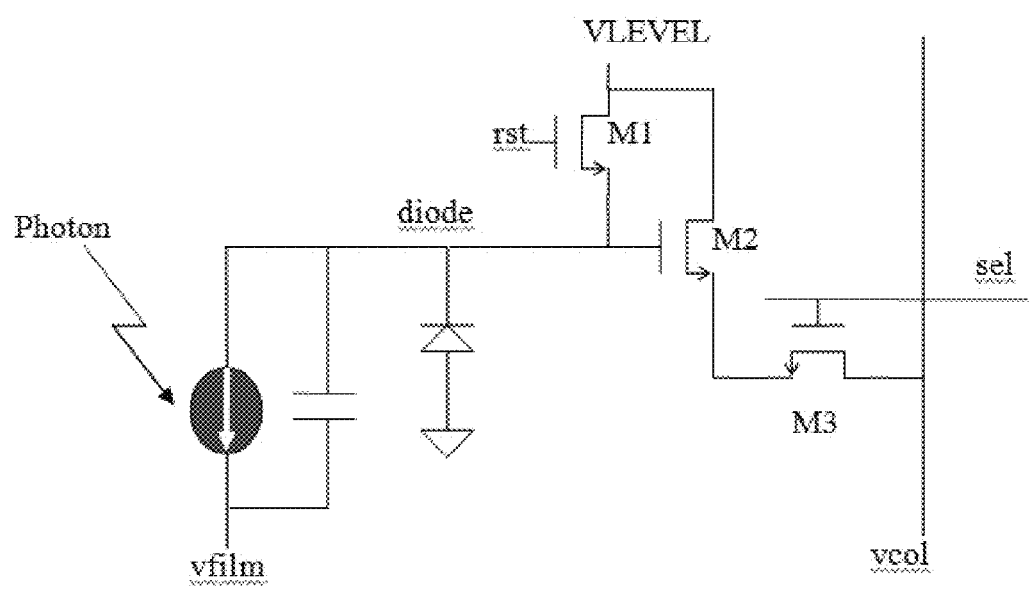
FIG. 12 is a circuit diagram of a specific embodiment of the floating-photodetector-enabled dynamic-biasing scheme disclosed herein.
Figure 13:
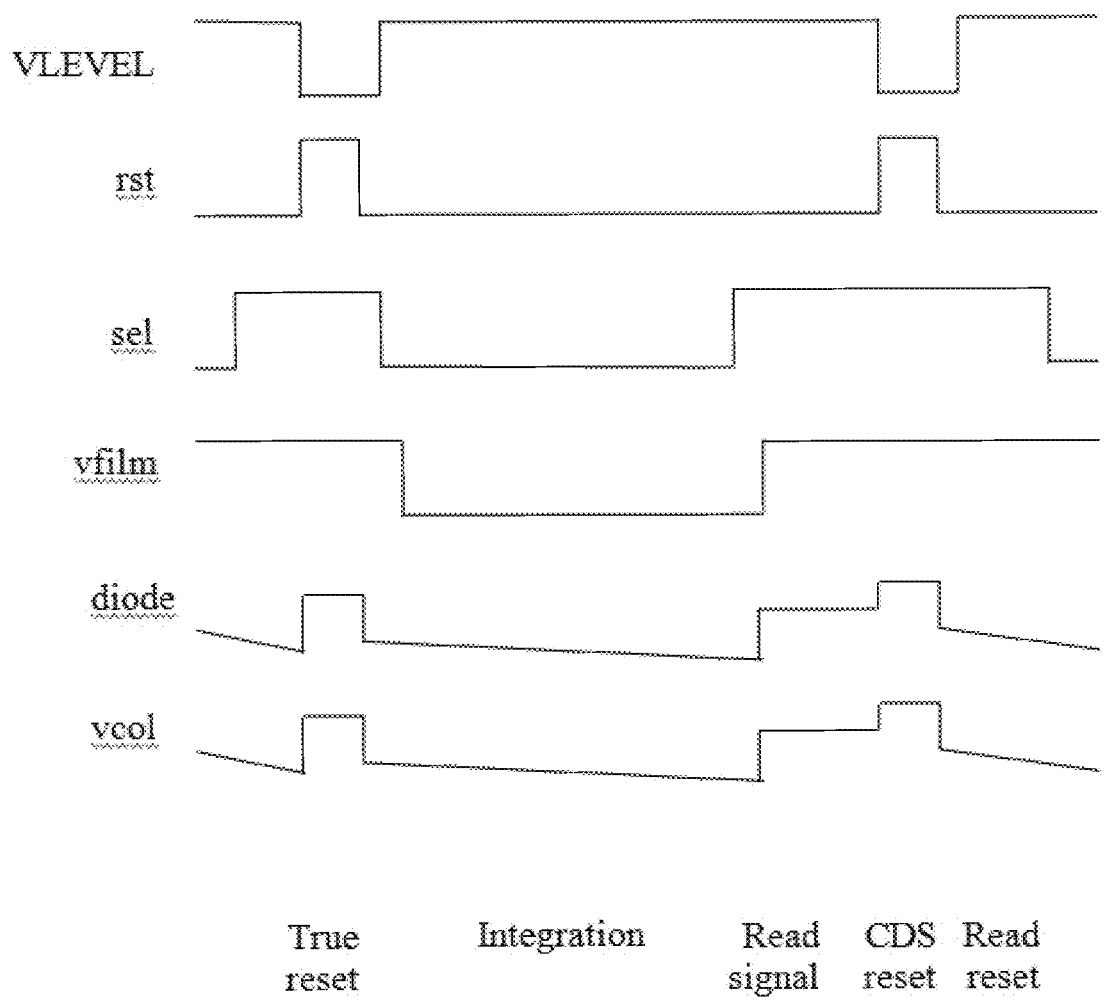
FIG. 13 is a timing diagram of a specific embodiment of the floating-photodetector-enabled dynamic biasing scheme disclosed herein.
Figure 14:
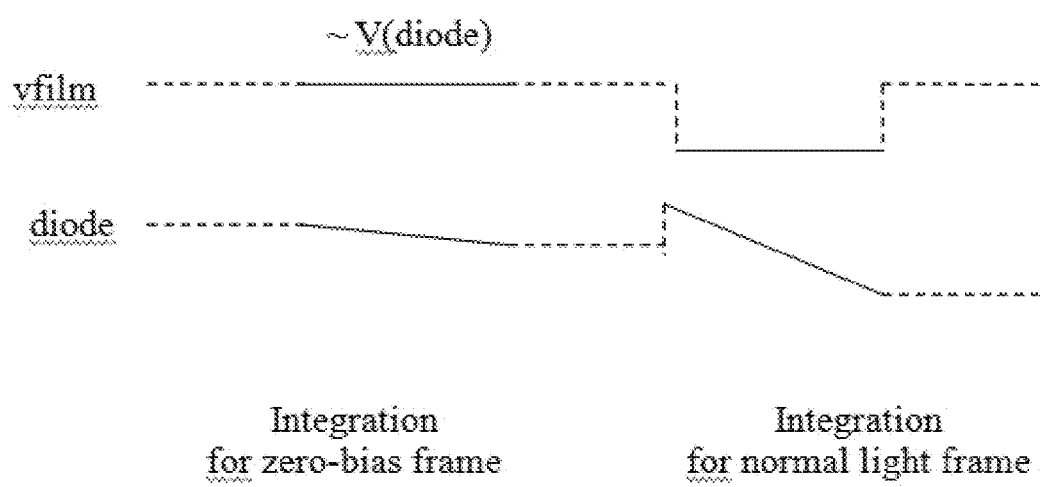
FIG. 14 is a timing diagram of a third specific embodiment of the floating-photodetector-enabled dynamic biasing scheme disclosed herein, in an example embodiment, for example, a "zero-bias frame subtraction," where, in this example, vfilm is biased to be lower than diode voltage during 'light frame' integration and during zero-bias frame integration, the effective bias across the film is close to 0.
Figure 15:
FIG. 15 is a picture quality comparison between the dark current in the conventional versus the dynamic biasing scheme utilizing a "zero-bias frame subtraction," in an example embodiment.
Figure 15:

In one specific testing, the dark current is found to be about 50% lower using this dynamic biasing scheme, as shown in FIG. 11.

During the reset phase, the common electrode is set to a high voltage, for example 5V (normal range of −2V to 10V). The pixel electrode is driven to be at medium voltage, for example 3V (normal range of 0V to 5V).

Before integration starts, the common electrode voltage is pulled low, to for example −1V (normal range −5V to 5V). This will bring down the pixel electrode, to for example 1V (normal range of 0V to 5V).

During the integration phase, the common electrode remains at the same voltage of −1V. Light induced photocurrent in the floating photodetector will drive the diode node voltage lower. The photocurrent serves as a current sink in this configuration. The use of a low voltage on the pixel electrode significantly suppresses the dark current of the pixel circuitry.

During the read-out phase, the common electrode is brought back to a higher level, such as 5V (normal range of −2V to 10V). This will boost up the pixel voltage to make sure the low voltage at diode node can be read out through the readout circuit, and thus maintain dynamic range for the readout path. Alternatively a low VT readout transistor can be used to read out the low voltage, in which case the pulsing on common electrode is not necessary.

In an embodiment, a 'zero-bias frame subtraction' scheme involves 2-frame readout. During the integration time of the first frame, the floating photodetector is biased at near 0V (i.e., the pixel electrode and the common electrode have the same bias voltage). This bias voltage can also be slight higher or lower than 0V, as far as the detector is not sensitive to light under such bias (normal range of −1V to 1V). As the result the photodetector will not generate any photocurrent, and the readout signal is mainly from the silicon diode dark current. For the $2^{nd}$ frame integration, the floating photodetector is biased to operate in normal condition, providing photocurrent to the diode node (as a current sink or current source). So the $2^{nd}$ frame signal includes both light signal and the silicon dark current. By subtracting the signal of $1^{st}$ frame from the $2^{nd}$ frame, the light signal is obtained while silicon dark current is largely cancelled by the subtraction. This 'zero-bias frame subtraction' can be performed on the fly during image capture, without needing a mechanical shutter.

The pictures show that the dark current can be significantly suppressed by this 'zero-bias frame subtraction' scheme, which results in improved sensitivity.

An extension of this embodiment allows one to use the 'zero-bias' floating diode as a potential global shutter, replacing the mechanical shutter.

Embodiments are described, by way of example only, with reference to the accompanying drawings. The drawings are not necessarily to scale. For clarity and conciseness, certain features of the embodiment may be exaggerated and shown in schematic form.

Figure 25:
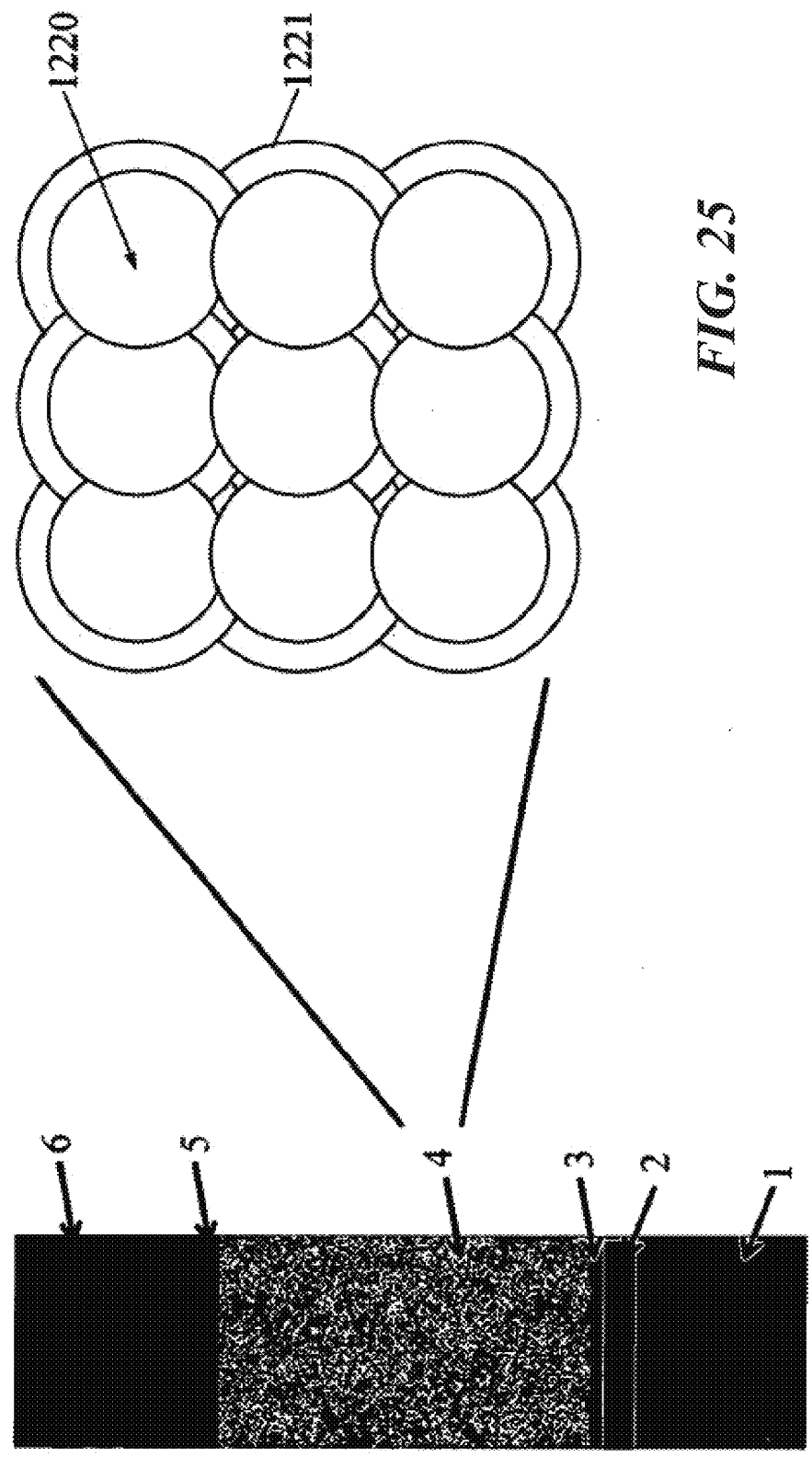
FIG. 25 shows a materials stack, under an embodiment.

FIG. 25 shows a general view of the materials stack. The materials stack is integrated with CMOS (complementary metal-oxide-semiconductor) silicon circuitry, but is not so limited. The use of CMOS silicon circuitry to read the signals transduced by photodetectors, including top-surface photodetectors, and including those based on colloidal quantum dots including PbS, includes the integration of top-surface materials with silicon CMOS electronics. The structure and composition of the photodetector is described in detail below with reference to FIG. 25.

Figure 26:
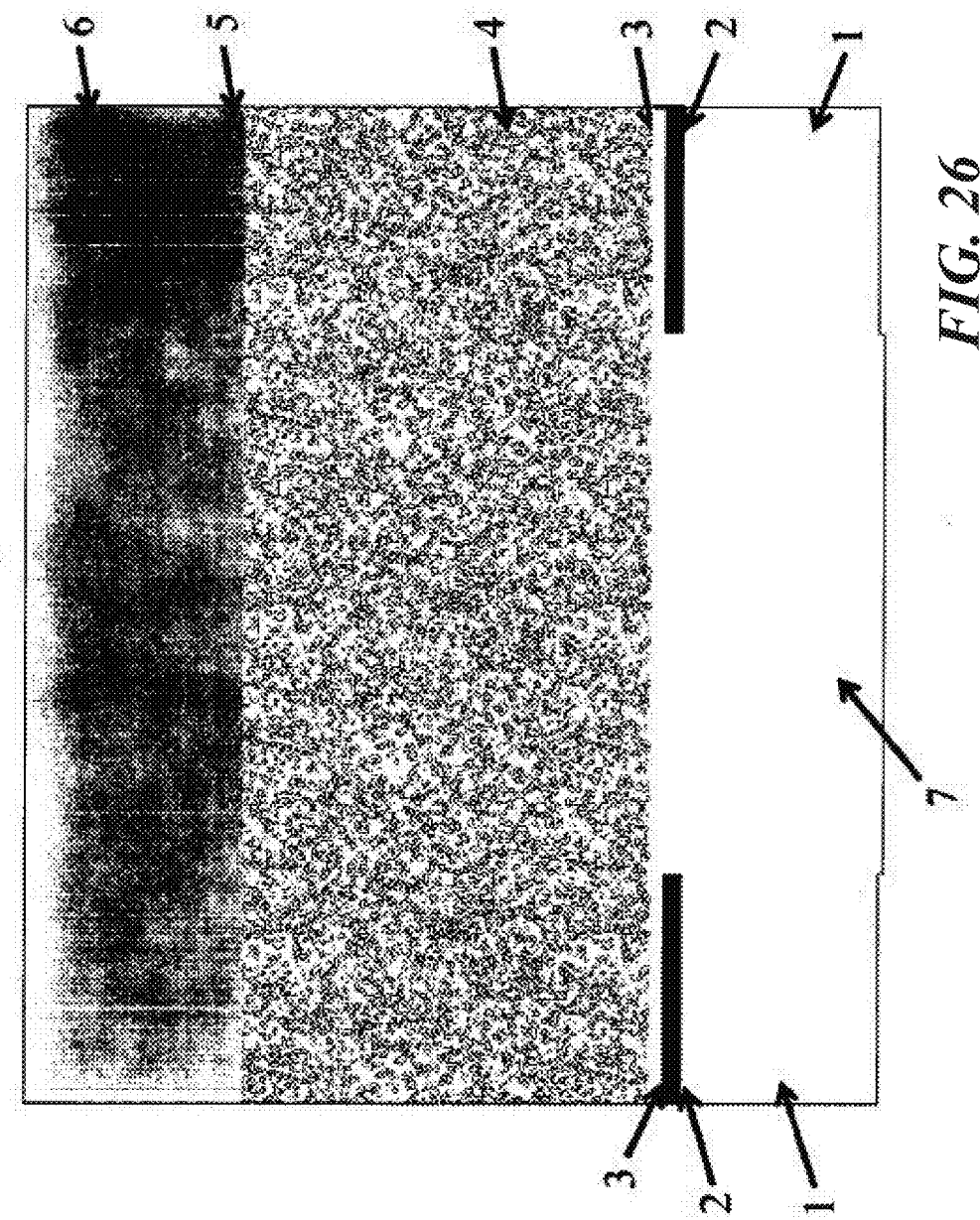
FIG. 26 shows a cross-section of the materials stack over a portion of a pixel, under an embodiment.

FIG. 26 shows a cross-section of the materials stack over a portion of a pixel. The figure depicts, in the left and right hand sides of the image, the same stack as in FIG. 25. In the lateral middle of the device is incorporated a discontinuity in the metal '1' which is replaced by material '7.' Material '7' may in general be an insulator such as SiO2 or SiOxNy. Embodiments of FIG. 26 may be referred as a portion of a lateral pixel. In embodiments, current may substantially flow between metals '1' through layers '2' (interface) and '3' (adhesion) and layer '4' (photosensitive layer).

Figure 27:
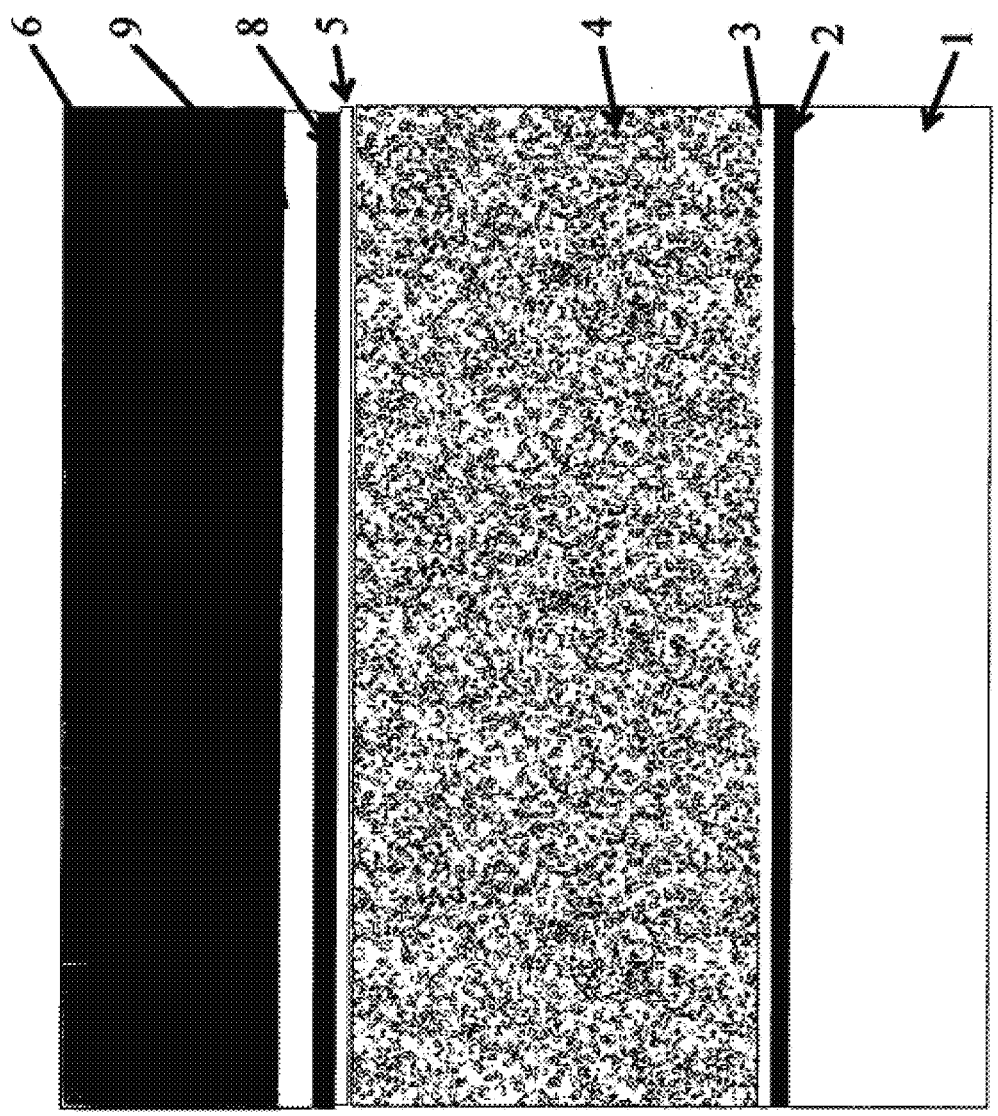
FIG. 27 shows a cross-section of the materials stack over a pixel, under an embodiment.

FIG. 27 shows a cross-section of the materials stack over a pixel. Embodiments of FIG. 27 may be referred to as a portion of a vertical pixel. The figure depicts in '1,' '2,' '3,' '4,' '5,' and '6' generally the same stack as in FIG. 25. On top of the device may be incorporated '8,' an interface layer. '8' may consist of a member or members of the sets of materials discussed below in layer '2' of FIG. 25. On top of the device may be incorporated '9,' a metal or contact layer, which may consist of a members or members of the sets of materials discussed below in layer '1' of FIG. 25. In embodiments, '9' may consist of a transparent conductive material such as indium tin oxide, tin oxide, or a thin (substantially nonabsorbing to visible light) metal such as TiN, Al, TaN, or other metals recited below under '1.'

"1" is the metal that lies above the substrate (not shown). This may be a silicon CMOS integrated circuit. During processing it may be a 200 mm or 300 mm wafer, i.e. a wafer that has not yet been singulated to form die. "1" refers to a metal, present at the top surface of the CMOS integrated circuit wafer, which is presented and available for physical, chemical, and electrical connection with subsequent layers. The metal may include: TiN, TiO2, TixNy, Al, Au, Pt, Ni, Pd, ITO, Cu, Ru, TiSi, WSi2, and combinations thereof. "1" is referred to as the contact, or the electrode, although it shall be discussed herein that the behavior of this contact is influenced by thin layers that may reside between the metal and "4," the quantum dot layer.

The metal may be chosen to achieve a particular work function, and may influence whether an ohmic or non-ohmic (e.g. Schottky) contact is formed with respect to the layers to which it is proximate. For example, the metal may be chosen to provide a shallow work function, such as a value generally between −2.0 eV and −4.5 eV, for example values lying between −2.0 eV and −4.2 eV.

The metal may achieve a surface roughness less than 5 nm root-mean-squared.

The metal may be patterned with a critical dimension of 0.18 micrometers or smaller. The metal may be patterned such that, pixel-to-pixel, the spacing of the electrodes (such as between a pixel center electrode and a grid) does not vary by more than a standard deviation of 1%.

The metal may be terminated with an oxide such as a native oxide—such as non-stoichiometric TiOxNy in the case of TiN. In general this oxide, or other materials atop it such as organic residues, inorganic residues such as 'polymer,' etc. are of a consistent and known composition thickness.

The metal may be a conductive material, where the bulk of the material constituting the metal may have a resistivity that is less than 100 microOhm*cm.

The metal may be processed such that, across the wafer, in all regions where light-sensing pixels are to be formed, it is not capped with any additional oxides or organics or contaminants.

The top surface of the wafer, prior to or after the formation of the interface layer, can comprise regions of metal and insulating material (such as an insulating oxide), such that the peak-to-valley distance of features on this surface is less than 50 nm.

Prior to the introduction of the photosensitive semiconductor layer, the leakage current flowing between a pixel electrode in the center of a 1.1×1.1 μm or 1.4×1.4 μm square grid electrode should be less than 0.1 fA at 3 V bias.

Layers above '1' form an interface, or interface layer. Each of the layers forming the interface is described in detail below, in turn.

The layer referred to as "2" is the first part or portion of the interface layer, and comprises a material that resides atop the metal. '2' may simply constitute a pure, clean surface of the metal. The material of this layer may include oxides, including those generally formed, either through exposure to water, oxygen, or other oxidizing species, as a result of the presence of the exposed metal; or it may be deliberately formed such as through exposure to a controlled oxidizing environment and exposures to elevated temperatures, such as in rapid thermal processing. Native oxides include, for example, the following: TiO2 and TiOxNy atop TiN; Al2O3 atop Al; Au2O3 atop Au; PtO or PtO2 on Pt; non-stoichiometric NiO atop Ni; WO3 atop W; PdO atop Pd; and oxygen-rich ITO atop ITO. It may be that such a native oxide is to be removed, such as using etching, and replaced with another layer. For example, a native oxide such as TiOxNy may be etched (using a process such as argon sputtering) and then a layer may be deposited on top of it such as a controlled oxide such as TiO2, TiOx, or TiOxNy. The sum of the thicknesses of native oxides and deliberately-deposited oxides may be between 2 and 20 nm.

A portion of '2' may be a material that is substantially transparent to most or all wavelengths of visible light. It may have a bandgap that is larger than 2 eV or larger than 2.5 eV or larger than 3 eV. It may be a large-bandgap doped semiconductor. It may achieve doping through stoichiometry, such as in the case of TiOx where x is varied below or above 2 in order to achieve net doping. Values of x may be typically 1.9 to achieve an excess of Ti over stoichiometric TiO2. Values of x may typically be 2.1 to achieve an excess of O over stoichiometric TiO2. TiOx where x<∼2 may be achieved by exposing stoichiometric TiO2 to a reducing environment. The density of free electrons may be increased, corresponding to greater n-type doping, by increase the extent to which initially stoichiometric TiO2 is reduced, i.e. by decreasing x in TiOx more considerably relative to the value 2. TiO2 may be doped with nitrogen in order to modify its free carrier concentration, work function, and electron affinity. TiO2 or TiOx may be doped with B, C, Co, Fe. It may be a mildly n-type material such as lightly doped TiOx having an equilibrium carrier density of 10^10 cm-3. It may be a moderately doped n-type material such as TiOx having an equilibrium carrier density of 10^16 cm-3. It may be a more strongly doped n-type material such as TiOx having an equilibrium carrier density of 10^18 or 10^19 cm-3. Its electron affinity may correspond energetically substantially closely with the work function of the metal. Its work function may correspond substantially closely with the work function of the metal. Its ionization potential may reside at an energy that is much deeper than the ionization potential of the optically-absorbing layer ('4' discussed below). It may be terminated through annealing processes, gas-phase treatments, or chemical treatments such as exposure to organic molecules, such as to achieve a low surface recombination velocity for holes when in contact with an adjacent semiconductor layer such as the optically-absorbing layer ('4' discussed below).

'3' may also be present in the interface layer, and comprises a material that may be positioned or reside atop the first portion of the interface layer. It may include adsorbed organics such as organic molecules, introduced deliberate or accidentally or through some combination thereof, that reside above the metal, either in direct contact with the metal, or in direct contact with the metal oxide. These molecules are discussed in detail herein.

In embodiments, '2' may be present, and '3' absent. Such embodiments include choices of materials in which no adhesion layer such as that provided by '3' is required. As an example, if '2' incorporates a metal such as titanium, such as if '2' incorporates TiOx, and if '4' incorporates a crosslinker such as mercaptobenzoic acid, in which one functional group on the mercaptobenzoic acid binds the TiOx, then adhesion between '4' and '2' can be provided without explicit inclusion of '3.'

In embodiments, all of '1' '2' and '3' may be present. Embodiments included cases where a Schottky contact is made via the metal '1' to the '4' without the deliberate introduction of a heterojunction. Embodiments included a device in which TiN or TiOxNy forms the metal '1', layer '2' is a clean termination of the metal '1,' with no significant formation of a native oxide, an adhesion layer such as hexamethyldisilazane is provided in '3'.

In embodiments, all of '1' '2' and '3' may be present. Embodiments include cases where a heterojunction is formed via the use of a large-bandgap oxide in '2' to the photosensitive layer '4.' Embodiments include a device in which TiN or TiOxNy forms the metal '1,' layer '2' includes a large-bandgap semiconductor such as TiOx (which may be structurally doped, impurity doped, both, or neither), and an adhesion layer such as hexamethyldisilazane may be provided in '3'.

In embodiments, '1' may be aluminum metal, '2' may include a native oxide of aluminum and may include a doped conductive oxide such as doped Al2O3 and/or may include a large-bandgap semiconductor such as TiOx (which may be structurally doped, impurity doped, both, or neither), and '3' may include an adhesion layer such as hexamethyldisilazane may be provided in '3'.

In embodiments, '1' may include aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, and gold. In embodiments, metals used in standard CMOS such as aluminum, tungsten, tantalum, titanium, copper may be preferred.

In embodiments, '2' may include a surface of the metal and may include oxides, nitrides, or oxynitrides of aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, and gold. In embodiments, it may be preferred that it include oxides, nitrides, or oxynitrides of metals used in standard CMOS such as aluminum, tungsten, tantalum, titanium, and copper.

In embodiments, '2' may consist of multiple sublayers. In embodiments, it may consist of a sublayer consisting of a metal such as aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it may be preferred that this sublayer may consist of metals used in standard CMOS such as aluminum, tungsten, tantalum, titanium, and copper. In embodiments, '2' may consist of a further sublayer consisting of oxides, nitrides, or oxynitrides of aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, and gold. In embodiments, it may be preferred that this further sublayer include oxides, nitrides, or oxynitrides of metals used in standard CMOS such as aluminum, tungsten, tantalum, titanium, and copper.

The layer referred to as '4' refers to an optically-absorbing layer that includes nanocrystals, or quantum dots. A quantum dot (QD), depicted in '1220' in FIG. 25, may be a nanostructure, for example a semiconductor nanostructure, that confines a conduction band electrons, valence band holes, or excitons (bound pairs of conduction band electrons and valence band holes) in all three spatial directions. The confinement can be due to electrostatic potentials (e.g., generated by external electrodes, doping, strain, impurities), the presence of an interface between different semiconductor materials (e.g., in core-shell nanocrystal systems, incorporated in '1221' of FIG. 25) or a semiconductor and another material (e.g., a semiconductor decorated by organic ligands; or by a dielectric such as an oxide such as PbO, a sulfite such as PbSO3, a sulfate such as PbSO4, or SiO2 incorporated in '1221' of FIG. 25), the presence of a semiconductor surface incorporated in '1221' of FIG. 25, or a combination of one or more of these. A quantum dot exhibits in its absorption spectrum the effects of the discrete quantized energy spectrum of an idealized zero-dimensional system. The wave functions that correspond to this discrete energy spectrum are substantially spatially localized within the quantum dot, but extend over many periods of the crystal lattice of the material. In one example embodiment, the QD may have a core of a semiconductor or compound semiconductor material, such as PbS. Ligands may be attached to some or all of the outer surface or may be removed in some embodiments. In some embodiments, the cores of adjacent QDs may be fused together to form a continuous film of nanocrystal material with nanoscale features. In other embodiments, cores may be connected to one another by linker molecules. In some embodiments, trap states may be formed on the outer surface of the nanocrystal material. In some example embodiments, the core may be PbS and trap states may be formed by an oxide such as PbSO3 formed on the outer surface of core.

A QD layer may include a continuous network of fused QD cores, having outer surfaces that are of a different composition than that in the core, e.g., oxidized core material such as PbSO3, or a different kind of semiconductor. The individual QD cores in the film are in intimate contact, but continue to exhibit many of the properties of individual quantum dots. For example, a lone (unfused) quantum dot has a well-characterized excitonic absorbance wavelength peak that arises from quantum effects related to its size, e.g., 1-10 nm. The excitonic absorbance wavelength peak of the fused QDs in the film is not significantly shifted from the central absorbance wavelength that was present prior to fusing. For example, the central absorbance wavelength may change by about 10% or less when fused. Thus, the QDs in the film retain their quantum effects, despite the fact that they may be an integral part of a macroscopic structure. In some embodiments, QD cores are linked by linker molecules as described further below. This allows current to flow more readily than through unlinked, unfused QDs. The use of linker molecules to form a continuous film of QDs instead of fusing the cores may reduce the dark current for some photoconductor and image sensor embodiments.

In some embodiments the QD layer is exceptionally radiation sensitive. This sensitivity is particularly useful for low-radiation imaging applications. At the same time, the gain of the device can be dynamically adjusted so that the QDPC saturates, that is, additional photons continue to provide additional useful information that can be discerned by the read-out electronic circuit. Tuning of gain can be conveniently achieved by changing the voltage bias, and thus the resultant electric field, across a given device, e.g., a pixel. Some embodiments of QD devices include a QD layer and a custom-designed or pre-fabricated electronic read-out integrated circuit. The QD layer is then formed directly onto the custom-designed or pre-fabricated electronic read-out integrated circuit. The QD layer may additionally be patterned so that it forms individual islands. In some embodiments, wherever the QD layer overlies the circuit, it continuously overlaps and contacts at least some of the features of the circuit. In some embodiments, if the QD layer overlies three-dimensional features of the circuit, the QD layer may conform to these features. In other words, there exists a substantially contiguous interface between the QD layer and the underlying electronic read-out integrated circuit. One or more electrodes in the circuit contact the QD layer and are capable of relaying information about the QD layer, e.g., an electronic signal related to the amount of radiation on the QD layer, to a readout circuit. The QD layer can be provided in a continuous manner to cover the entire underlying circuit, such as a readout circuit, or patterned. If the QD layer is provided in a continuous manner, the fill factor can approach about 100%, with patterning, the fill factor is reduced, but can still be much greater than a typical 35% for some example CMOS sensors that use silicon photodiodes. In many embodiments, the QD optical devices are readily fabricated using techniques available in a facility normally used to make conventional CMOS devices. For example, a layer of QDs can be solution-coated onto a pre-fabricated electronic read-out circuit using, e.g., spin-coating, which is a standard CMOS process, and optionally further processed with other CMOS-compatible techniques to provide the final QD layer for use in the device. Because the QD layer need not require exotic or difficult techniques to fabricate, but can instead be made using standard CMOS processes, the QD optical devices can be made in high volumes, and with no significant increase in capital cost (other than materials) over current CMOS process steps.

The QD material may have an absorption cutoff approximately at the edge of the visible, such as round 650 nm. The QD material may have an absorption cutoff at longer wavelengths, in order to ensure a high absorbance over the entire visible, such as when the absorption cutoff is in the 700-900 nm range.

The QD film may be deposited using conventional spin-on process, ink-jet printing process, Langmuir-Blodgett film deposition, electrokinetic sprays, or nano-imprint. The QD film may be deposited using dispensing of QD solution on a wafer at 30 RPM followed by three-step spin process.

The spectral position of the peak in the QD solution absorption may be specified to lie at 740 nm, +/−10 nm. The ratio of the absorbance at the QD absorption peak near 740 nm, and the valley slightly to the blue of this peak, may be specified to be 1.2.

The thickness of the quantum dot layer may be specified to be 300 nm +/−50 nm. The thickness of the quantum dot layer may be chosen to ensure that, over the spectral range 400-640 nm, greater than 90% of all light incident on the film is absorbed. The roughness (root-mean-squared) of the quantum dot film may be specified to be less than 5 nm.

The dark current in a 1.1×1.1 µm pixel may be required to be less than 0.5 fA under suitable bias, such as a 3V bias. The gain may be required to be greater than 10 in a 1.1×1.1 µm pixel.

It may be required that alkali metal impurities be present at lower than 5E17 cm-3 concentration in the quantum dot film. It may be required that defects greater than 0.16 microns in size be fewer than 20 across a 200 mm wafer. It may be required that the mobility of the flowing carrier exceed 1E-5 cm2/Vs. It may be required that the loading fraction of nanocrystals in the film exceed 30% by volume.

Incorporated into '4' may be chemical species such as PbO, PbSO4, PbSO3, poly-sulfates; and they may also include physically-adsorbed species such as O2, N2, Ar, H2, CO2, H2O, and H2S.

Incorporated into '4' may be molecules that are bound to the surface of at least one nanoparticle, or nanocrystal, or quantum dot. These may include thiol-terminated ligands such as benzenethiol, ethanethiol, hexanethiol, dodecanethiol or simply monothiols; carboxylate-terminated molecules such as oleic acid and formic acid; amine-terminated ligands such as pyridine, butylamine, octylamine. They may also include bidentate crosslinkers such as benzenedithiol, ethanedithiol, and butanedithiol. They may also include multidentate molecules that include (1) a backbone (2) certain sidegroups and/or endgroups that bind to the nanoparticle surface, including thiols, amines, carboxylates; and (3) other functional groups such as those that confer solubility in polar, nonpolar, and partially polar solvents.

'5' may include layers on top of '4' that may provide passivation of the underlying material, including minimizing the extent of movement of species between layers '1'-'4' of the materials stack and the outside of the materials stack. This layer may also facilitate good physical adhesion with overlying layers such as encapsulant layers.

'6' refers to a layer, or layers, that may be included on top of the material stack and may serve to minimize the extent of movement of species between layers '1'-'4' of the materials stack and the outside of the materials stack. In a planar cell configuration the quantum dot film layer may be encapsulated against oxygen and moisture diffusion using a low-temperature (less than 100° C.) PECVD SiO2, SiN, or SiOCN process providing optically transparent film suitable for further integration with CFA. The film may be specified to have a thickness of 200 nm+/−10 nm. It may be specified to have a surface roughness less than 5 nm rms. It may be required to have optical transmittance exceeding 99%. It will be required to provide adhesion to the underlying layers. It may be required to have fewer than twenty greater-than-0.1-um particle defects across a 200 mm wafer. It may be required to have fewer than twenty greater-than-0.1-um pinholes across a 200 mm wafer.

The nature of the interface between the electrical contact and the light-sensitive semiconductor is an important determinant of device stability and performance. For example, whether the contact is ohmic vs. Schottky, and whether the contact and semiconductor are separated by a thin interfacial layer which passivates at least one of the {semiconductor and the contact}, are important in stability and performance.

The composition of the light sensing layer—for example the presence of surface trap states on the semiconductor materials making up the layer—is an important determinant of device performance and stability. In particular, such materials are often sensitive to the presence of physisorbed or chemisorbed species, possibly originally presented as a gas (such as O2, H2O, CO2), on the nanoparticle surfaces—these must thus be carefully controlled during processing, and an encapsulating and/or passivating layer(s) can be used, above and/or below, the optically sensitive layer, to preserve consistent photodetection features over time. Further description follows of the interface between metal and semiconductor of an embodiment as well as encapsulation of an embodiment.

The layer '4' may be made from silicon, including single-crystal silicon, polycrystalline silicon, nanocrystalline silicon, or amorphous silicon including hydrogenated amorphous silicon.

The layer '4' may include materials that are not substantially quantum-confined, but instead substantially retain the bandgap of a bulk semiconductor. Embodiments include crystalline or polycrystalline or nanocrystalline or amorphous embodiments of materials such as silicon, gallium arsenide, carbon, PbS, PbSe, PbTe, Bi2S3, In2S3, Copper-Indium-Gallium-Selenide (or Sulfide), SnS, SnSe, SnTe, in which the characteristic size of any crystalline or partially-crystalline subunits is typically not smaller than the Bohr exciton radius (the characteristic spatial extent of electron-hold pairs) in the semiconductor material employed.

The interface formation of an embodiment can comprise the cleaning and termination of '1'.

The interface of an embodiment can comprise an oxide formed on '1', including a native oxide as a part of '2'. The thickness of this oxide is an important determinant of device performance. Excessive oxide thicknesses (e.g., thickness exceeding 10-20 nm) may provide an excessive contact resistance in series with the film, necessitating the application of an undesirably increased bias c/o the biasing circuit. In embodiments, the thickness of this native oxide is kept in the range of less than 5 nm.

The interface of an embodiment can comprise a further thin layer as part of '2', such as TiO2, generally included to modify the work function of the interface with the semiconductor to be placed on top. This layer may, in embodiments, provide selectivity in favor of one type of charge carrier: for example, TiO2 may be configured such that, at the operating bias, it efficiently injects electrons into the conduction band of the semiconducting layer; but, at this same bias, it withdraws holes from the valence band of the semiconducting layer with much lower effectiveness. TiO2 may be configured such that, at the operating bias, it efficiently extracts electrons from the conduction band of the semiconducting layer; but, at this same bias, it injects holes into the valence band of the semiconducting layer with much lower effectiveness.

The interface of an embodiment can comprise a further thin layer as part of '2', such as MEH-PPV, generally included to enable the flow of one type of charge carriers, such as holes, while blocking the flow of the other type, such as electrons.

The interface of an embodiment can comprise a thin layer as part of '3', possibly a self-organized molecular monolayer, designed to anchor on one side of the molecules to the underlying layers, and at the other terminus of the molecule to anchor to the semiconductor to be placed atop, with the goal of ensuring controlled electronic communication, and also ensuring mechanical stability, e.g., good adhesion between the materials making up the multilayer device.

The layered structure of an embodiment provides efficient charge carrier transfer through an interface. In embodiments, the layered structure may form a substantially ohmic contact with the semiconductor layer, providing for little or no depletion of the semiconductor near the interface, and providing for efficient injection and extraction of at least one type (e.g. electrons, holes) of charge carrier. In embodiments, the layered structure may form a Schottky contact with the semiconductor layer, providing an energetic barrier that must be overcome for charge carriers to be injected and/or withdrawn. In embodiments, the layered structure may form a selective contact, providing considerably more efficient injection of one type of charge carrier (e.g. electrons) than it provides extraction of the other type (e.g. holes); and/or providing considerably more efficient withdrawal of one type of charge carrier (e.g. electrons) than it provides injection of the other type (e.g. holes).

The layered structure of an embodiment provides a work function of the contact surface where the effective workfunction is determined by the material of the electrode, material of the interfacial layer, and its thickness.

The layered structure of an embodiment provides blocking capability to suppress the undesirable carrier transfer, for example as a layer proving electron trap states on the surface of metal electrode in case of p-semiconductor photodetector device.

The layered structure of an embodiment provides strong bonding of the photosensitive semiconductor material to the metal electrode.

The layered structure of an embodiment provides high temperature stability of the metal electrode-semiconductor material interface.

The structure and composition of electronic devices of an embodiment with an engineered interfacial layer includes but is not limited to a metal electrode comprising a conventional material used in semiconductor manufacturing being either readily oxidized, or nitridized, or both in a chosen stoichiometric combination, such as Ti, W, Ta, Hf, Al, Cu, Cr, Ag; or being resistive to oxidation or nitridization such as Au, Pt, Rh, Ir, Ru, graphite, amorphous carbon, graphene, or carbon nanotubes. These metal electrodes can also be formed from alloys, conductive glasses, and various conductive intermetallics. The work function of the resultant electrodes can be tuned through exposure to oxygen, nitrogen, or a combination thereof at a specific temperature for a specific time.

The structure and composition of electronic devices of an embodiment includes an interfacial layer on the surface of the metal contact. The interfacial layer of an embodiment includes an oxide or intermetallic of the element of the electrode with the maximum thickness sufficient to keep the ohmic characteristics of the contact but with the minimum thickness sufficient to create electron trap states. The structure can be created using PVD (physical vapor deposition), ALD (atomic layer deposition), CVD (chemical vapor deposition), ion cluster, ion beam deposition, ion implantation, anneal or other this film deposition method. Additionally, such films can be formed from aqueous and non-aqueous liquid formulations, which may include electrochemical techniques, to form hydroxides, oxides, fluorides, sulfides, (bi)sulfates, (bi)sulfites, sulphonates, phosphates, phosphonates, phosphides, nitrates, nitrites, nitrides, carbonates, carbides, and other types of salts or complexes of the said metals. The average thickness of the interfacial layer can vary from a 0.1 nm-0.2 nm to 10 nm-50 nm depending on conductivity of the final interfacial layer, and work function of the metal electrode itself.

The interfacial layer of an embodiment includes another oxide deposited on the surface of the electrode, said oxide been doped $TiO2$, $HfO2$, $Al2O3$, $SiO2$, $Ta2O5$, $Zn_xAl_yO$, $Zn_xGa_yO$, $ZnIn_xSn_yO$, and similar p-conductive materials. Again, these materials can be deposited using the methods mentioned earlier.

Additional properties of the interfacial layer are determined by the necessity to form relatively strong chemical bond, preferably covalent, to the components of the semiconductor photosensitive layer. In case none of the components of the photosensitive layer provide chemical bonding to the interfacial layer the surface of the interfacial layer is modified using organic by-functional molecules, where one type of functional group provides selective bonding to the interfacial layer surface, while the second type of functional groups provides bonding to either ligand or directly to semiconductor nanocrystals. These bonding molecules can be formed on non-conductive alkane or aryl backbone or can be formed on conductive backbone including aniline, acytelene, or other types of sp2 hybridized carbon. The functional groups to provide bonding to the oxidized surface of the electrode or surface of the interfacial layer include but are not limited to silanes, siloxanes, silizanes, primary, secondary, or tertiary amines, imides, phosphates, phosphines, bifunctional thiols, phosphonic acids, oximes, carboxylates. The average length of the organic molecule forming the interfacial layer can typically vary from 2 to 16 carbon atoms.

If the metal of the electrode is passive (Au, Pt, Cu, Ag, and such) the interfacial layer can be formed from a molecule including two similar functional groups providing bonding directly to the metal surface on one side and to a nanocrystal on another side. An example would be formation of Au—S—R—S—NC bond. Again, thickness and conductivity of the organic interfacial layer defined by the required electronic device properties.

If the conductivity of the interfacial layer is exceeding the allowable limits required be the electronic device parameters (for planar electrode element) the continuous film can be patterned using conventional patterning techniques.

In each electronic device with at least two electrodes one of the electrodes can be made of a metal with one work function while another electrode can made having a different work-function and/or type of conductivity (electron or hole).

For a vertical configuration of electronic device the same approach as above is used for the bottom electrode while the interfacial layer on top is formed by deposition of organic molecules or a thin transparent layer of the semiconductor material.

Molecules described above are polymers with the degree of polymerization from approximately 1 through approximately 10,000.

In forming a device described herein, generally, the device can be formed to include a consistent, reliable combination of '1' and '2' which can be followed by the controlled formation '3' and the optically-absorbing layer '4'. For example, an embodiment can provide through '1' a highly conductive contact having resistivity less than 100 microOhm*cm and a work function lying between −2 eV and −4.5 V and lying between −2 eV and −4.2 eV. An embodiment can provide through '2' a large-bandgap layer that permits the injection of electrons into the ensuing photosensitive semiconductor layer, but blocks the extraction of holes from this layer. ONE OPTION FOR TIOX SPEC An embodiment can achieve a controlled thickness of a doped substantially transparent oxide, such as n-type TiOx, as part of the first part of '2'. For example, an embodiment can achieve a TiOx thickness in the range 2-20 which is controlled to within 1-5 nm; and where the TiOx has a specifically-chosen carrier density of $1\times10^{18}$ cm-3 with a tight band of control such as +/−10% in carrier density.

Manufacturing of a stack or configuration of layers of the device described herein can comprise: (1) formation of the metal, such as via the sputtering of titanium in a nitrogen atmosphere, resulting in the formation of TiN; (2) subsequent processing that results in the formation of an interface layer such as a native oxide, such as TiOxNy or TiOx (it may be that this subsequent processing results in range of possible oxide thicknesses and dopings and carrier concentrations); (3) removal of the native oxide layer through an etch such as a sulfuric acid—hydrogen peroxide—deionized water etch, or an ammonium peroxide etch, or a physical etch such as argon sputtering, or a reactive sputter etch such as argon and hydrogen; in an embodiment this etch completely removes the oxide; a modest overetch to ensure complete removal may be implemented; (4) an embodiment deposits a controlled thickness, controlled doping, and controlled-surface-terminated layer of an oxide such as TiOx, TiOxNy, or other interface layer. Methods such as physical vapor deposition (including DC sputtering, RF sputtering, of a TiOx source, a TiN source, or a Ti source, in the presence of O2, N2, or a combination thereof) may be employed to deposit these layers. Methods also include CVD and ALD where a precursor is first deposited on the surface of the wafer, and a reaction proceeds at a controlled temperature. In cases where TiOx is to be formed, precursors may be employed.

Manufacturing of a stack or configuration of layers of the device described herein can comprise: (1) Formation of the metal, such as via the sputtering of titanium in a nitrogen atmosphere, resulting in the formation of TiN; (2) In-situ transitioning to the deposition on top of this metal of an interface layer. These may include TiOx or TiOxNy. This layer may possess a controlled thickness, controlled doping, and controlled-surface-terminated layer of an oxide such as TiOx, TiOxNy, or other interface layer. Methods such as physical vapor deposition (including DC sputtering, RF sputtering, of a TiOx source, a TiN source, or a Ti source, in the presence of O2, N2, or a combination thereof) may be employed to deposit these layers. Methods also include CVD and ALD where a precursor is first deposited on the surface of the wafer, and a reaction proceeds at a controlled temperature. In cases where TiOx is to be formed chemical precursors may be employed.

As described above, an encapsulating and/or passivating layer(s) can be used, above and/or below, the layer, to preserve consistent features over time. The embodiments described herein ensure a consistent gas environment (or lack of significant presence of a gas) in the layer. For example, vacuum, Argon, Nitrogen, Oxygen, Hydrogen, Carbon Dioxide, can be included or excluded, in various proportions and to various degrees. Embodiments may exclude Oxygen, H2O, CO2, and include only either the absence of gas molecules, or nonreactive materials such as Argon and/or Nitrogen. To preserve consistent features over time, an encapsulant layer may be included whose purpose is to avoid gas exchange between the film and the region exterior to this film. Materials employed in an embodiment for this purpose include but are not limited to: polyxylylene; As2S3 or As2Se3; Si3N4, SiO2, and mixtures thereof, that is SiOxNy; oxides such as TiO2, HfO2, Al2O3, SiO2, Ta2O5, ZnxAlyO, ZnxGayO, and ZnInxSny.

The encapsulant material may be preceded by a passivation layer, potentially in the form of a substantially single molecular monolayer. This first layer may serve to protect the encapsulated structure during the deposition of the encapsulant: for example, a layer of a material such as polyxylylene may first be deposited, using a procedure that does not deleteriously alter the optoelectronic behavior of the layer, and providing protection of the layer during ensuing encapsulation processes. It may, for example, protect the film from reactions resultant from oxygen and its radicals that are present during certain processes employed in the deposition of oxygen-containing encapsulants such as SiOx, SiOxNy, etc.

In embodiments, typical thicknesses of the total encapsulant stack (which may consist of multiple layers) may range from a single monolayer (typically~nm or slightly sub-nm e.g. 5 A) to typically 1 micrometer. In embodiments, typical thicknesses of the total encapsulant stack may be desired to be less than 1-2 micrometers in order to perturb minimally the optical properties of the array.

In embodiments, included in at least one of the layers '1' '2' '3' '4' '5' may be materials that serve to getter molecules that could react with materials in the device, including materials which, if reacted, could alter the photoelectrical properties of the device. Examples of reactive molecules that could enter the device include O2 and H2O and O3. Examples of materials in the device that could have their photoelectrical properties altered by such reactions include '4' NC, '3' adhesion, '2' interface, and '1' metal. Examples of gettering moieties include borazons, borohydrides including tetrahydroborates, catecholborane, L-selectride, lithium borohydride, lithium triethylborohydride, sodium borohydride, and uranium borohydride. Examples of gettering moieties include hydrolysable siloxanes.

The devices of an embodiment can include a strong chemical bond (e.g., covalent), to the components of the semiconductor photosensitive layer. In case none of the components of the photosensitive layer provide chemical bonding to the interfacial layer the surface of the interfacial layer is modified using organic bi-functional molecules, where one type of functional group provides selective bonding to the interfacial layer surface, while the second type of functional group provides bonding to either ligand or directly to semiconductor nanocrystals. These bonding molecules can be formed on non-conductive alkane or aryl backbone or can be formed on conductive backbone including aniline, acytelene, or other types of sp2 hybridized carbon. The functional groups to provide bonding to the oxide can include silanes, siloxanes, silizanes, primary, secondary, or tertiary amines, imides, phosphates, oximes, carboxylates.

Manufacturing processes of the devices of an embodiment may include a wafer pre-clean using SC1 of 30 second duration and at 20° C. in a clean dry air ambient. Manufacturing processes of the devices of an embodiment may include a rinse in de-ionized water of 30 second duration at 20° C. in a clean dry air ambient. Manufacturing processes of the devices of an embodiment may include drying the wafer involving a bake for a prescribed period of time (such as 30 seconds-24 hours) at a prescribed temperature (such as 20° C., 70° C., 150° C., or 200° C.) in a prescribed environment (such as clean dry air, vacuum, nitrogen, argon, or a reducing atmosphere such as hydrogen, or a controlled oxidizing atmosphere containing an inert gas such as N2 or Ar and an oxidizing gas such as O2).

Manufacturing processes of the devices of an embodiment may include the stipulation of maximum and minimum and average queue times in between other processes.

Manufacturing processes of the devices of an embodiment may include treatments of substrates and quantum dot films including exposure to ethanedithiol in acetonitrile at a prescribed temperature, such as 25° C., for a prescribed time, such as 20 seconds, in a prescribed atmosphere, such as N2. Manufacturing processes of the devices of an embodiment may include treatments of substrates and quantum dot films including exposure to hexanedithiol in acetonitrile at a prescribed temperature, such as 25° C., for a prescribed time, such as 20 seconds, in a prescribed atmosphere, such as N2.

Manufacturing processes of the devices of an embodiment may include the deposition of a dielectric capping layer, such as SiO2, at or beneath a certain temperature, such as 100° C., and to a specified thickness of dielectric capping layer such as 100° C.

Manufacturing processes of the devices of an embodiment may include lithographic definition of areas to be etched, followed by etching of materials, including SiO2.

Manufacturing processes of the devices of an embodiment may include the deposition of a dielectric capping layer, such as SiN, at or beneath a certain temperature, such as 100° C., and to a specified thickness of dielectric capping layer such as 100° C.

Manufacturing processes of the devices of an embodiment may include lithographic definition of areas to be etched, followed by etching of materials, including SiN.

Manufacturing processes of the devices of an embodiment may include silicon CMOS manufacturing including processing on 200 mm Si wafers and a standard Al/SiO2 material technology at 0.11 micron nodes prior to deposition of the quantum dot layer. The CMOS manufacturing flow may be completed with a patterned metal contact such as TiN.

Manufacturing processes of the devices of an embodiment may include integration of one Cu/TEOS/SiN HM single damascene layer on top of a via layer followed by selective electroless deposition of Ni/Au stack.

Manufacturing processes of the devices of an embodiment may include substrate pre-treatment. Metal electrode and/or dielectric surface modification might be required to improve electrical contact or adhesion between the layers. Instead of wet preclean the wafer might be treated by plasma or by a liquid-phase or vapor-phase process to form adhesion monolayers with controlled barrier height and density of surface states.

Manufacturing processes of the devices of an embodiment may include the deposition of photosensitive films in which tight control over the ambient atmosphere is provided to minimize and/or control the impact of oxygen and moisture on film performance. They may include the use of production tools equipped with O2 and H2O process monitors. Standard operating procedures may be provided that ensure minimal, or controlled and consistent, exposure of materials (such as quantum dots and layers thereof) to air, including during chemical storage, and transfer of fluids from storage containers to process tool tanks. Manufacturing processes may be required to be compatible with chloroform and other solvents.

Manufacturing processes of the devices of an embodiment may include stabilizing the layer of quantum dots. These may include chemical post-treatment using diluted solutions of dithiols in acetonitrile.

Due to high sensitivity of QF to oxygen and moisture in ambient the queue time between QF deposition and post-treatments should be minimized and be done under N2 blanket. The same conditions apply to the queue time between post-treatment B and dielectric cap deposition.

Manufacturing processes of the devices of an embodiment may include the sealing of the QF film from oxygen and moisture diffusion during the lifetime of the device. Low-temperature deposition of SiO2/SiN stack may be employed. Such processes should be performed at a substrate temperature below 100° C. and at atmospheric pressure or at as high pressure as possible. Other process options may include low-temperature spin-on glass processes or ultra-thin metallic films which will not affect optical transmittance of the capping layers.

Process controls of the devices of an embodiment may include incoming wafer inspection prior to quantum dot film deposition. Inspection steps of an embodiment include: a) inspection for defect density, such as using bright field inspection; b) metal electrode work function inspection, such as using Ultraviolet Photoelectron Spectroscopy (UPS) (the UPS method process control procedure may be performed on blanket process monitor wafers); c) leakage current and dielectric voltage breakdown to be performed on TLM (test pixel array) structures. The photoelectric response of devices and film properties may be employed as part of a process control.

In embodiments, '4' layer may include a material having a bandgap, and providing for the absorption of light within a range of wavelengths of interest. In embodiments the photosensitive layer may include materials such as Si, PbS, PbSe, CdS, CdSe, GaAs, InP, InAs, PbTe, CdTe, Ge, In2S3, Bi2S3, and combinations thereof. In embodiments the photosensitive layer may include strongly light-absorbing materials such as porphyrins. In embodiments, the photosensitive layer may include passivating organic ligands such as ethanethiol, ethanedithiol, benzenethiol, benzenedithiol, 1,2,4,5-benzenetetrathiol, dibenzenedithiol, pyridine, butylamine.

In embodiments, the photodetectors of an embodiment include photosensitive devices that employ a light-sensitive energetic barrier controlling the flow of at least one type of charge carrier.

In embodiments, the photodetectors may exhibit gain, wherein the ratio of the number of additional units of charge flowing each second to the number of photons impinging on a device each second may exceed unity, for example values lying in the approximately range 2-60.

In embodiments, the photodetectors may exhibit a high normalized response, that is to say, a high ratio of photocurrent to dark current even at low light levels. For example, when 150 nW/cm2 of visible light impinge on the photodetectors, the ratio of photocurrent to light current may exceed 20. In general this value should be as high as possible (while fulfilling other specifications, such as on lag and dark current uniformity and photoresponse uniformity). Values as high as 100 and greater are possible for the normalized response at 150 nW/cm2.

In embodiments, the photodetectors may exhibit a rapid temporal response, with the photocurrent (including following intense illumination, such as 1 μW/cm2 on pixel and greater) settling to a value close to the dark current (such as one least-significant-bit from the dark current) within less than 1 second. Ideally the photocurrent settles to this value within one exposure period, which may be ⅕ s, ⅓₀ s, ½₀₀ s, ⅟₁₀₀₀ s, or similar.

In embodiments, the current-voltage characteristic in the dark may exhibit, between zero and a first voltage, known as the saturation voltage, a monotonically increasing functional relationship. This range may be referred to as the turn-on phase. The current-voltage may exhibit, between the first voltage and a second, larger, voltage, known as the reach-through voltage, a monotonically increasing relationship having a lower average slope than during the zero-to-first-voltage range. This first-to-second-voltage range may be referred to as the saturation range. At voltages greater than the second, or reach-through, voltage, the current-voltage relationship may exhibit an increase in slope relative to the first-voltage-to-second-voltage range. This highest-voltage range may be termed the post-reach-through range.

In embodiments, gain may be achieved when, under bias, the time for the flowing charge carrier (for example, electrons) to transit the device (IE the time to travel between two contacts, such as between leftside-'1' and rightside-'1' in FIG. 26, or the time to travel between '1' and '9' in FIG. 27) exceeds the average lifetime of that charge carrier, when the contact that injects the flowing charge carrier (for example, electrons) also prevents the extraction of the other type of charge carrier, which may be termed the blocked carrier (for example, holes), and when the interface between the contact that provides the flowing charge carrier (for example electrons) and the semiconductor film provides a low surface recombination velocity for the blocked carrier (e.g., holes). This interface may be embodied in '2' and '3' in FIG. 25, '2' and '3' in FIG. 26 and also '7' and '3' in FIG. 26, and '2' and '3' and '5' and '8' in FIG. 27.

More particularly, gain may be achieved when, under bias, the time for the flowing charge carrier (for example, electrons) to transit the device exceeds the average lifetime of that charge carrier. Quantitatively, it may be said that the base transport factor, alpha_t, is less than but close to unity. This may be achieved if the minority carrier diffusion length for the flowing carrier exceeds the separation between the interface layers.

Furthermore, gain may be achieved when, under bias, the contact that injects the flowing charge carrier (for example, electrons) also prevents the extraction of the other type of charge carrier, which may be termed the blocked carrier (for example, holes). Quantitatively, it may be said that the emitter injection efficiency, gamma, is less than but close to unity. This may be achieved by using an interface layer near the flowing-carrier-injecting contact that blocks the extraction of the other type of charge carrier. This may be achieved by making the interface layer from a large-bandgap material in which one band (such as the conduction band) is substantially closely aligned in energy with the work function of the metal contact with which it is proximate; and which is substantially misaligned in energy with the band in the semiconductor from which it is to block the extraction of charge carriers.

Moreover, gain may be achieved when, under bias, the interface between the contact that provides the flowing charge carrier (for example electrons) and the semiconductor film provides a low surface recombination velocity for the blocked carrier (e.g., holes). Quantitatively, it may be said that the recombination factor is less than, but close to, unity. This may be achieved if, within the minority carrier lifetime of the flowing carrier (e.g., electrons), only a small fraction of the blocked-carrier (e.g., holes) recombine near the interface between the contact that provides the flowing charge carrier (for example electrons) and the semiconductor film. This may require that the surface recombination velocity for the blocked carrier be less than 0.1 cm/s, for example 0.01 cm/s or less.

Referring to FIG. 26, embodiments may include methods and structures taken to reduce the dark current passing between leftmost '1' and rightmost '1'. Embodiments may include the removal of conductive moieties in the portion of '3' that reside between the contacts leftmost '1' and rightmost '1.' Embodiments may include the removal of conductive moieties such as metal oxides, metal hydroxides, organic contamination, polymer, conductive oxides that reside between the contacts leftmost '1' and rightmost '1.' Referring to FIG. 26, embodiments may include the modification of the interface between '7' and '4' in order to control the recombination rate, the trapped charge, the adhesion, or a plurality of such properties at this interface.

Referring to FIG. 25, embodiments include controlling surface states such as those present in interface layers '2' and '3.' Embodiments include striking a metal such as TiN in '1' or a metal hydroxide such as TiOx in '2' with xenon or other species or employing argon sputtering in order to control or modify the recombination rate on the surface. Embodiments may include reducing the surface recombination velocity for charge carriers of one type to less than 0.1 cm/s or to less than 0.01 cm/2 at this interface.

Embodiments include the realization of small pixels with a pixel pitch of 0.9 μm in each lateral dimension. Embodiments include the use of narrow vias such as 0.15 um. Embodiments include the use of metal-to-metal spacings of 0.14 um.

The materials and devices making up image sensors are required to return rapidly to their dark current levels following illumination, including in cases when the sensors are illuminated by intense light.

In devices that include electronic traps, such as traps arising due to the presence of impurities incorporated into light-sensing films, the recovery following intense illumination may—if not otherwise remedied—extend to long timescales such as 1 second, 10 seconds, 100 seconds, or even longer.

It is therefore important to provide for the reduction or removal, and/or the passivation, of impurities and/or electronic traps that lead to such extended persistence in observed electronic signal.

In addition, in certain embodiments it may be important in certain manufacturing flows for the integrated circuit, including the optically sensitive layer, to withstand temperatures such as 150° C., 180° C., 220° C., 260° C., or 300° C., for durations of time including greater than 10 seconds, greater than 30 seconds, greater than 60 seconds, greater than 3 minutes, greater than 30 minutes, greater than 100 minutes, greater than 120 minutes. Embodiments include incorporating, into the final form of the optically sensitive layer, only materials that can withstand the aforementioned temperature and time combinations. Embodiments include incorporating, into the final form of the optically sensitive layer, materials that, following the aforementioned temperature and time combinations, produce sensitive detection of light levels of interest in imaging.

Embodiments include purifying the materials making up the light-sensing film in order to reduce the concentration of impurities and/or electronic traps to an acceptable concentration from the point of view of persistence following high-light illumination Embodiments include purifying the materials making up the light-sensing film to reduce the concentration of impurities to consist of less than 10% of the non-light-absorbing (a.k.a. matrix) material making up the light-sensing medium.

Embodiments include purifying the materials making up the light-sensing film to reduce the concentration of impurities to consist of less than 2% of the non-light-absorbing (a.k.a. matrix) material making up the light-sensing medium.

Embodiments include purifying the materials making up the light-sensing film to reduce the concentration of impurities to consist of less than 0.5% of the non-light-absorbing (a.k.a. matrix) material making up the light-sensing medium.

Embodiments include minimizing the incorporation of oxygen, water, or oxides and hydrates of materials composing the light-sensing layer.

Embodiments include incorporating a material, which may be referred to as a passivant, that occupies the impurities and/or species that produce the electronic traps. Embodiments include image sensors having lowered and/or acceptable temporal responses, including following illumination with intense light that incorporate such passivant materials.

Embodiments include employing a passivant such as a metal-based salt or salt complex during film processing.

Embodiments include employing a silver (I)-based salt during film processing to remove the memory effect/burn.

Embodiments include for example employing 10 mg of AgPF6 (silver hexafluorophosphate) and dispersing it in a solvent, performing the operation within a controlled atmosphere such as a glovebox. Embodiments include using 20 mL of Acetonitrile (ACN). Embodiments include vortexing for 30 seconds and then removing 1 mL and further diluting to 10 mL total volume by adding another 9 mL of acetonitrile to afford a 5% (w/v) solution of AgPF6 in ACN. Embodiments include using this solution in a layer-by-layer spin-coat process to fabricate a quantum-dot film based imaging sensor using the following sequence of processes:
30 repetitions of:

> [PbS quantum dots in octane/AgPF6 in ACN (5 secs delay before spin)/1,4-benzenedithiol in ACN (5 seconds delay before spin)/ACN/Octane]+NC+ 0.01% Ethanethiol in ACN (30 secs delay before spin) {bake for 30 mins at 115° C.}

Embodiments include employing salts of multivalent metals such as Cu, Zn, Sn, Hg, and Pb.

Embodiments include employing metal salts and complexes where a passivant is an anion.

Embodiments include employing salts soluble in polar protic solvents such as water, methanol, ethanol, propanol, butanol, and polar aprotic solvents such as acetone, acetonitrile, benzonitrile, dichloromethane, halobenzenes, dimethylformamide, dimethyl sulfoxide, and tetrahydrofuran.

In embodiments, the electrical biasing scheme of the light-sensing film may be employed to reduce the effect of persistence of signal following illumination with intense light.

Figure 16:
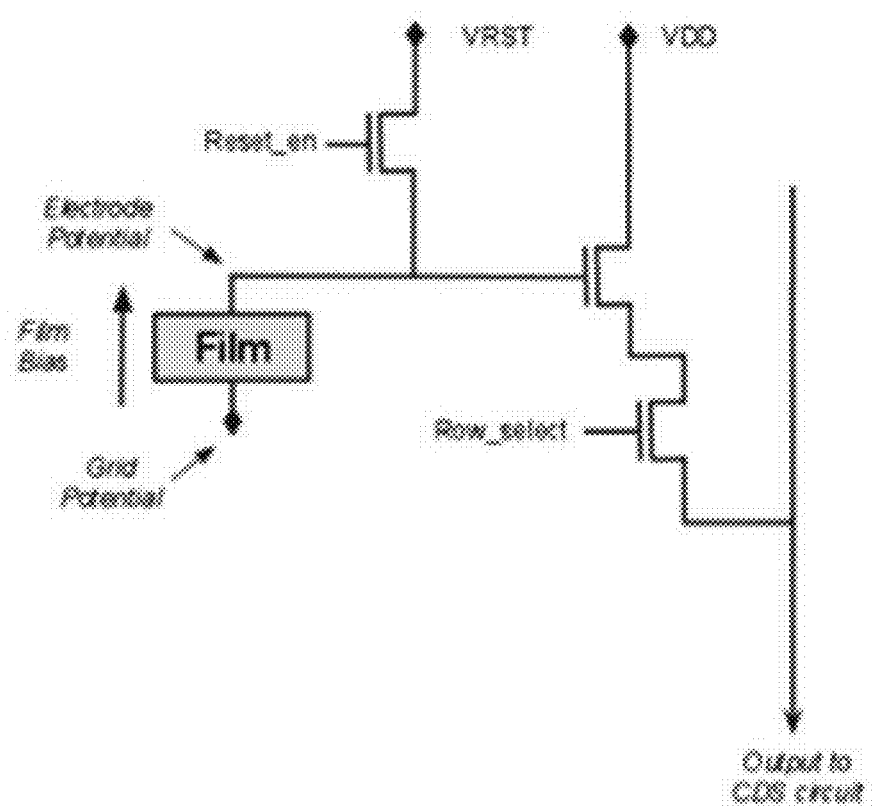
FIG. 16 is a circuit diagram depicting a biasing and readout circuit coupled to a light-sensing film, in an example embodiment.

FIG. 16 shows a circuit diagram depicting a biasing and read-out circuit coupled to a light-sensing film. A first electrode establishes an electrical potential in communication with regions of the light-sensing film where the corresponding potential is labeled Grid Potential in the circuit diagram. A second electrode establishes an electrical potential in communication with other regions of the light-sensing film where the corresponding potential is labeled Electrode Potential in the circuit diagram.

Figure 17:
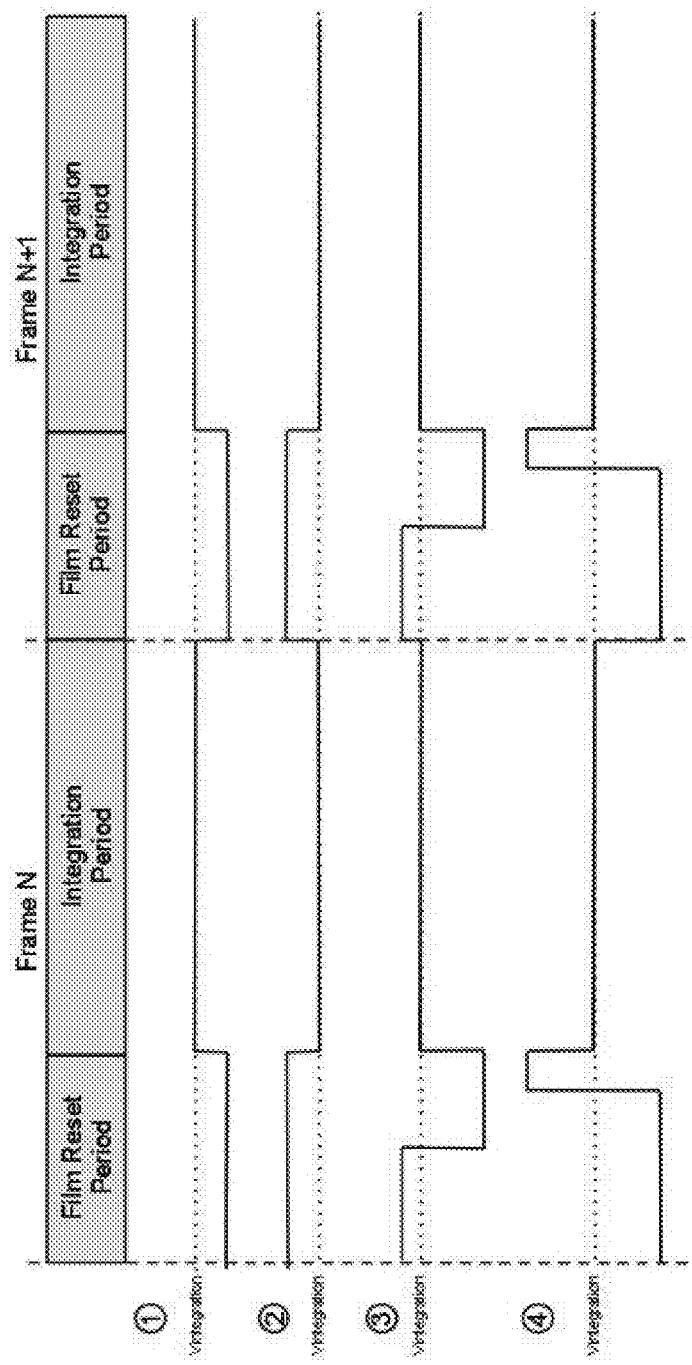
FIG. 17 shows a number of timing diagrams where the vertical axis describes the potential difference between the Grid Potential of FIG. 16 and the Electrode Potential of FIG. 16, in an example embodiment.
Figure 18:
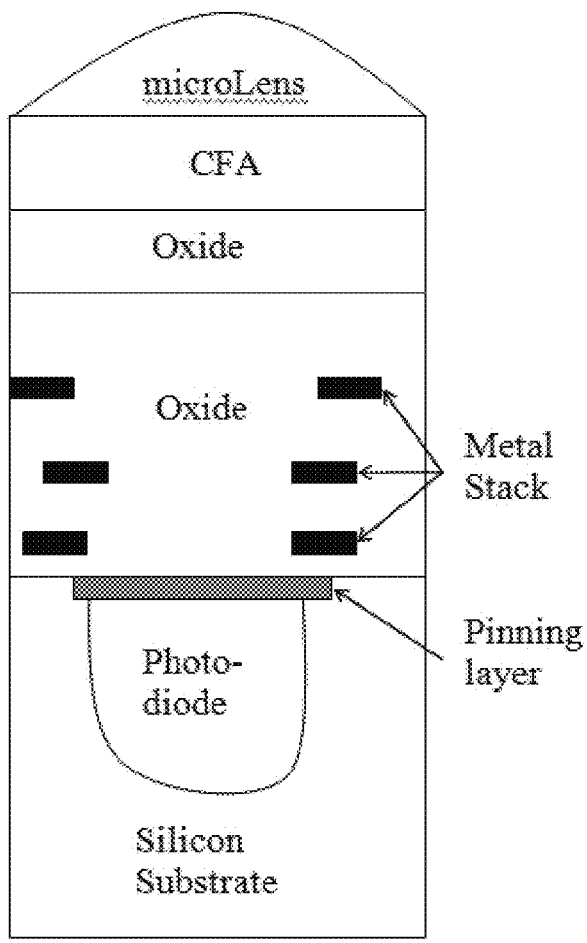
FIG. 18 is a cross-sectional drawing of a front-side illuminated CMOS image sensor pixel, in an example embodiment.
Figure 19:
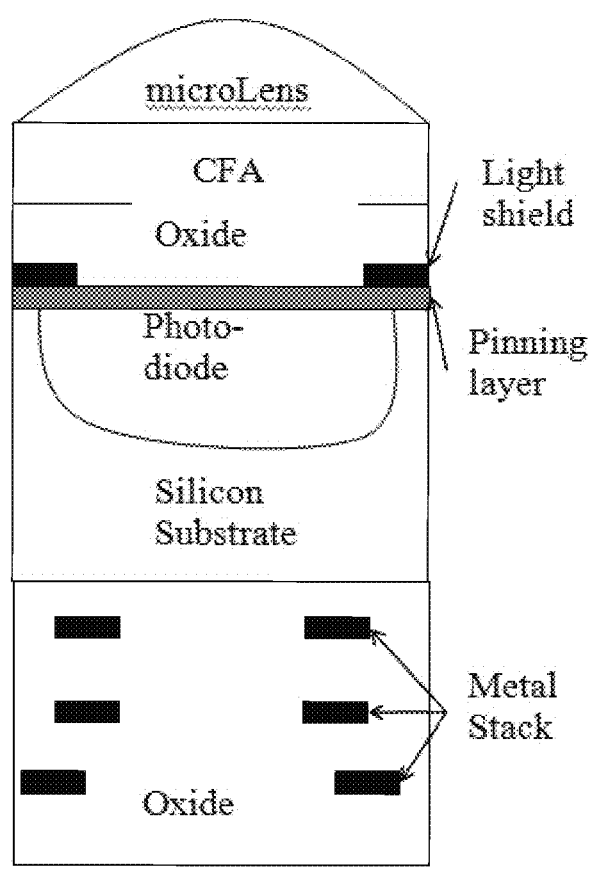
FIG. 19 is a cross-sectional drawing of a back-side illuminated CMOS image sensor pixel, in an example embodiment.
Figure 20:
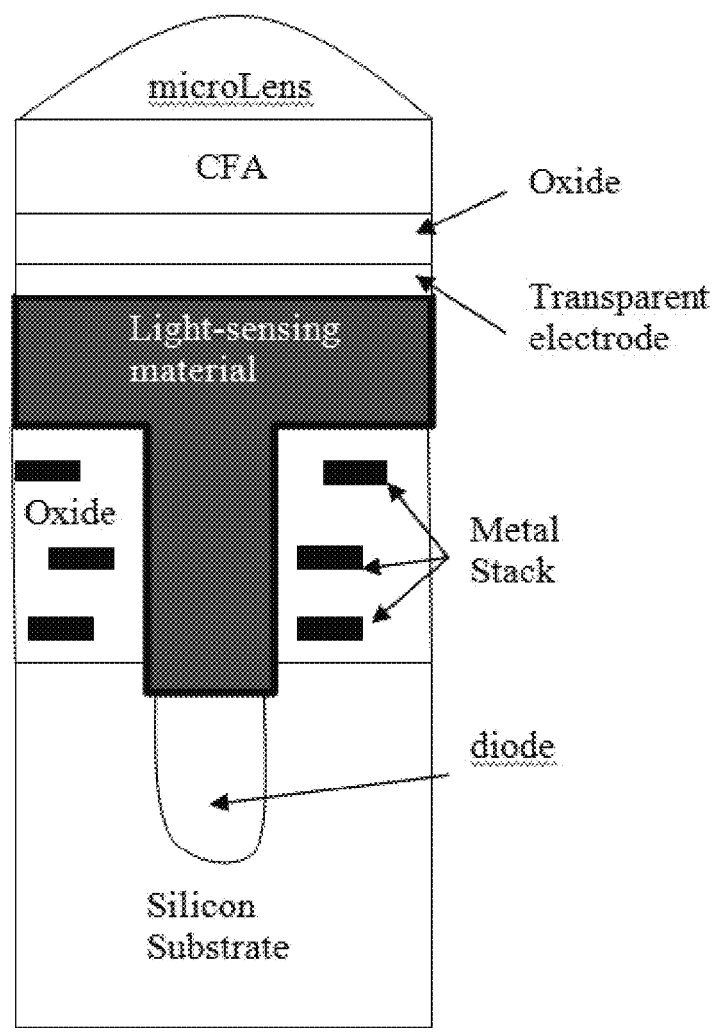
FIG. 20 is a cross-sectional drawing of a front-side illuminated CMOS image sensor pixel in which an additional light-sensing material has been integrated in intimate contact with the silicon photodiode, in an example embodiment.
Figure 21:
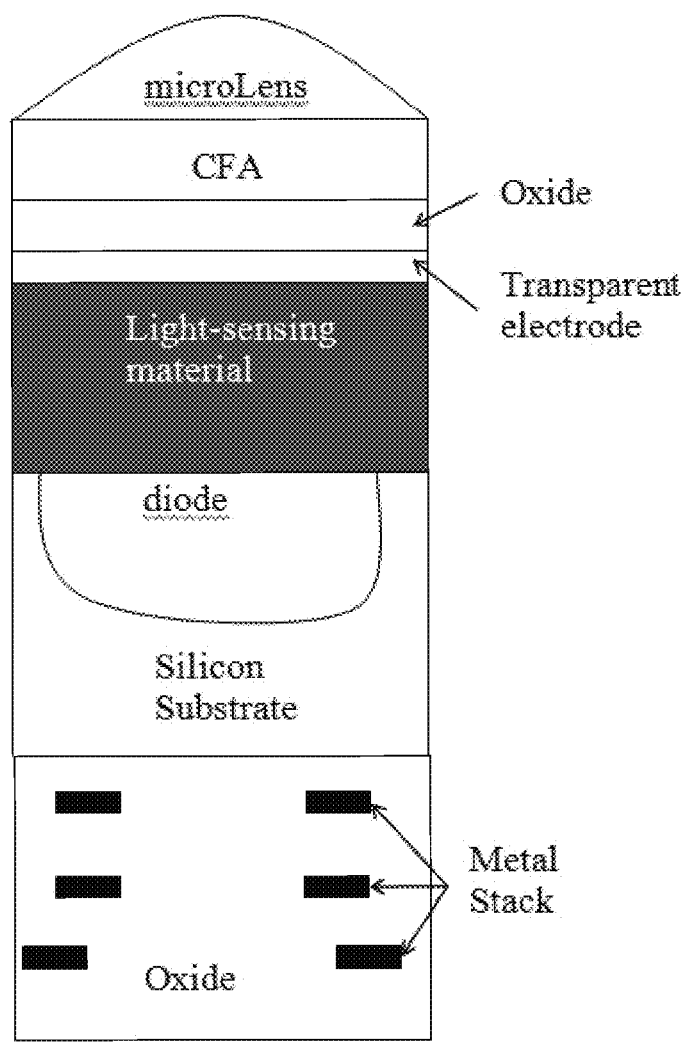
FIG. 21 is a cross-sectional drawing of a back-side illuminated CMOS image sensor pixel in which an additional light-sensing material has been integrated in intimate contact with the silicon photodiode, in an example embodiment.
Figure 22:
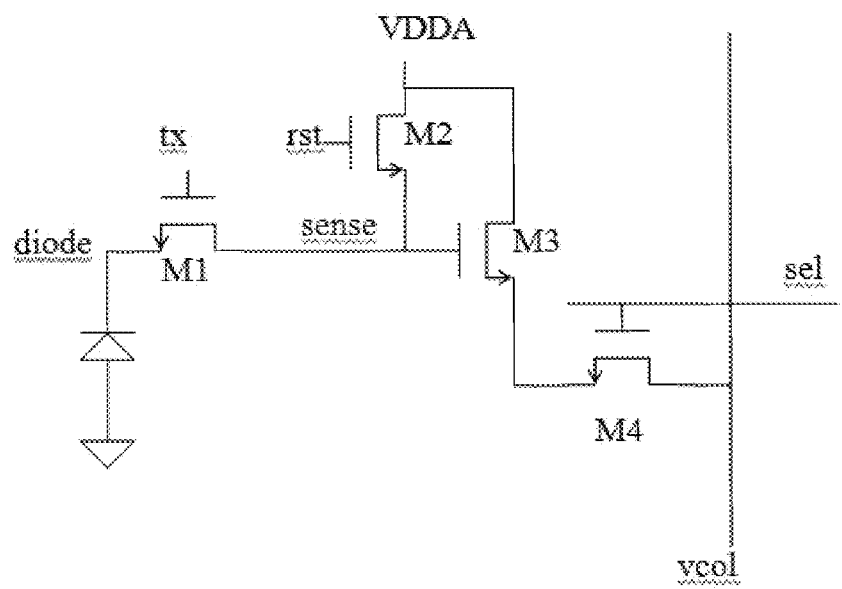
FIG. 22 is a circuit diagram showing a conventional 4T pixel.
Figure 23:
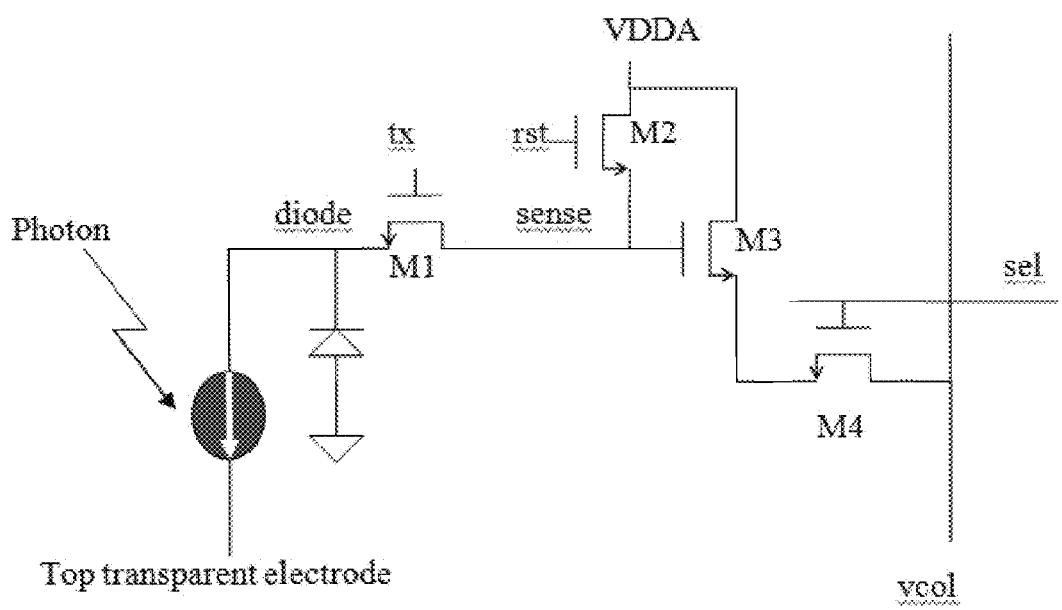
FIG. 23 is a circuit diagram showing a 4T pixel which has been augmented with an additional light-sensing material, in an example embodiment.

FIG. 17 refers to a number of timing diagrams where the vertical axis describes the potential difference between the Grid Potential of FIG. 16, and the Electrode Potential of FIG. 16. The horizontal axis refers to time. In embodiments, the time interval during which charge carriers from the light-sensing medium are integrated—known as the integration period (FIG. 17)—may be preceded by another time interval known as the film reset period (FIG. 17). Biasing during the integration period is generally selected in order to maximize the quantum efficiency associated with photocarrier collection; while at the same time minimizing dark current; and also minimizing any lag present in the film or the overall light-sensing system consisting of film+circuit. Embodiments include biasing levels during the integration period in which a common, or grid, electrode is set to a first potential; and the pixel electrodes associated with the collection of charges from light-sensing film within particular pixel regions are set to a bias values such as +1 V, +2 V, +3 V, +4 V, or +5 V, relative to the first potential. Embodiments include timing schemes where all rows of the imaging array are simultaneously in the film reset period before entering a staggered integration period. Embodiments include timing schemes where all rows of the imaging array are simultaneously in the film reset period before entering a simultaneous integration period. Embodiments include timing schemes where the film reset period is staggered to match a staggered integration period.

In embodiments, biasing during the film reset period may be configured to reside at a different level, or set of levels, compared to biasing during the integration period. Embodiments include biasing during the film reset period such that the common, or grid, electrode resides at a potential approximately equal to the potential to which the pixel electrodes are set. Embodiments include biasing schemes in which electrons that may have been captured to deep traps during bright light illumination are likely to recombine with charge carriers such as holes. Embodiments include biasing schemes which make an abundance of holes available to, and in close proximity with, regions of film and/or near electrical contact—film interfaces, in which electrons captured into deep traps are present, and in which more rapid recombination is therefore desired to return the film to equilibrium. Embodiments include biasing during the film reset period such that the common, or grid, electrode resides at a more positive potential than the pixel electrodes. Embodiments include biasing the pixel electrodes at 0 V, −1 V, −2 V, −3 V, −4 V, or −5 V relative to the grid or common electrode. Embodiments include biasing the pixel electrodes within some rows to different values than the bias of pixel electrodes within other rows in order to effect a time-staggered biasing scheme. Embodiments include reversing the relative polarity, and therefore the location of the more extended depletion region, of the grid and the pixel electrode during the film reset period compared to during the integration period.

Embodiments include imaging systems in which the integration period is equal to, or slightly less than, {one divided by the frame rate}. Examples include a frame rate of (1/15) seconds and an integration period equal to or slightly less than 66.7 ms. Examples include a frame rate of (1/30) seconds and an integration period equal to or slightly less than 33.3 ms. Examples include a frame rate of (1/60) seconds and an integration period equal to or slightly less than 16.7 ms.

Embodiments include imaging system in which the film reset period is comparable to, or longer than, the recombination time for trapped electrons in the presence of holes. Examples of suitable film reset period values include 1 microsecond, 10 microseconds, 100 microseconds, 1 millisecond, and 10 milliseconds.

Embodiments include imaging systems in which the film reset period is brief (e.g., less than one tenth) of the integration period when the imaging system is acquiring images and/or video in low-light or medium-light scenes; and in which the film reset period is comparable to (e.g., of similar duration to, or greater duration than) the integration period when the imaging system is acquiring images and/or video in high-light scenes. In high-light scenes, shorter integration times (e.g., 1/60 seconds, 1/100 seconds, 1/1000 seconds, or shorter) may be employed while still achieving high signal-to-noise ratio images; and in these cases a film reset period of 1 microsecond, 10 microseconds, 100 microseconds, 1 millisecond, or 10 milliseconds may be appreciable, or greater than, the integration period. This combination of integration period and film reset period may achieve simultaneously the combination of high-quality images and/or video, and also little or no observable lag effect following illumination with very bright light.

Embodiments include using information and algorithms related to Auto Gain and Auto Exposure to set the integration period and to set the film reset period. Embodiments include employing longer integration period and shorter film reset period when the light level illuminating the sensor, or illuminating certain pixels associated with the sensor, is determined to be low, such as less than 0.01 lux, or less than 0.1 lux, or less than 1 lux. Embodiments include employing shorter integration period and longer film reset period when the light level illuminating the sensor, or illuminating certain pixels associated with the sensor, is determined to be high, such as greater than 100, or greater than 1000 lux, or greater than 10000 lux.

Embodiments include employing a spectrally-selective filter that substantially removes those wavelengths of light that are particularly prone to producing bright-light lag. Embodiments include employing a filter that substantially selectively removes wavelengths shorter than 320 nm Embodiments include employing a filter that substantially selectively removes wavelengths shorter than 400 nm.

Embodiments include employing a matrix material that passivates colloidal quantum dots wherein the matrix material possess a large, e.g. >4 eV, bandgap, or HOMO-LUMO level difference. Embodiments include employing a matrix material consisting of 1,3-BdT (benzenedithiol) or 1,4-Benzenedithiol or 1,2-Benzenedithiol or combinations thereof. Embodiments include reducing the frequency of ionization of quantum dots in the light-sensing film.

Embodiments include the realization of light sensors coupled to a read-out circuit wherein one electrode contacting the light-sensing film lies in a certain plane, such as the top of a silicon CMOS integrated circuit residing beneath the light-sensing film; and wherein the second electrode resides in a similar plane, also residing beneath the light-sensing film.

Embodiments include the realization of light sensors coupled to a read-out circuit wherein one electrode contacting the light-sensing film lies in a certain plane, such as the top of a silicon CMOS integrated circuit; and wherein the second electrode resides in a substantially different plane, such as an electrical contact that resides on top of the light-sensing film.

The strategies for reducing bright-light lag may be combined. For example, at least one of the following techniques may be employed in combination with at least one other: (1) reducing trap-forming impurity concentrations incorporated into the light-sensing film; (2) passivating trap-forming impurities (3) employing electrical biasing strategies, including time-dependent electrical biasing strategies, to 'erase' or partially erase the memory of the preceding frame(s); (4) employing spectrally-selective filters to substantially remove those wavelengths at which imaging is not required, and (5) employing means to reduce the frequency of ionization of quantum dots making up a light-sensing film.

The invention claimed is:
1. A photodetector comprising:
  a semiconductor substrate;
  a plurality of pixel regions, each of the plurality of pixel regions comprising an optically sensitive layer over the semiconductor substrate; and a pixel circuit for each of the plurality of pixel regions, each pixel circuit comprising a pinned photodiode, a charge store, and a read out circuit for each of the plurality pixel regions, the optically sensitive layer being in electrical communication with a portion of a silicon diode, the optically sensitive layer and the silicon diode thereby forming the pinned photodiode, where, at a wavelength, the optically sensitive layer has an absorption length that is less than that of silicon.

2. A photodetector comprising:
a semiconductor substrate;
a plurality of pixel regions, each of the plurality of pixel regions comprising an optically sensitive layer over the substrate;
a pixel circuit for each of the plurality of pixel regions, each pixel circuit comprising a pinned photodiode, a charge store, and a read out circuit for each pixel region, the optically sensitive layer being in electrical communication with a portion of a silicon diode, the optically sensitive layer and the silicon diode thereby forming the pinned photodiode; where, at a wavelength, the optically sensitive layer has an absorption length that is less than that of silicon, the photodetector, following experiencing annealing at 150° C. or greater for 1 minute or greater, achieves light detection with a signal-to-noise ratio greater than 1 upon illumination by less than or equal to 0.05 lux of visible-wavelength light.

* * * * *